(12) United States Patent
Murakami

(10) Patent No.: US 11,139,837 B2
(45) Date of Patent: *Oct. 5, 2021

(54) TRANSMISSION APPARATUS AND METHOD, AND RECEPTION APPARATUS AND METHOD

(71) Applicant: Panasonic Intellectual Property Corporation of America, Torrance, CA (US)

(72) Inventor: Yutaka Murakami, Kanagawa (JP)

(73) Assignee: Panasonic Intellectual Property Corporation of America, Torrance, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/872,863

(22) Filed: May 12, 2020

(65) Prior Publication Data
US 2020/0274555 A1 Aug. 27, 2020

Related U.S. Application Data

(63) Continuation of application No. 15/928,903, filed on Mar. 22, 2018, now Pat. No. 10,693,502, which is a
(Continued)

(30) Foreign Application Priority Data

Dec. 26, 2008 (JP) .................................. 2008-334028

(51) Int. Cl.
*H03M 13/23* (2006.01)
*H03M 13/35* (2006.01)
(Continued)

(52) U.S. Cl.
CPC ... *H03M 13/2792* (2013.01); *H03M 13/1102* (2013.01); *H03M 13/23* (2013.01);
(Continued)

(58) Field of Classification Search
None
See application file for complete search history.

(56) References Cited

U.S. PATENT DOCUMENTS 4,701,923 A 10/1987 Fukasawa et al.
5,708,682 A 1/1998 Nawata
(Continued)

FOREIGN PATENT DOCUMENTS

JP 8-186570 A 7/1996

OTHER PUBLICATIONS

A. Felstrom, et al., "Time-Varying Periodic Convolutional Codes With Low-Density Parity-Check Matrix," IEEE Transactions on Information Theory, vol. 45, No. 6, Sep. 1999, pp. 2181-2191.
(Continued)

*Primary Examiner* — Phung M Chung
(74) *Attorney, Agent, or Firm* — Seed IP Law Group LLP

(57) ABSTRACT

A transmission apparatus includes a signal processing circuit configured to obtain information data bits to be transmitted; add known information data bits to the information data bits to generate first data blocks; perform error-correction coding on the first data blocks to generate first coded data blocks including parity data blocks such that the first coded data blocks satisfy a first code rate; remove the known information data bits from the first coded data blocks to generate second coded data blocks, the second coded data blocks satisfying a second code rate different from the first code rate; and modulate the second coded data blocks using a modulation scheme to generate a modulated signal, which is then transmitted. A number of the known information data bits depends on a number of the information data bits such that the first code rate is fixed regardless of the number of the information data bits.

6 Claims, 40 Drawing Sheets

Related U.S. Application Data continuation of application No. 14/709,175, filed on May 11, 2015, now abandoned, which is a continuation of application No. 14/242,545, filed on Apr. 1, 2014, now Pat. No. 9,065,611, which is a continuation of application No. 13/142,212, filed as application No. PCT/JP2009/007011 on Dec. 18, 2009, now Pat. No. 8,732,545.

(51) Int. Cl.
  *H03M 13/00* (2006.01)
  *H04L 1/00* (2006.01)
  *H03M 13/27* (2006.01)
  *H03M 13/11* (2006.01)

(52) U.S. Cl.
  CPC ....... *H03M 13/235* (2013.01); *H03M 13/353* (2013.01); *H03M 13/6502* (2013.01); *H03M 13/6516* (2013.01); *H04L 1/0041* (2013.01)

(56) References Cited

U.S. PATENT DOCUMENTS

| | | | |
|---|---|---|---|
| 6,029,264 | A | 2/2000 | Kobayashi et al. |
| 6,061,820 | A | 5/2000 | Nakakita et al. |
| 6,519,732 | B1 | 2/2003 | Li |
| 7,093,179 | B2 | 8/2006 | Shea |
| 7,107,505 | B2 | 9/2006 | Thesling, III |
| 7,436,901 | B2 | 10/2008 | Tynderfeldt et al. |
| 7,600,173 | B2 | 10/2009 | Matsumoto |
| 7,734,988 | B2 | 6/2010 | Kim et al. |
| 7,856,589 | B2 | 12/2010 | Zhidkow |
| 7,890,844 | B2 | 2/2011 | Jeong et al. |
| 7,913,145 | B2 | 3/2011 | Matsumoto |
| 8,397,145 | B2 | 3/2013 | Murakami et al. |
| 8,495,477 | B2 * | 7/2013 | Song ..................... H04L 27/02 714/784 |
| 8,522,109 | B2 | 8/2013 | Murakami et al. |
| 8,850,294 | B1 | 9/2014 | Zhidkov et al. |
| 2005/0088986 | A1 | 4/2005 | Sun et al. |
| 2005/0097428 | A1 | 5/2005 | Chang et al. |
| 2006/0184839 | A1 | 8/2006 | Golitschek Edler Von Elbwart et al. |
| 2007/0192670 | A1 | 8/2007 | Ikeda et al. |
| 2007/0300123 | A1 | 12/2007 | Li |
| 2009/0055708 | A1 | 2/2009 | Chang et al. |
| 2009/0094502 | A1 | 4/2009 | Park et al. |
| 2009/0213728 | A1 | 8/2009 | Chang et al. |
| 2012/0089890 | A1 | 4/2012 | Palanki et al. |
| 2013/0145228 | A1 | 6/2013 | Murakami et al. |
| 2014/0215293 | A1 | 7/2014 | Murakami |
| 2015/0095746 | A1 | 4/2015 | Murakami et al. |
| 2016/0285936 | A1 | 9/2016 | Choi et al. |

OTHER PUBLICATIONS

A. Viterbi, "Error Bounds for Convolutional Codes and an Asymptotically Optimum Decoding Algorithm," IEEE Transactions on Information Theory, vol. IT-13, No. 2, Apr. 1967, pp. 260-269.
A. Pusane, et al., "On Deriving Good LDPC Convolutional Codes from QC LDPC Block Codes," Proceedings of IEEE ISIT 2007, Nice, France, Jun. 24-29, 2007, pp. 1221-1225.
C. Di, et al., "Finite-Length Analysis of Low-Density Parity-Check Codes on the Binary Erasure Channel," IEEE Transactions on Information Theory, vol. 48, No. 6, Jun. 2002, pp. 1570-1579.
D. Daut, et al., "New Short Constraint Length Convolutional Code Constructions for Selected Rational Rates," IEEE Transactions on Information Theory, vol. IT-28, No. 5, Sep. 1982, pp. 794-800.
D. Costello Jr., "Free Distance Bounds for Convolutional Codes," IEEE Transactions on Information Theory, vol. IT-20, No. 3, May 1974, pp. 356-365.
D. MacKay, "Good Error-Correcting Codes Based on Very Sparse Matrices," IEEE Transactions on Information Theory, vol. 45, No. 2, Mar. 1999, pp. 399-431.
F. Kschischang, et al., "Factor Graphs and the Sum-Product Algorithm," IEEE Transactions on Information Theory, vol. 47, No. 2, Feb. 2001, pp. 498-519.
International Search Report dated Mar. 30, 2010.
J. Chen, et al., "Reduced-Complexity Decoding of LDPC Codes," IEEE Transactions on Communications, vol. 53, No. 8, Aug. 2005, pp. 1288-1299.
J. Zhang, et al., "Shuffled Iterative Decoding," IEEE Transactions on Communications, vol. 53, No. 2, Feb. 2005, pp. 209-213.
J. Wozencraft, et al., "Sequential Decoding," The Technology Press of the Massachusetts Institute of Technology and John Wiley & Sons Inc., 1961, Three miscellaneous pages including cover; and pp. 24-57.
J. Fan, "Array Codes as Low-Density Parity-Check Codes," Proceedings of the 2nd International Symposium on Turbo Codes & Related Topics, Brest, France, Sep. 2000, pp. 543-546.
J. Rosenthal, et al., "BCH Convolutional Codes," IEEE Transactions on Information Theory, vol. 45, No. 6, Sep. 1999, pp. 1833-1844.
K. Larsen, "Short Convolutional Codes with Maximal Free Distance for Rates 1/2, 1/3, and 1/4," IEEE Transactions on Information Theory, vol. IT-19, No. 3, May 1973, pp. 371-372.
L. Chen, et al., "Near-Shannon-Limit Quasi-Cyclic Low-Density Parity-Check Codes," IEEE Transactions on Communications, vol. 52, No. 7, Jul. 2004, pp. 1038-1042.
M. Fossorier, et al., "Reduced Complexity Iterative Decoding of Low-Density Parity Check Codes Based on Belief Propagation," IEEE Transactions on Communications, vol. 47, No. 5, May 1999, pp. 673-680.
M. Fossorier, "Quasi-Cyclic Low-Density Parity-Check Codes From Circulant Permutation Matrices," IEEE Transactions on Information Theory, vol. 50, No. 8, Aug. 2004, pp. 1788-1793.
N. Ogasahara, et al., "The Construction of Periodically Time-Variant Convolutional Codes Using Binary Linear Block Codes," IEICE Transaction Fundamentals, vol. J89-A, No. 2, Feb. 2006, pp. 144-153.
P. Lee, "There are Many Good Periodically Time-Varying Convolutional Codes," IEEE Transactions on Information Theory, vol. 35, No. 2, Mar. 1989, pp. 460-463.
R. Gallager, "Low-Density Parity-Check Codes," IRE Transactions on Information Theory, 1962, pp. 21-28.
R. Gallager, "Low-Density Parity-Check Codes," MIT Press, Cambridge, MA, 1963, pp. 1-90.
R. McEliece, et al., "Turbo Decoding as an Instance of Pearl's "Belief Propagation" Algorithm," IEEE Journal on Selected Areas in Communications, vol. 16, No. 2, Feb. 1998, pp. 140-152.
R. Tanner, et al., "LDPC Block and Convolutional Codes Based on Circulant Matrices," IEEE Transactions on Information Theory, vol. 50, No. 12, Dec. 2004, pp. 2966-2984.
Y. Murakami, et al., "Parity Kensa Takoshiki ni Motozuku LDPC Tatamikomi Fugo" ("LDPC Convolutional Codes Based on Parity Check Polynomial,") Proceedings of WPMC2008, IEICE Technical Report RCS2008-13, vol. 108, No. 61, Japan, May 29, 2008, pp. 75-79.
Y. Kou, et al., "Low-Density Parity-Check Codes Based on Finite Geometries: A Rediscovery and New Results," IEEE Transactions on Information Theory, vol. 47, No. 7, Nov. 2001, pp. 2711-2736.
Y. Murakami, et al., "LDPC Convolutional Codes Based on Parity Check Polynomials with a Time Period of 3," IEICE Transaction Fundamentals, vol. E92-A, No. 10, Oct. 2009, pp. 2479-2483.
Z. Chen, et al., "Construction of Low-Density Parity-Check Convolutional Codes through Progressive Edge-Growth," IEEE Communication Letters, vol. 9, No. 12, Dec. 2005, pp. 1058-1060.

* cited by examiner

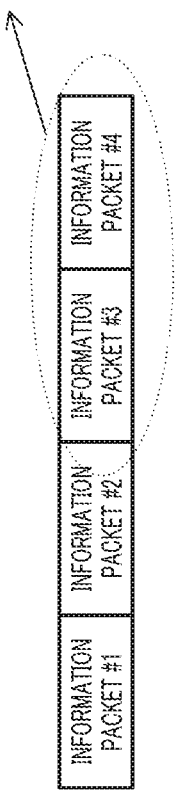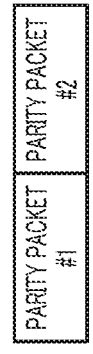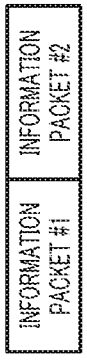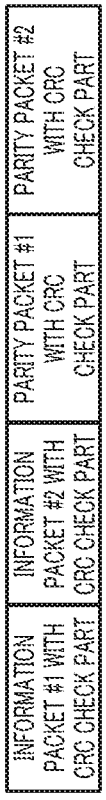
FIG.10

$$H^T_{[0,n]} = \begin{pmatrix} h_1^{(0)}(0) & h_1^{(0)}(1) & \cdots & h_1^{(M)}(M) & 0 & 0 & \cdots & 0 \\ h_2^{(0)}(0) & h_2^{(0)}(1) & \cdots & h_2^{(M)}(M) & 0 & 0 & \cdots & 0 \\ 0 & h_1^{(0)}(1) & \cdots & \cdots & h_1^{(M)}(M+1) & \cdots & & \vdots \\ 0 & h_2^{(0)}(1) & \cdots & \cdots & h_2^{(M)}(M+1) & \cdots & & \vdots \\ \vdots & \vdots & \vdots & \vdots & \ddots & \ddots & h_1^{(M)}(n) & h_1^{(M)}(n) \\ & & & & & & h_2^{(M)}(n) & h_2^{(M)}(n) \\ & & & & & & & h_2^{(0)}(n) \end{pmatrix}$$

GENERATING POLYNOMIAL $\quad G = \left[ 1\ (D^2+1)/(D^2+D+1) \right]$

PARITY CHECK POLYNOMIAL $\quad (D^2+1)X(D) + (D^2+D+1)P(D) = 0$

CHECK MATRIX $\quad H =$

```
1100000000000000000000000000000000...
0111000000000000000000000000000000...
1101110000000000000000000000000000...
0011011100000000000000000000000000...
0000110111000000000000000000000000...
0000001101110000000000000000000000...
0000000011011100000000000000000000...
0000000000110111000000000000000000...
0000000000001101110000000000000000...
0000000000000011011100000000000000...
...
```

TRANSMISSION SEQUENCE $wi=(xi,pi)$

TRANSMISSION VECTOR $w = (x1,p1,x2,p2,x3,p3,x4,p4,x5,p5,\cdots,xi,pi,\cdots)$ $Hw = 0$

$$H = \begin{matrix}
\cdots 0 & H_1 & \cdots \\
\cdots 0000000 & H_2 & 11\cdots 1000000000000000000000000000000000000\cdots \\
\cdots 000000000000 & H_3 & 11\cdots 10000000000000000000000000000000000\cdots \\
\cdots 00000000000000000 & H_4 & 11\cdots 1000000000000000000000000000000000\cdots \\
& \vdots & \\
\cdots 000000000000000000000000000000 & H_m & 11\cdots 100000000000000000000000000000\cdots \\
\cdots 00000000000000000000000000000000000 & H_1 & 11\cdots 10000000000000000000000000\cdots \\
\cdots 0000000000000000000000000000000000000000 & H_2 & 11\cdots 1000000000000000000000\cdots \\
\cdots 000000000000000000000000000000000000000000000 & H_3 & 11\cdots 100000000000000000\cdots \\
\cdots 00000000000000000000000000000000000000000000000000 & H_4 & 11\cdots 100000000\cdots \\
\end{matrix}$$

FIG. 21

[ CHECK EQUATION #1 ]

$$(D^2+D^1+1)X(D)+(D^2+D^1+1)P(D)=0$$

[ CHECK EQUATION #2 ]

$$(D^5+D^1+1)X(D)+(D^5+D^1+1)P(D)=0$$

[ CHECK EQUATION #3 ]

$$(D^4+D^2+1)X(D)+(D^4+D^2+1)P(D)=0$$

$H_1 =$ 11 11 11

$H_2 =$ 11 00 00 00 11 11

$H_3 =$ 11 00 11 00 11

$H =$

... X3k  P3k  X3k+1  P3k+1 X3k+2  P3k+2X3(k+1)  P3(k+1)  X3(k+1)+1  P3(k+1)+1 ...

11 11 11
11 00 00 00 11 11
11 00 11 00 11
          11 11 11
          11 00 00 00 11 11
          11 00 11 00 11

CHECK EQUATION #1
CHECK EQUATION #2
CHECK EQUATION #3
CHECK EQUATION #1
CHECK EQUATION #2
CHECK EQUATION #3
CHECK EQUATION #1
CHECK EQUATION #2
CHECK EQUATION #3

1 PERIOD

X6k, P6k ... X6k+5, P6k+5...X6(2k−1), P6(2k−1)·X6(2k−1)+5, P6(2k−1)+5

1 PERIOD

X6i, P6i ... X6i+5, P6i+5 ... X6(i+k−1), P6(i+k−1)·X6(i+k−1)+5, P6(i+k−1)+5

1 PERIOD

FIG.24

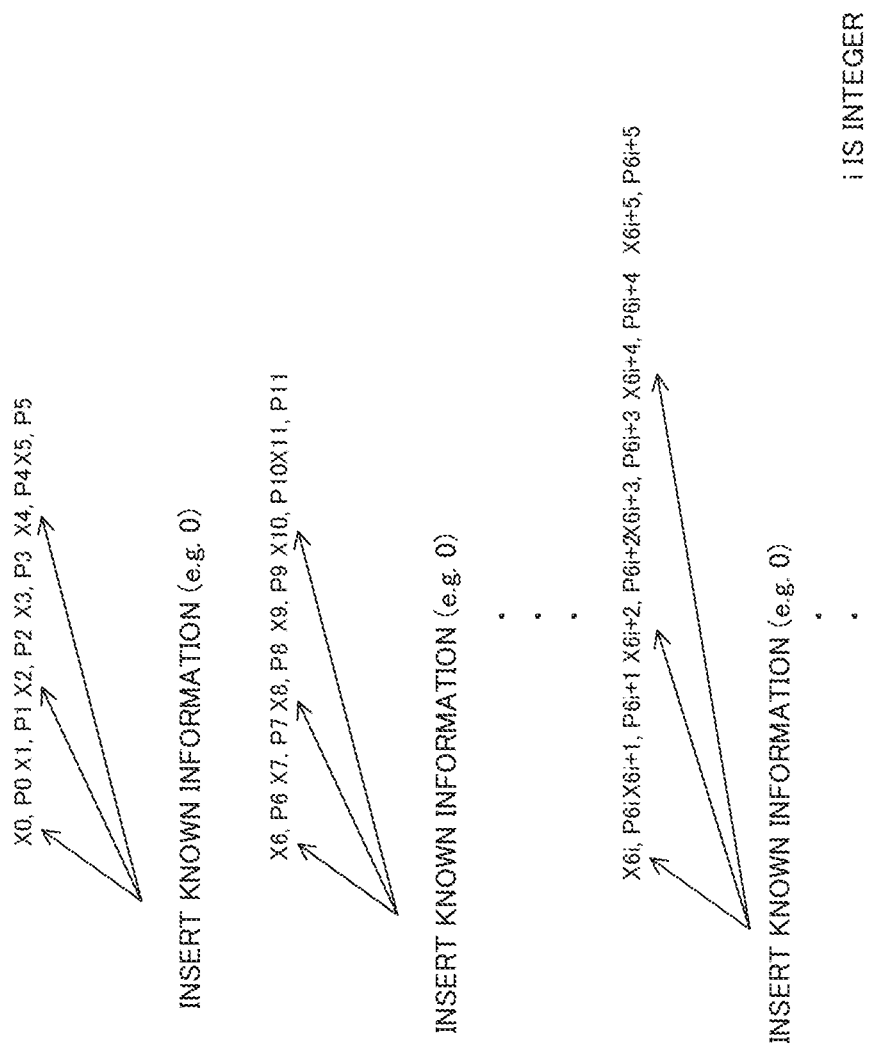

[CHECK EQUATION #1]

$$(D^3+D^1+1)X(D)+(D^2+D^1+1)P(D)=0$$

$$H_1 = 11\ 11\ 11$$

[CHECK EQUATION #2]

$$(D^5+D^1+1)X(D)+(D^5+D^1+1)P(D)=0$$

$$H_2 = 11\ 00\ 00\ 00\ 11\ 11$$

[CHECK EQUATION #3]

$$(D^4+D^2+1)X(D)+(D^4+D^2+1)P(D)=0$$

$$H_3 = 11\ 00\ 11\ 00\ 11$$

POINT IN TIME (j−2)  $X_{j-2}$
POINT IN TIME (j−1)  $X_{j-1}$
POINT IN TIME $X_j$  $X_j$ $$H = \begin{matrix}
\cdots & 11\ 11\ 11 & & & \text{CHECK EQUATION \#1} \\
& 11\ 00\ 00\ 00\ 11\ 11 & & & \text{CHECK EQUATION \#2} \\
& 11\ 00\ 11\ 00\ 11 & & & \text{CHECK EQUATION \#3} \\
& & 11\ 11\ 11 & & \text{CHECK EQUATION \#1} \\
& & 11\ 00\ 00\ 00\ 11\ 11 & & \text{CHECK EQUATION \#2} \\
& & 11\ 00\ 11\ 00\ 11 & & \text{CHECK EQUATION \#3} \\
& & & 11\ 11\ 11 & \text{CHECK EQUATION \#1} \\
& & & 11\ 00\ 00\ 00\ 11\ 11 & \text{CHECK EQUATION \#2} \\
& & & 11\ 00\ 11\ 00\ 11 & \text{CHECK EQUATION \#3}
\end{matrix}$$

FIG.26B $X_{0,0}, X_{1,0}, X_{2,0}, \cdots, X_{n-1,0}, P_0 \quad X_{0,1}, X_{1,1}, X_{2,1}, \cdots, X_{n-1,1}, P_1 \cdots X_{0,3(k-1)+2}, X_{1,3(k-1)+2}, X_{2,3(k-1)+2}, \cdots, X_{n-1,3(k-1)+2}, P_{3(k-1)+2}$

1 PERIOD $X_{0,3k}, X_{1,3k}, X_{2,3k}, \cdots, X_{n-1,3k}, P_{3k} \quad \cdots \quad X_{0,3(2k-1)+2}, X_{1,3(2k-1)+2}, X_{2,3(2k-1)+2}, \cdots, X_{n-1,3(2k-1)+2}, P_{3(2k-1)+2}$

1 PERIOD $X_{0,3i}, X_{1,3i}, X_{2,3i}, \cdots, X_{n-1,3i}, P_{3i} \quad \cdots \quad X_{0,3(i+k-1)+2}, X_{1,3(i+k-1)+2}, X_{2,3(i+k-1)+2}, \cdots, X_{n-1,3(i+k-1)+2}, P_{3(i+k-1)+2}$

1 PERIOD

1 PERIOD   SELECT $N_0$ TERMS

X0,3k, X1,3k, X2,3k, ..., Xn-1,3k, P3k ... X0,3(2k-1)+2, X1,3(2k-1)+2, X2,3(2k-1)+2, ..., Xn-1,3(2k-1)+2, P3(2k-1)+2

1 PERIOD   SELECT $N_1$ TERMS

X0,3i, X1,3i, X2,3i, ..., Xn-1,3i, P3i ... X0,3(i+k-1)+2, X1,3(i+k-1)+2, X2,3(i+k-1)+2, ..., Xn-1,3(i+k-1)+2, P3(i+k-1)+2

1 PERIOD   SELECT $N_i$ TERMS (i IS INTEGER)

FIG.28

$3kn$ TERMS: $X1,0, X2,0 \cdots Xn-1,0, P0 \quad \cdots \quad X1,3(k-1)+2, X2,3(k-1)+2 \cdots Xn-1,3(k-1)+2, P3(k-1)+2$ — SELECT $N_0$ TERMS $3kn$ TERMS: $X1,3k, X2,3k \cdots Xn-1,3k, P3k \cdots X1,3(2k-1)+2, X2,3(2k-1)+2 \cdots Xn-1,3(2k-1)+2, P3(2k-1)+2$ — SELECT $N_1$ TERMS $3kn$ TERMS: $X1,3j, X2,3j \cdots Xn-1,3j, P3j \cdots X1,3(j+k-1)+2, X2,3(j+k-1)+2 \cdots Xn-1,3(j+k-1)+2, P3(j+k-1)+2$ — SELECT $N_j$ TERMS ($j$ IS INTEGER)

FIG.32

TRANSMISSION APPARATUS AND METHOD, AND RECEPTION APPARATUS AND METHOD

BACKGROUND

Technical Field

The present disclosure relates to an encoding method, an encoder and a decoder that perform erasure correction encoding using, for example, low density parity check codes (LDPC Codes).

Description of the Related Art

For application such as moving image streaming, when more than a tolerable number of packets are lost at an application level, error correction codes are used to secure quality. For example, Patent Literature 1 discloses a method of creating redundant packets for a plurality of information packets using a Reed-Solomon code and transmitting the information packets with the redundant packets attached thereto. By so doing, even when packets are lost, the erased packets can be decoded as long as the loss is within the range of error correction capability of the Reed-Solomon code.

However, when a number of packets beyond the correction capability of the Reed-Solomon code are lost, or packets are continuously lost due to fading or the like in a wireless communication channel over a relatively long period of time and burst erasure occurs, erasure correction may not be effectively performed. When the Reed-Solomon code is used, although the correction capability can be improved by increasing the block length of the Reed-Solomon code, there is a problem that the amount of computation of coding/decoding processing and the circuit scale will increase.

To solve such a problem, low-density parity check (LDPC) codes are becoming a focus of attention as an error correction code for packet erasure. LDPC codes are codes defined in a very sparse check matrix and can perform coding/decoding processing with a practical time/operation cost even when the code length is on the order of several thousands to several tens of thousands.

FIG. 1 illustrates a conceptual diagram of a communication system using erasure correction encoding by an LDPC code (see Non-Patent Literature 1). In FIG. 1, a communication apparatus on an encoding side performs LDPC encoding on information packets 1 to 4 to transmit and generates parity packets a and b. A upper layer processing section outputs an encoded packet with a parity packet added to an information packet to a lower layer (physical layer (PHY) in the example in FIG. 1) and a physical layer processing section in the lower layer converts the encoded packet into a format in which the packet is transmittable through a communication channel and outputs the packet to the communication channel. FIG. 1 shows an example where the communication channel is a wireless communication channel.

A communication apparatus on a decoding side performs reception processing by a physical layer processing section of a lower layer. At this time, suppose a bit error has occurred in the lower layer. Due to this bit error, a packet including the corresponding bit cannot be correctly decoded in the upper layer and packet erasure may result. The example in FIG. 1 shows a case where information packet 3 is lost. The upper layer processing section applies LDPC decoding processing to a received packet sequence and thereby decodes lost information packet 3. For LDPC decoding, sum-product decoding that performs decoding using belief propagation (BP) or a Gaussian elimination method or the like is used.

FIG. 2 is an overall configuration diagram of the above-described communication system. In FIG. 2, the communication system includes communication apparatus 10 on the encoding side, communication channel 20 and communication apparatus 30 on the decoding side. Communication apparatus 10 on the encoding side includes packet generation section 11, erasure correction encoding-related processing section 12, error correcting encoding section 13 and transmitting apparatus 14, and communication apparatus 30 on the decoding side includes receiving apparatus 31, error correcting decoding section 32, erasure correction decoding related processing section 33 and packet decoding section 34. Communication channel 20 represents a channel through which a signal transmitted from transmitting apparatus 14 of communication apparatus 10 on the encoding side passes until the signal is received by receiving apparatus 31 of communication apparatus 30 on the decoding side. For communication channel 20, Ethernet (registered trademark), power line, metal cable, optical fiber, radio, light (visible light, infrared or the like) or a combination thereof can be used. Furthermore, error correcting encoding section 13 introduces error correction codes in the physical layer besides erasure correction codes to correct errors produced in communication channel 20. Therefore, error correcting decoding section 32 decodes error correction codes in the physical layer.

The erasure correction encoding method in erasure correction encoding-related processing section 12 will be described using FIG. 3.

Packet generation section 11 receives information 41 as input, generates information packet 43 and output information packet 43 to rearranging section 15. Hereinafter, a case where information packet 43 is made up of information packets #1 to #n will be described as an example.

Rearranging section 15 receives information packet 43 (here, information packets #1 to #n) as input, reorders the information and outputs reordered information 45.

Erasure correction encoder (parity packet generation section) 16 receives reordered information 45 as input, performs encoding of, for example, an LDPC-BC (low-density parity-check block code, e.g., see Non-Patent Literature 2) or LDPC-CC (low-density parity-check convolutional code, e.g., see Non-Patent Literature 3) on information 45 and generates a parity part. Erasure correction encoder (parity packet generation section) 16 extracts only the parity part generated, generates parity packet 47 from the extracted parity part and outputs the parity packet 47. In this case, when parity packets #1 to #m are generated for information packets #1 to #n, parity packet 47 becomes parity packets #1 to #m.

Error detection code adding section 17 receives information packet 43 (information packets #1 to #n), and parity packet 47 (parity packets #1 to #m) as input, adds an error detection code, for example, a CRC (Cyclic Redundancy Check) check part to information packet 43 (information packets #1 to #n) and parity packet 47 (parity packets #1 to #m) and outputs information packet and parity packet 49 with a CRC check part. Therefore, information packet and parity packet 49 with a CRC check part are made up of information packets #1 to #n and parity packets #1 to #m with a CRC check part.

The erasure correction decoding method by erasure correction decoding related processing section 33 will be described using FIG. 4.

Error detection section 35 receives packet 51 after decoding the error correction code in the physical layer as input and performs error detection using, for example, CRC check. In this case, packet 51 after the error correction code decoding in the physical layer is made up of decoded information packets #1 to #n and decoded parity packets #1 to #m. When erased packets are detected in the decoded information packets and decoded parity packets as a result of the error detection as shown, for example, in FIG. 4, error detection section 35 assigns packet numbers to the information packets and parity packets in which packet erasure has not occurred and outputs those packets as packet 53.

Erasure correction decoder 36 receives packet 53 (information packets (with packet number) and parity packets (with packet number)) in which packet erasure has not occurred) as input, performs erasure correction code decoding and decodes information packet 55 (information packets #1 to #n).

CITATION LIST

Patent Literature

PTL 1
Japanese Patent Application Laid-Open No. 8-186570

Non-Patent Literature

NPL 1
Changyan Di, David Proietti, I. Emre Telatar, Thomas J. Richardson, and Rudiger L. Urbanke, "Finite-Length Analysis of Low-Density Parity-Check Codes on the Binary Erasure Channel," IEEE Transaction on Information Theory, vol. 48, No. 6, June 2002.

NPL 2
D. J. C. Mackay, "Good error-correcting codes based on very sparse matrices," IEEE Trans. Inform. Theory, vol. 45, no. 2, pp. 399-431, March 1999.

NPL 3
A. J. Felstorom, and K. Sh. Zigangirov, "Time-Varying Periodic Convolutional Codes With Low-Density Parity-Check Matrix," IEEE Transactions on Information Theory, Vol. 45, No. 6, pp. 2181-2191, September 1999.

NPL 4
R. G. Gallager, "Low-density parity check codes," IRE Trans. Inform. Theory, IT-8, pp-21-28, 1962.

NPL 5
D. J. C. Mackay, "Good error-correcting codes based on very sparse matrices," IEEE Trans. Inform. Theory, vol. 45, no. 2, pp. 399-431, March 1999.

NPL 6
R. D. Gallager, "*Low-Density Parity-Check Codes*," Cambridge, Mass.: MIT Press, 1963.

NPL 7
M. P. C. Fossorier, M. Mihaljevic, and H. Imai, "Reduced complexity iterative decoding of low density parity check codes based on belief propagation," IEEE Trans. Commun., vol. 47., no. 5, pp. 673-680, May 1999.

NPL 8
J. Chen, A. Dholakia, E. Eleftheriou, M. P. C. Fossorier, and X.-Yu Hu, "Reduced-complexity decoding of LDPC codes," IEEE Trans. Commun., vol. 53, no. 8, pp. 1288-1299, August 2005.

NPL 9
J. Zhang, and M. P. C. Fossorier, "Shuffled iterative decoding," IEEE Trans. Commun., vol. 53, no. 2, pp. 209-213, February 2005.

NPL 10
J. M. Wozencraft, and B. Reiffen, "Sequential decoding," MIT Press, Cambridge, 1961.

NPL 11
A. J. Viterbi, "Error bounds for convolutional codes and an asymptotically optimum decoding algorithm," IEEE Trans. Inform. Theory, IT-13, pp. 260-269, April 1967.

NPL 12
K. J. Larsen, "Short convolutional codes with maximal free distance for rates 1/2, 1/3, and 1/4," IEEE Trans. Inform. Theory, IT-19, no. 3, pp. 371-372, May 1973.

NPL 13
D. G. Daut, J. W. Modestino, and L. D. Wismer, "New short constraint length convolutional code construction for selected rational rates," IEEE Trans. Inform. Theory, IT-28, no. 5, pp. 794-800, September 1982.

NPL 14
D. J. Costello Jr., "Free distance bounds for convolutional codes," IEEE Trans. Inform. Theory, vol. IT-20, no. 3, pp. 356-365, May 1974.

NPL 15
P. J. Lee, "There are many good periodically time-varying convolutional codes," IEEE Trans. Inform. Theory, vol. 35, no. 2, pp. 460-463, March 1989.

NPL 16
F. R. Kschischang, B. J. Frey, and H. Loeliger, "Factor graphs and the sum-product algorithm," IEEE Trans. Inform. Theory, vol. 47, no. 2, pp. 399-431, February 1999.

NPL 17
R. J. McEliece, D. J. C. MacKay, and J.-F. Cheng, "Turbo decoding as an instance of Perl's "belief propagation" algorithm," IEEE J. Select. Areas Commun., vol. 16, no. 2, pp. 140-152, February 1998.

NPL 18
J. L. Fan, "Array codes as low-density parity-check codes," Proc. of 2nd Int. Symp. on Turbo Codes, pp. 543-546, September 2000.

NPL 19
Y Kou, S. Lin, and M. P. C. Fossorier, "Low-density parity-check codes based on finite geometries: A rediscovery and new results," IEEE Trans. Inform. Theory, vol. 47, no. 7, pp. 2711-2736, November 2001.

NPL 20
Y Kou, S. Lin, and M. P. C. Fossorier, "Low-density parity-check codes based on finite geometries: A rediscovery and new results," IEEE Trans. Inform. Theory, vol. 47, no. 7, pp. 2711-2736, November 2001.

NPL 21
M. P. C. Fossorier, "Quasi-cyclic low-density parity-check codes from circulant permutation matrices," IEEE Trans. Inform. Theory, vol. 50, no. 8, pp. 1788-1793, November 2001.

NPL 22
L. Chen, J. Xu, I. Djurdjevic, and S. Lin, "Near-Shannon limit quasi-cyclic low-density parity-check codes," IEEE Trans. Commun., vol. 52, no. 7, pp. 1038-1042, July 2004.

NPL 23
R. M. Tanner, D. Sridhara, A. Sridharan, T. E. Fuja, and D. J. Costello Jr., "LDPC block and convolutional codes based on circulant matrices," IEEE Trans. Inform. Theory, vol. 50, no. 12, pp. 2966-2984, December 2004.

NPL 24

A. Pusane, R. Smarandache, P. Vontobel, and D. J. Costello Jr., "On deriving good LDPC convolutional codes from QC LDPC block codes," Proc. of IEEE ISIT 2007, pp. 1221-1225, June 2007.

NPL 25

J. Rosenthal, and E. V. York, "BCH convolutional codes," IEEE Trans. Inform. Theory, vol. 45, no. 6, pp. 1833-1844, September 1999.

NPL 26

N. Ogasawara, M. Kobayashi, and S. Hirasawa, "The construction of periodically time-varying convolutional codes using binary linear block codes," IEICE Trans. Fundamentals, vol. J89-A, no. 2, pp. 144-153, February 2006 (in Japanese).

NPL 27

Y Murakami, S. Okasaka, S. Okamura, T. Kishigami, and M. Orihashi, "LDPC convolutional codes based on parity check polynomial," Proc. of WPMC2008, September 2008.

NPL 28

Y Murakami, S. Okamura, S. Okasaka, T. Kishigami, and M. Orihashi, "LDPC convolutional codes based on parity check polynomials with a time period of 3," IEICE Trans. Fundamentals, vol. E92-A, no. 10, pp. 2479-2483, September 2009.

BRIEF SUMMARY

Technical Problem

When thinking of improvement of transmission efficiency and improvement of erasure correction capability, it is desirable to enable a coding rate in an erasure correction code to be changed by means of communication quality such as a transmission path situation. FIG. 5 shows a configuration example of an erasure correction encoder capable of changing a coding rate of an erasure correction code according to communication quality such as a transmission path situation.

First erasure correction encoder 61 is an encoder of an erasure correction code of a coding rate of 1/2, second erasure correction encoder 62 is an encoder of an erasure correction code of a coding rate of 2/3 and third erasure correction encoder 63 is an encoder of an erasure correction code of a coding rate of 3/4.

First erasure correction encoder 61 receives information 71 and control signal 72 as input, performs encoding when control signal 72 specifies a coding rate of 1/2 and outputs data 73 after erasure correction encoding to selection section 64. Similarly, second erasure correction encoder 62 receives information 71 and control signal 72 as input, performs encoding when control signal 72 specifies a coding rate of 2/3 and outputs data 74 after erasure correction encoding to selection section 64. Similarly, third erasure correction encoder 63 receives information 71 and control signal 72 as input, performs encoding when control signal 72 specifies a coding rate of 3/4 and outputs data 75 after erasure correction encoding to selection section 64.

Selection section 64 receives data 73, 74 and 75 after erasure correction encoding and control signal 72 as input, and outputs data 76 after erasure correction encoding corresponding to the coding rate specified by control signal 72.

In this case, the erasure correction encoders in FIG. 5 need to prepare an erasure correction encoder which differs from one coding rate to another to change the coding rate of an erasure correction code and have a problem that the circuit scales of the erasure correction encoders and erasure correction decoders increase. However, there are not sufficient studies on erasure correction encoding and erasure decoding methods capable of reducing the circuit scales of erasure correction encoders and erasure correction decoders.

It is therefore an object of the present disclosure to provide an encoding method, an encoder and a decoder capable of changing a coding rate of an erasure correction code while reducing the circuit scales of the encoder and decoder.

Solution to Problem

The encoding method of the present disclosure is an encoding method of generating a low-density parity check convolutional code (LDPC-CC) of a coding rate of 1/3 and a time varying period of 3 from a low-density parity check convolutional code of a coding rate of 1/2 and a time varying period of 3, where this low-density parity check convolutional code of a coding rate of 1/2 and a time varying period of 3 is defined based on:

a first parity check polynomial in which (a1%3, a2%3, a3%3) and (b1%3, b2%3, b3%3) are any of (0, 1, 2), (0, 2, 1), (1, 0, 2), (1, 2, 0), (2, 0, 1) and (2, 1, 0) of a parity check polynomial represented by equation 3-1, a second parity check polynomial in which (A1%3, A2%3, A3%3) and (B1%3, B2%3, B3%3) are any of (0, 1, 2), (0, 2, 1), (1, 0, 2), (1, 2, 0) and (2, 0, 1), (2, 1, 0) of a parity check polynomial represented by equation 3-2, and a third parity check polynomial in which ($\alpha$1%3, $\alpha$2%3, $\alpha$3%3) and ($\beta$1%3, $\beta$2%3, $\beta$3%3) are any of (0, 1, 2), (0, 2, 1), (1, 0, 2), (1, 2, 0), (2, 0, 1) and (2, 1, 0) of a parity check polynomial represented by equation 3-3, the method including the steps of:

inserting, when inserting known information into information Xj of 3k bits (where j takes a value of any of 6i to 6 (i+k−1)+5, and there are 3k different values) of 6 k bits of information $X_{6i}$, $X_{6i+1}$, $X_{6i+2}$, $X_{6i+3}$, $X_{6i+4}$, $X_{6i+5}$, . . . , $X_{6(i+k-1)}$, $X_{6(i+k-1)+1}$, $X_{6(i+k-1)+2}$, $X_{6(i+k-1)+3}$, $X_{6(i+k-1)+4}$, $X_{6(i+k-1)+5}$ which is only information arranged in output order of encoded outputs from one period of 12k (k is a natural number) bits composed of information and parity part which are the encoded outputs using the low-density parity check convolutional code of a coding rate of 1/2, the known information into the information Xj such that, of remainders after dividing 3k different j's by 3, the number of remainders which become 0 is k, the number of remainders which become 1 is k and the number of remainders which become 2 is k; and obtaining the parity part from the information including the known information.

Advantageous Effects of Disclosure

According to the present disclosure, it is possible to change a coding rate of an erasure correction code while reducing the circuit scales of an encoder and decoder, and thereby realize both improvement of transmission efficiency and improvement of erasure correction capability.

BRIEF DESCRIPTION OF THE DRAWINGS

FIG. 10 is a packet configuration diagram illustrating operations of a portion associated with a change of the coding rate of the erasure correction code;

FIG. 14 is a diagram illustrating parity check matrix $H^T[0,n]$ of an LDPC-CC of a coding rate of R=1/2;

FIG. 16 is a diagram illustrating an example of a configuration of a parity check matrix of an LDPC-CC of a time varying period of 4;

FIG. 18 is a diagram illustrating a parity check matrix of a (7, 5) convolutional code;

FIG. 19 is a diagram illustrating an example of the configuration of parity check matrix H of an LDPC-CC of a coding rate of 2/3 and a time varying period of 2;

FIG. 20 is a diagram illustrating an example of the configuration of a parity check matrix of an LDPC-CC of a coding rate of 2/3 and a time varying period of m;

FIG. 21 is a diagram illustrating an example of the configuration of a parity check matrix of an LDPC-CC of a coding rate of (n−1)/n and a time varying period of m;

FIG. 23 is a diagram illustrating an example of check equations of an LDPC-CC of a coding rate of 1/2 and parity check matrix H;

FIG. 24 is a diagram illustrating a shortening method [method #1-2];

FIG. 25 is a diagram illustrating an insertion rule in shortening method [method #1-2];

FIG. 26B is a diagram illustrating the correspondence between a parity check polynomial 27-1 and points in time;

FIG. 27 is a diagram illustrating shortening method [method #2-2];

FIG. 28 is a diagram illustrating shortening method [method #2-4];

FIG. 32 is a diagram illustrating erasure correction method [method #3-3];

DETAILED DESCRIPTION

Now, embodiments of the present disclosure will be described in detail with reference to the accompanying drawings.

Embodiment 1

Figure 1:
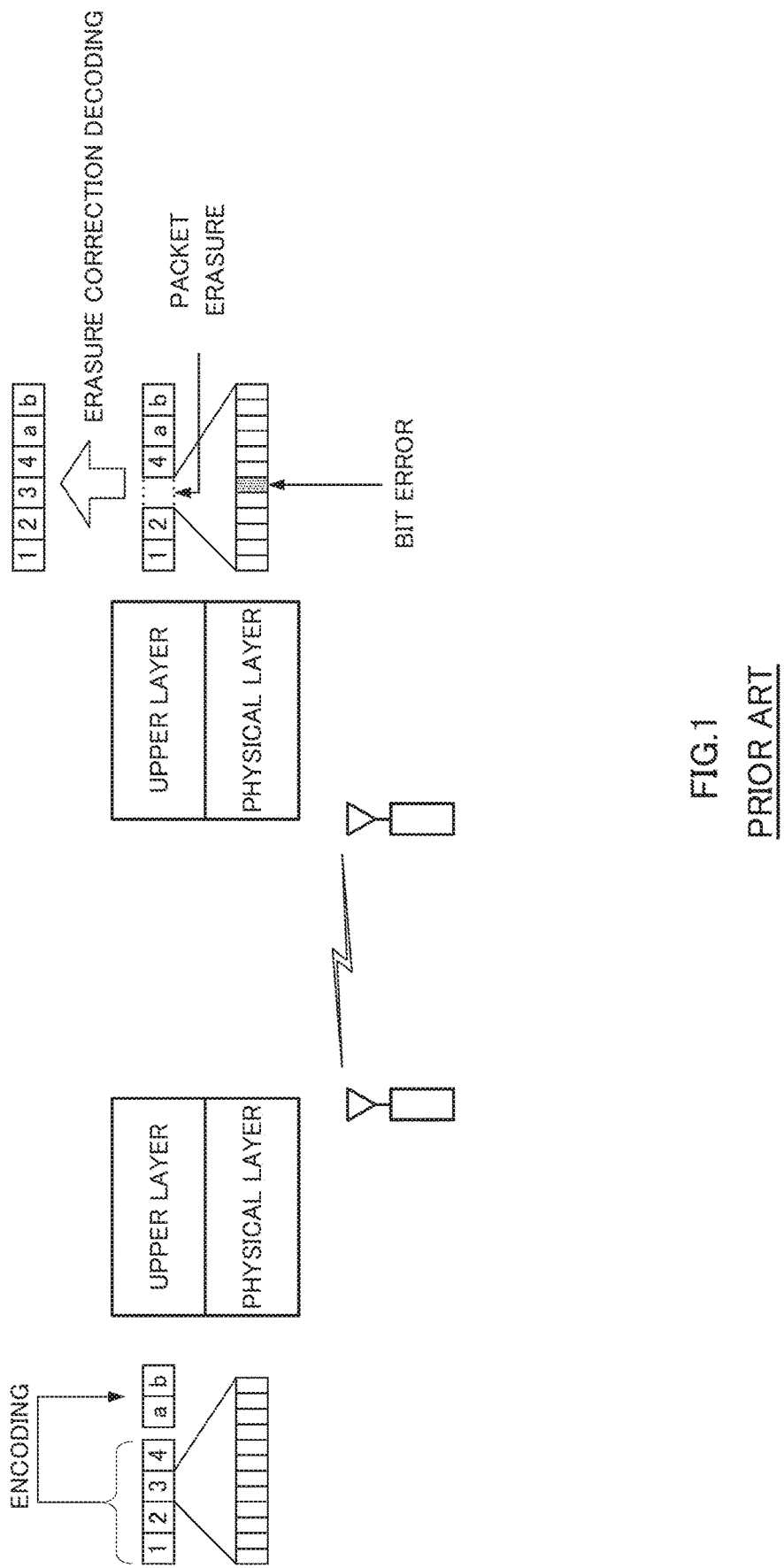
FIG. 1 is a diagram illustrating a conceptual diagram of a communication system using erasure correction encoding.
Figure 2:
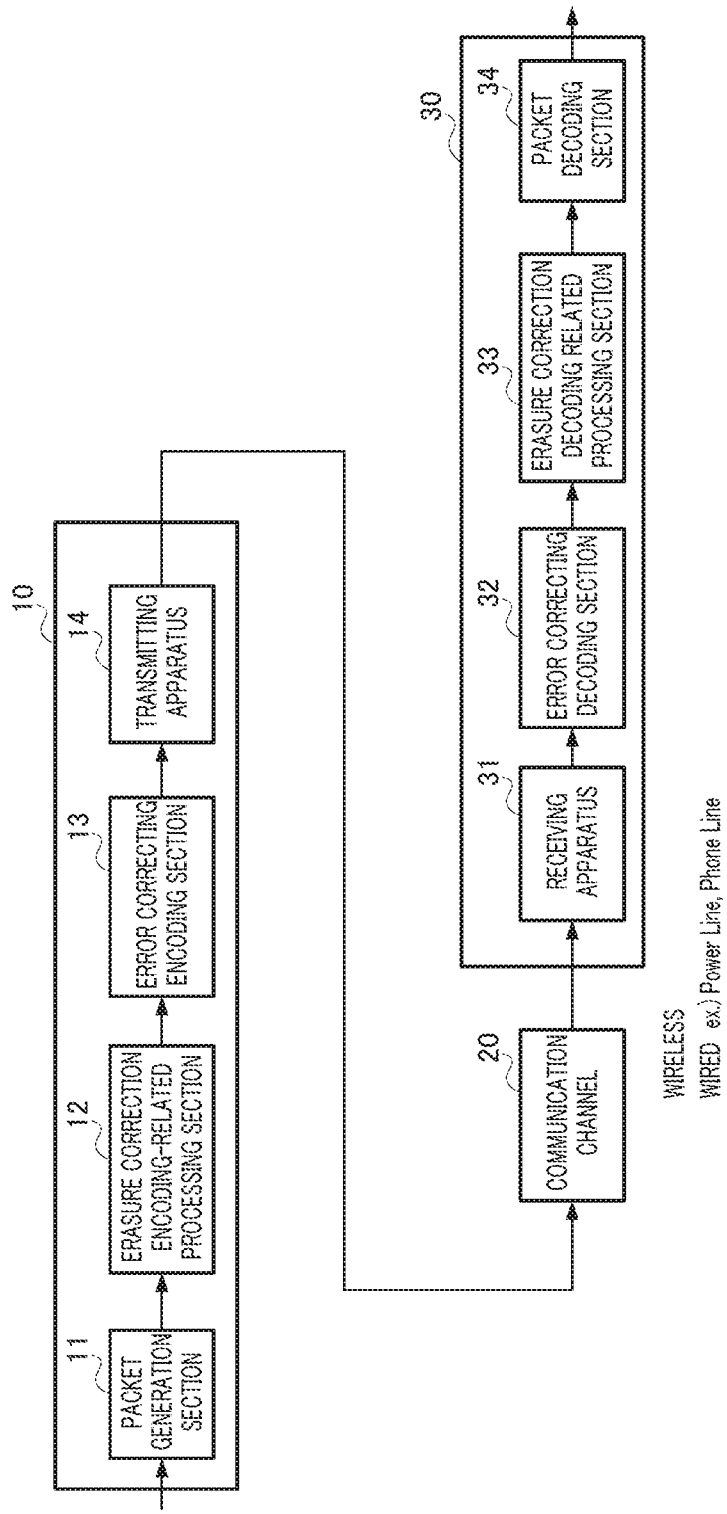
FIG. 2 is a diagram illustrating an overall configuration of a communication system that performs erasure correction.
Figure 3:
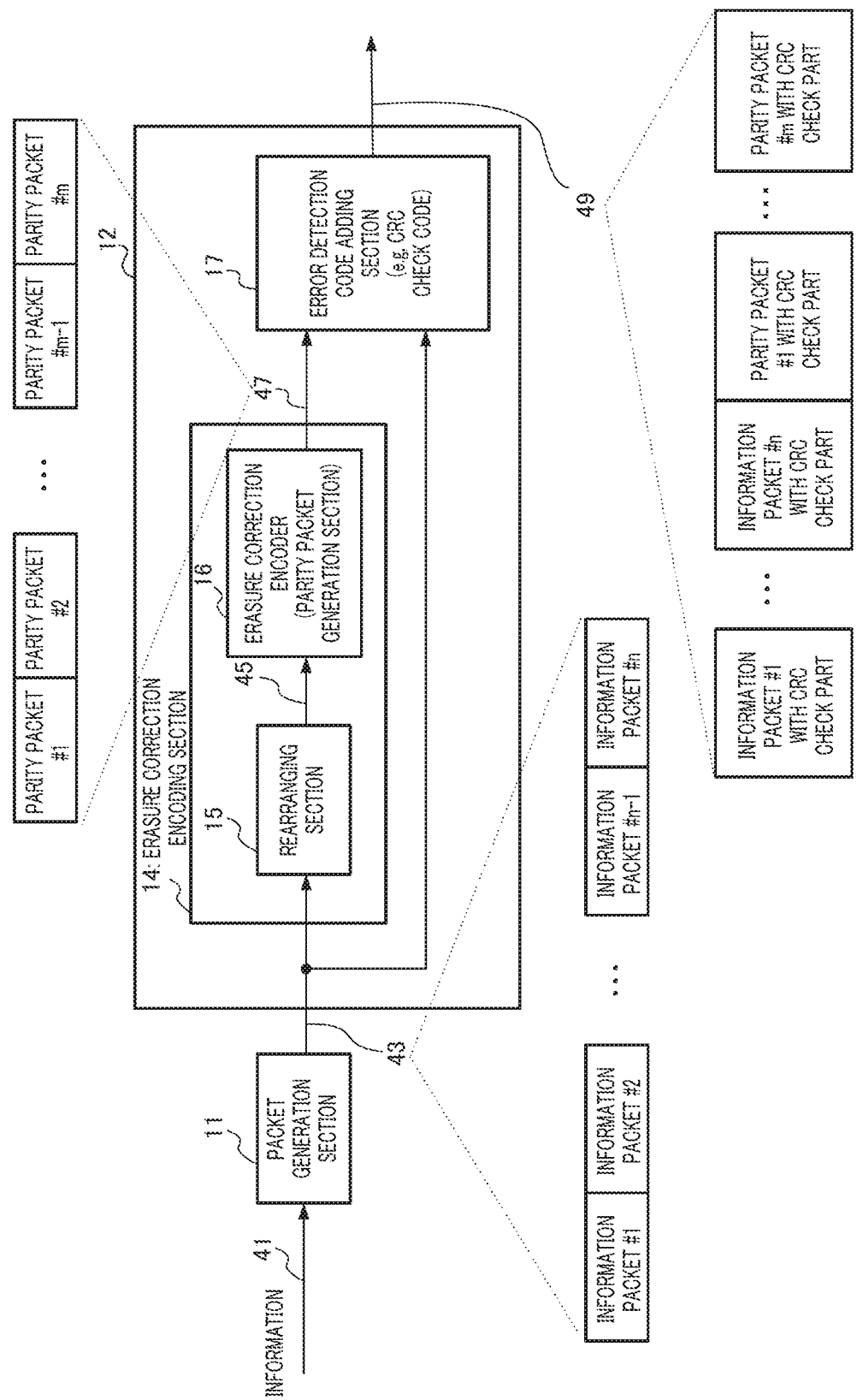
FIG. 3 is a diagram illustrating an erasure correction encoding method.
Figure 4:
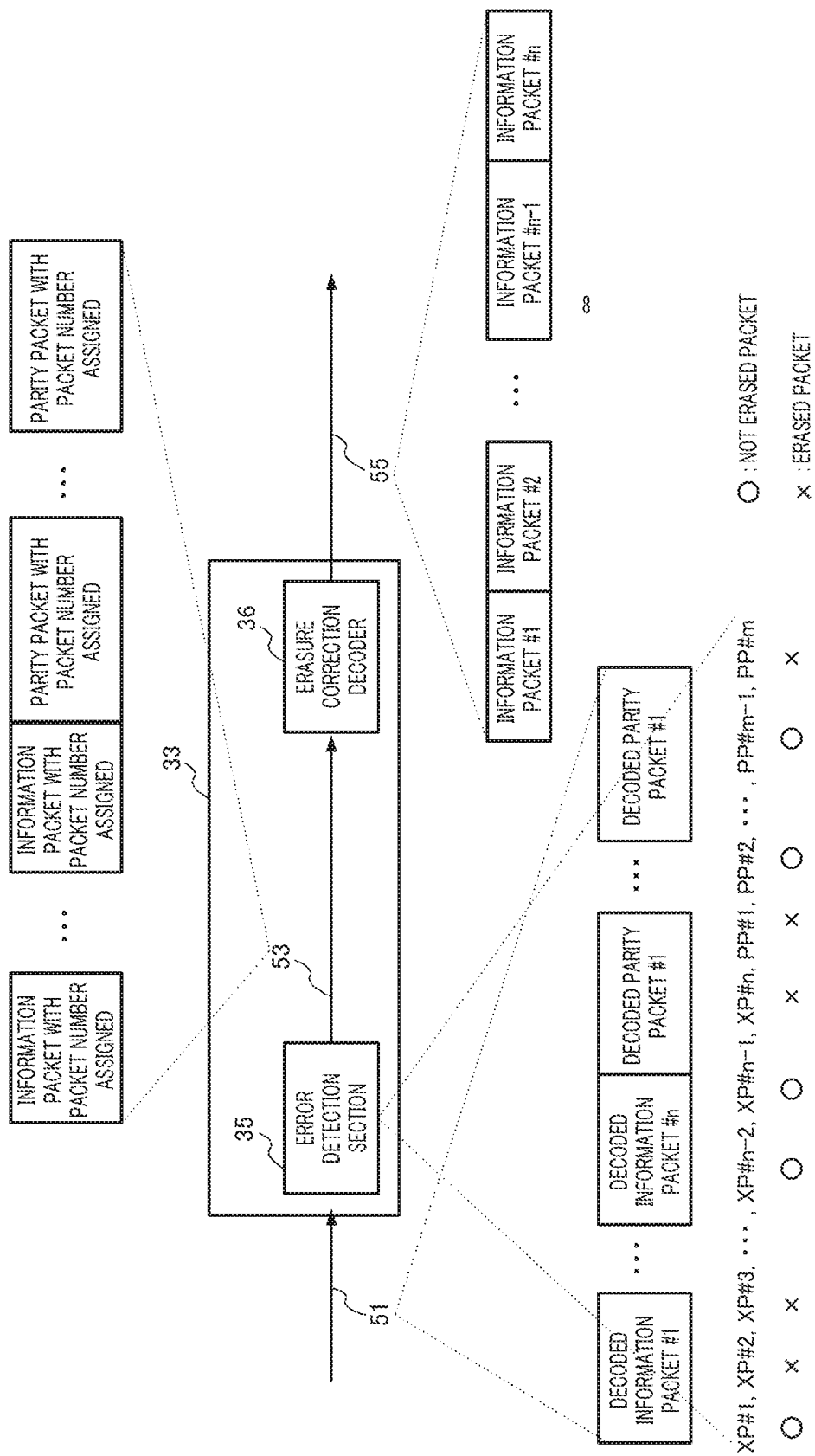
FIG. 4 is a diagram illustrating an erasure correction decoding method.
Figure 5:
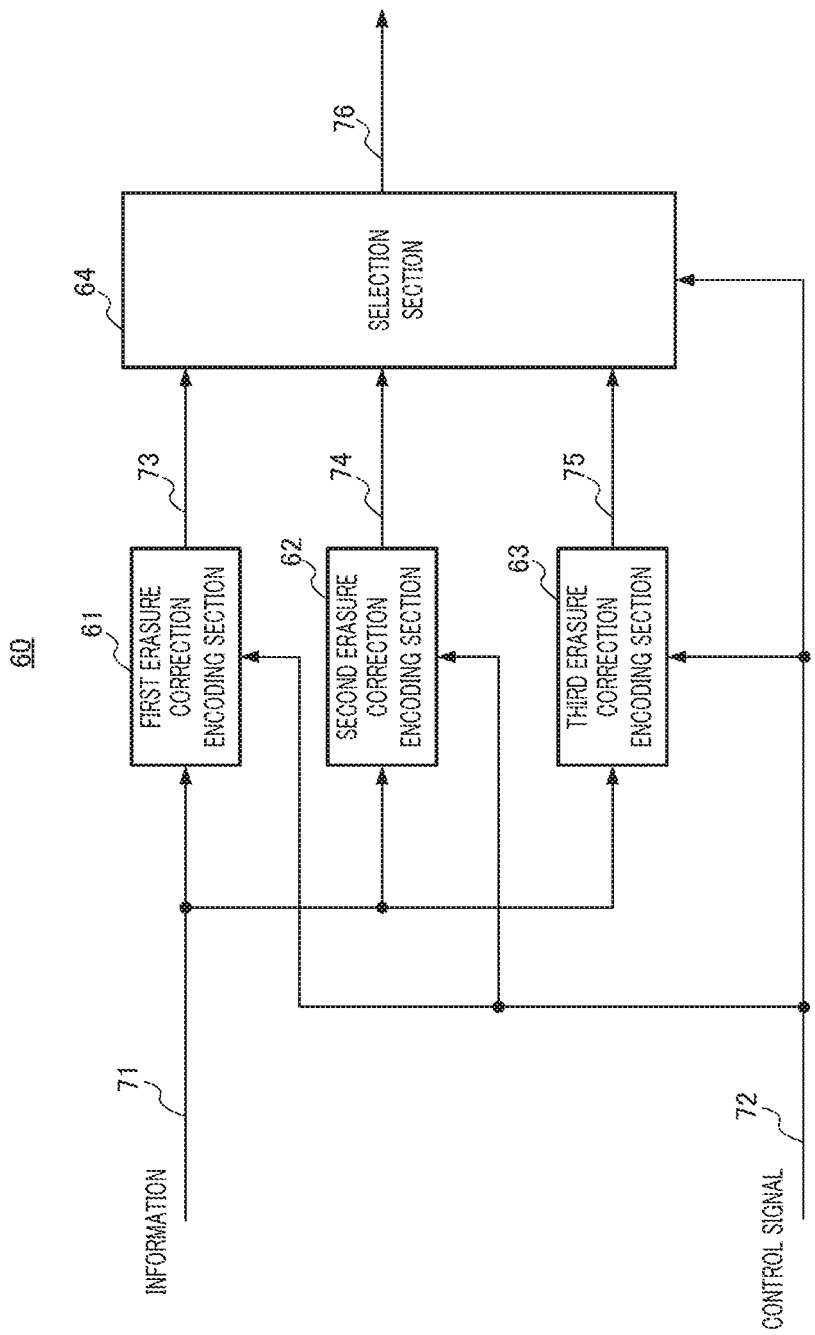
FIG. 5 is a block diagram illustrating a configuration example of an erasure correction encoder capable of changing a coding rate of an erasure correction code.
Figure 6:
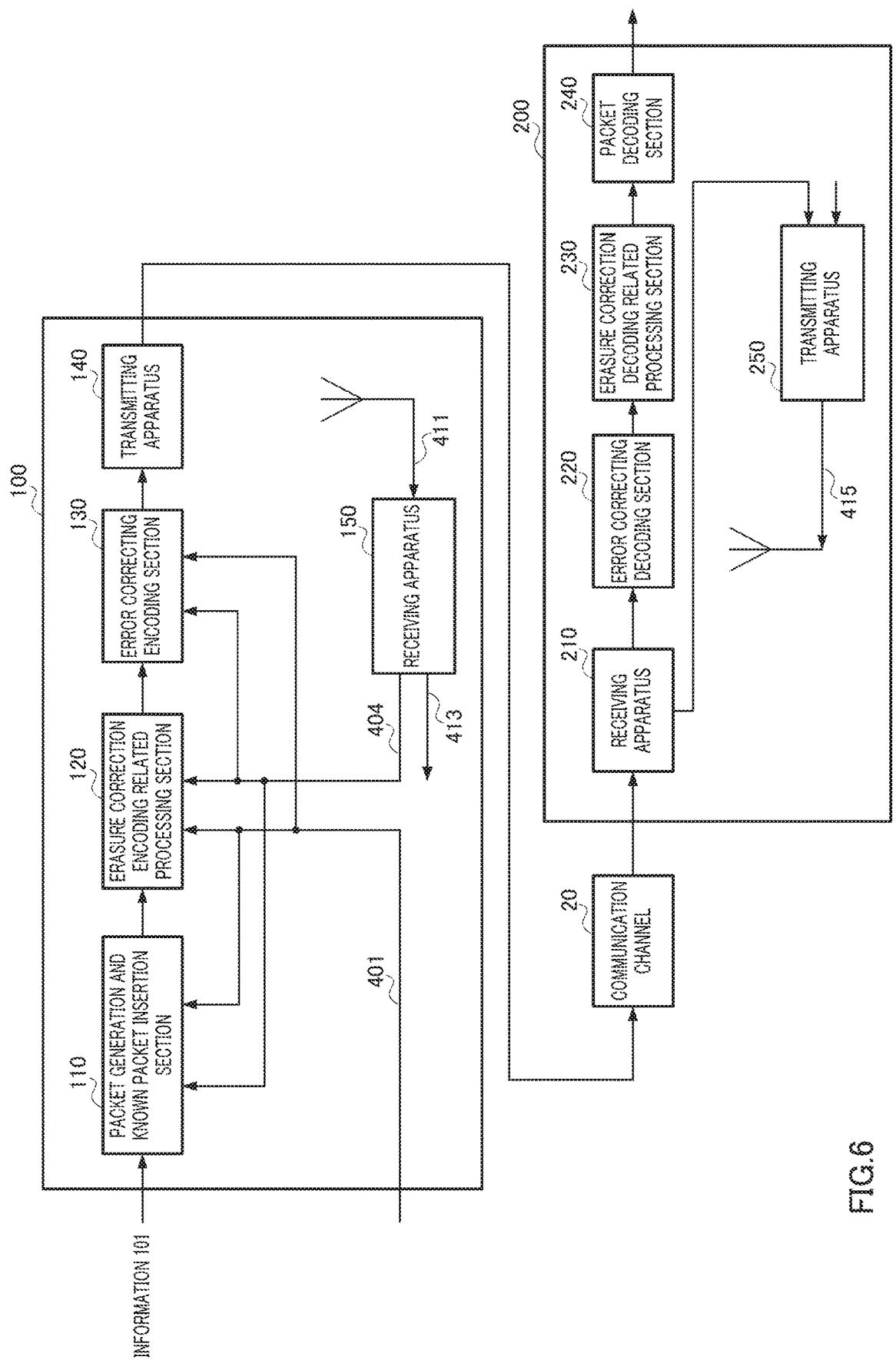
FIG. 6 is a diagram illustrating an overall configuration of a communication system according to Embodiment 1 of the present disclosure.

FIG. 6 is an overall configuration diagram of a communication system according to Embodiment 1 of the present disclosure. In FIG. 6, the communication system includes communication apparatus 100 on an encoding side communication channel 20, and communication apparatus 200 on a decoding side. Communication channel 20 represents a path through which a signal transmitted from transmitting apparatus 140 of communication apparatus 100 on the encoding side passes until it is received by receiving apparatus 210 of communication apparatus 200 on the decoding side. The communication system in FIG. 6 differs from the communication system in FIG. 2 in that the communication system in FIG. 6 can change the coding rate of an erasure correction code.

Receiving apparatus 210 of communication apparatus 200 receives a signal transmitted from communication apparatus 100 and estimates a communication state from control information signals such as pilot signals and preambles of the received signal. Receiving apparatus 210 then generates feedback information (e.g., Channel State Information) in accordance with the communication state and outputs the feedback information generated to transmitting apparatus 250. The feedback information is transmitted from transmitting apparatus 250 to communication apparatus 100 through an antenna.

Receiving apparatus 150 of communication apparatus 100 sets a coding rate of the erasure correction code from the feedback information transmitted from communication apparatus 200 and outputs control signal 404 including information of the set coding rate of the erasure correction code to packet generation and known packet insertion section 110, erasure correction encoding-related processing section 120 and error correcting encoding section 130.

Packet generation and known packet insertion section 110 receives information 101, control signal 404 including information on the coding rate of the erasure correction code and setting signal 401 as input, and generates an information packet based on control signal 404 and setting signal 401. To be more specific, packet generation and known packet insertion section 110 generates an information packet from information 101 and further inserts a known information packet into the information packet in accordance with the coding rate of the erasure correction code included in control signal 404. Setting signal 401 includes information set by communication apparatus 100 such as a packet size, modulation scheme. Details of operations of packet generation and known packet insertion section 110 will be described later.

Erasure correction encoding-related processing section 120 receives control signal 404 and setting signal 401 as input and performs erasure correction encoding on the information packet inputted from packet generation and known packet insertion section 110 based on control signal 404 and setting signal 401. An internal configuration and operations of erasure correction encoding-related processing section 120 will be described later.

To correct an error produced in communication channel 20, error correcting encoding section 130 introduces an error correction code in a physical layer in addition to the erasure correction code in erasure correction encoding-related processing section 120, performs error correcting encoding on an input sequence inputted from erasure correction encoding-related processing section 120 and generates an encoded sequence.

Transmitting apparatus 140 performs predetermined processing (processing such as modulation, band limitation, frequency conversion, amplification) on the encoded sequence generated through error correcting encoding in the physical layer by error correcting encoding section 130.

Receiving apparatus 150 receives received signal 411 received through the antenna as input, performs predetermined processing (processing such as band limitation, frequency conversion, amplification, demodulation) on received signal 411 and generates data 413.

Receiving apparatus 210 of communication apparatus 200 outputs signals other than a control information signal of a received signal to error correcting decoding section 220.

Error correcting decoding section 220 performs error correcting decoding in the physical layer on the signal inputted from receiving apparatus 210 and generates a decoded packet.

Erasure correction decoding related processing section 230 performs erasure correction decoding on the decoded packet. The internal configuration and operations of erasure correction decoding related processing section 230 will be described later.

Packet decoding section 240 converts the packet after the erasure correction into a format analyzable by an information processing section (not shown).

Transmitting apparatus 250 receives feedback information and transmission information as input, performs predetermined processing (processing such as modulation, band limitation, frequency conversion, amplification) on the feedback information and transmission information, generates transmission signal 415 and transmits transmission signal 415 to communication apparatus 100 from, for example, an antenna.

Figure 7:
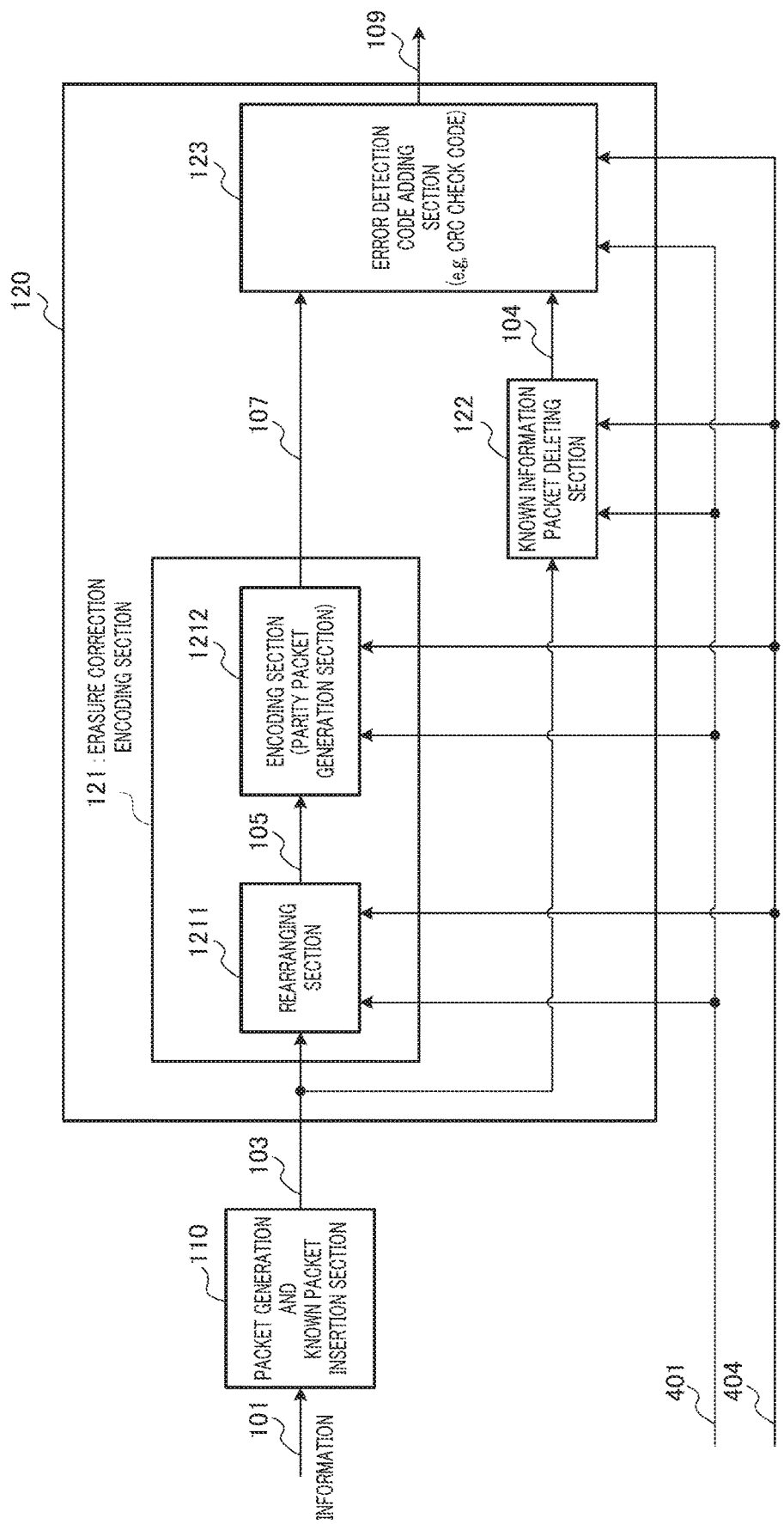
FIG. 7 is a block diagram illustrating a detailed configuration of a portion associated with a change of the coding rate of the erasure correction code in the communication apparatus in FIG. 6.

FIG. 7 is a block diagram illustrating a detailed configuration of the portion associated with a change of the coding rate of the erasure correction code in communication apparatus 100 in FIG. 6. Components in FIG. 7 that operate in the same way as those in FIG. 6 are assigned the same reference numerals.

Erasure correction encoding-related processing section 120 includes erasure correction encoding section 121, known information packet deleting section 122 and error detection code adding section 123.

Rearranging section 1211 of erasure correction encoding section 121 receives setting signal 401, control signal 404 and information packet 103 (here, information packets #1 to #n) as input, rearranges the information in information packet 103 and outputs reordered information 105.

Encoding section (parity packet generation section) 1212 of erasure correction encoding section 121 receives setting signal 401, control signal 404 and reordered information 105 as input, performs, for example, an LDPC-BC or LDPC-CC encoding and generates a parity part. Encoding section (parity packet generation section) 1212 extracts only the parity part generated, generates parity packet 107 from the extracted parity part and outputs parity packet 107. In this case, when parity packets #1 to #m are generated in correspondence with information packets #1 to #n, parity packet 107 becomes parity packets #1 to #m.

Known information packet deleting section 122 receives information packet 103, setting signal 401 and control signal 404 as input and reduces part of information packet 103 based on the coding rate of the erasure correction code included in setting signal 401 and control signal 404. To be more specific, when packet generation and known packet insertion section 110 inserts a known information packet into information packet 103, known information packet deleting section 122 deletes the known information packet from information packet 103 and outputs information packet 104 after the deletion. Therefore, depending on the coding rate, packet generation and known packet insertion section 110 may not insert any known information packet into information packet 103, and in such a case, known information packet deleting section 122 does not delete the known information packet, but outputs information packet 103 as information packet 104 as is. Details of operations of known information packet deleting section 122 will be described later.

Error detection code adding section 123 receives parity packet 107, information packet 104 after the deletion, setting signal 401 and control signal 404 as input, adds an error detection code, for example, a CRC check part to each packet and outputs each packet 109 with a CRC check part. Details of operations of error detection code adding section 123 will be described later.

Figure 8:
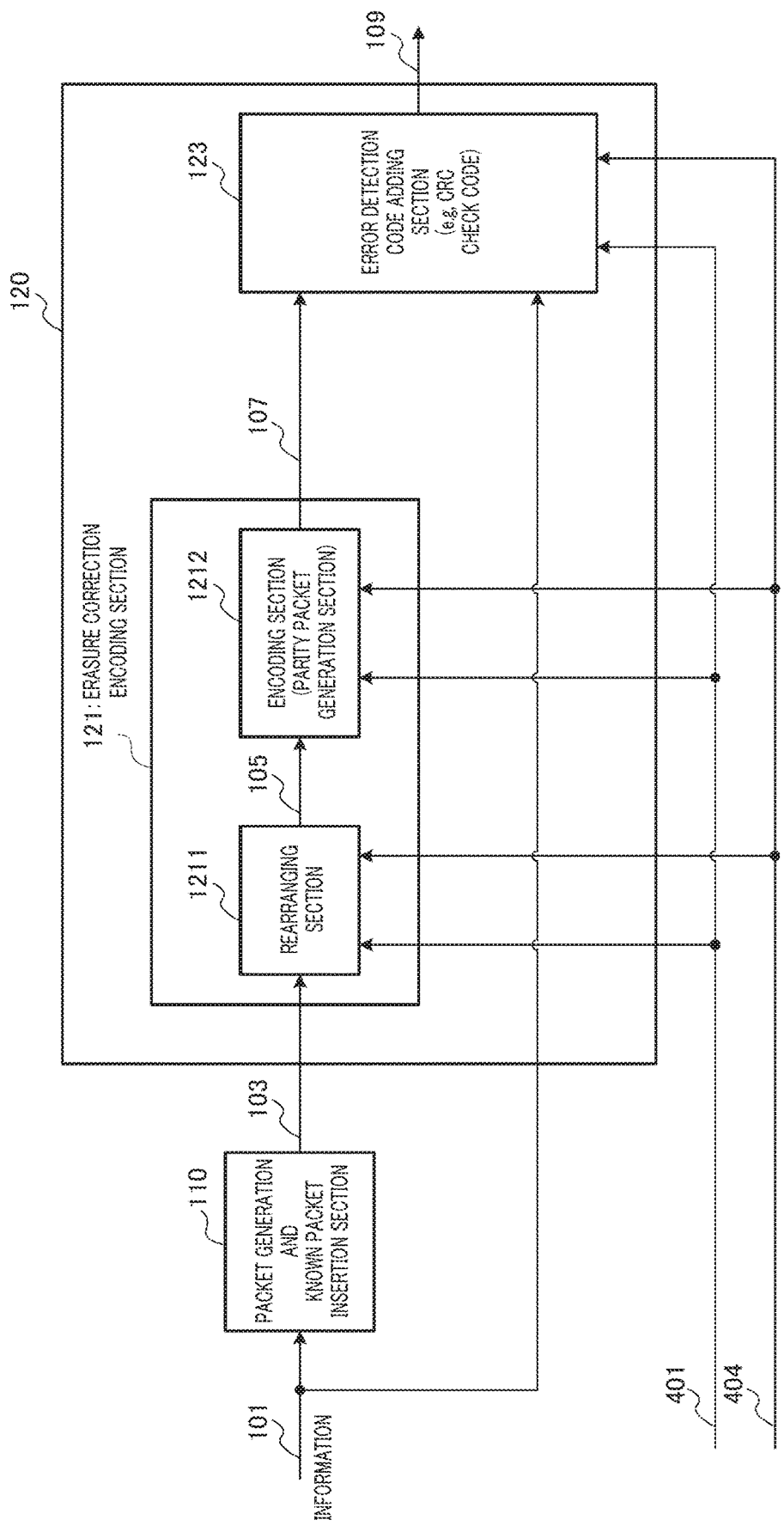
FIG. 8 is a block diagram illustrating another detailed configuration of the portion associated with a change of the coding rate of the erasure correction code in the communication apparatus in FIG. 6.

FIG. 8 is a block diagram illustrating another detailed configuration of the portion associated with a change of the coding rate of the erasure correction code in communication apparatus 100 in FIG. 6. As shown in FIG. 8, adopting a configuration in which information 101 inputted to packet generation and known packet insertion section 110 is inputted to error detection code adding section 123 allows the communication apparatus to operate in the same as in FIG. 7 even when known information packet deleting section 122 in FIG. 7 is omitted.

Figure 9:
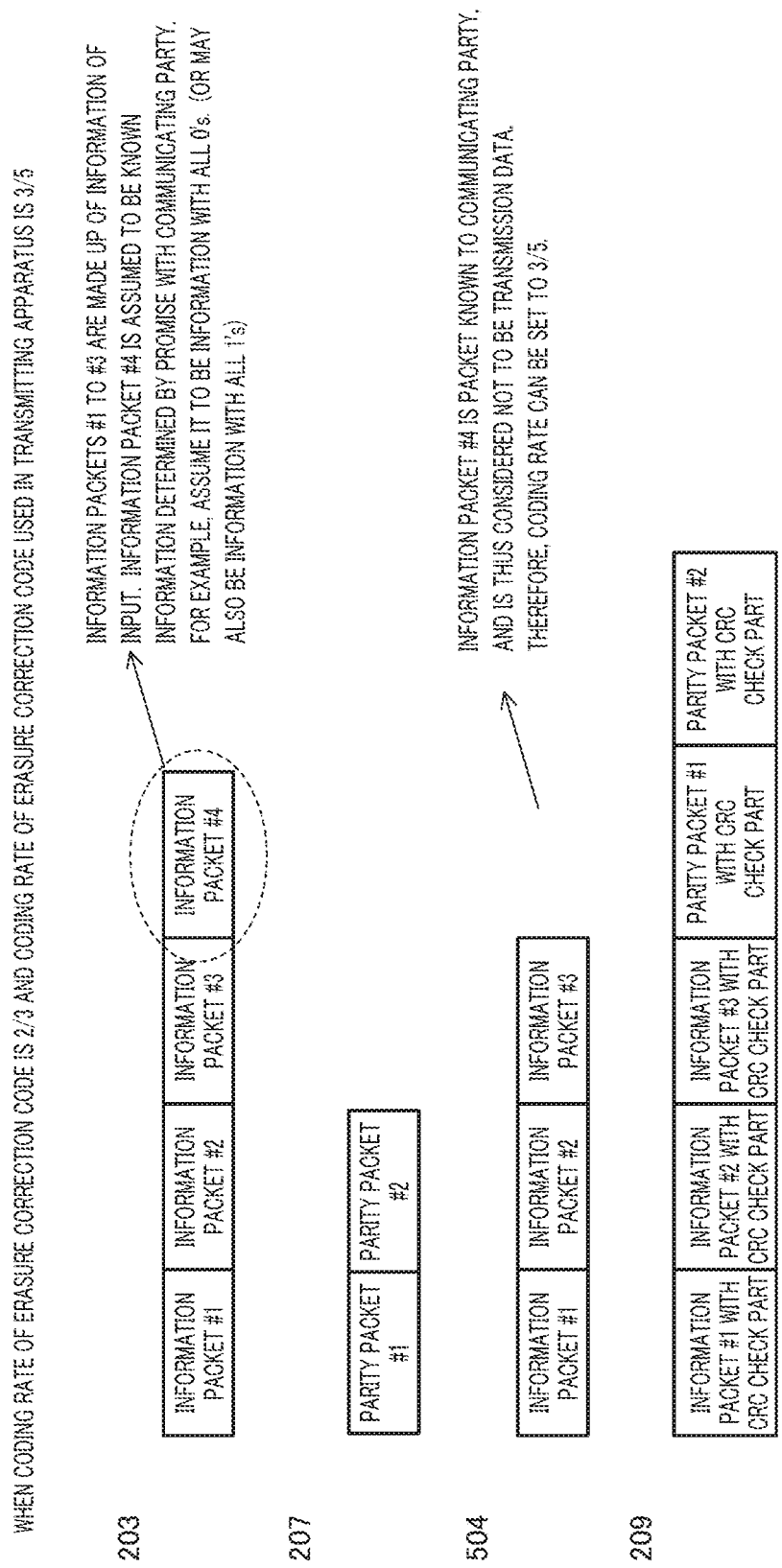
FIG. 9 is a packet configuration diagram illustrating operations of a portion associated with a change of the coding rate of the erasure correction code.

The method of changing the coding rate of the erasure correction code according to the present embodiment will be described using FIG. 9 and FIG. 10. FIG. 9 and FIG. 10 show a packet configuration diagram illustrating operations of a portion associated with a change of the coding rate of the erasure correction code in FIG. 7 and FIG. 8. A case will be described below where encoding section (parity packet generation section) 1212 is made up of an encoder for an erasure correction code of a coding rate of 2/3 and performs erasure correction encoding of a coding rate of 2/3 as an example.

[Coding Rate 3/5]

A case will be described where the coding rate in erasure correction encoding-related processing section 120 is set to 3/5 using an erasure correction code of a coding rate of 2/3.

To set the coding rate in erasure correction encoding-related processing section 120 to 3/5, packet generation and known packet insertion section 110 inserts a known information packet. To be more specific, as shown in FIG. 9, information packets #1 to #3 of information packets #1 to #4 are generated from information 101, while information packet #4 is generated from known information predetermined with the communicating party, for example, information all bits of which are "0." With the known information packet inserted in this way, information packet 103 is made up of information packets #1 to #3 and known information packet #4.

Rearranging section 1211 receives information packet 103 as input, performs reordering and outputs reordered information packet 105.

Encoding section (parity packet generation section) 1212 receives reordered information packet 105 as input and encodes the erasure correction code. Since encoding section (parity packet generation section) 1212 is an encoder of a coding rate of 2/3, encoding section 1212 generates two parity packets (parity packets #1 and #2) with respect to information packet 103 made up of information packets #1 to #4 (see FIG. 9). Encoding section (parity packet generation section) 1212 outputs parity packets #1 and #2 generated as parity packet 107.

Known information packet deleting section 122 deletes the known information packet from information packet 103. In the example shown in FIG. 9, known information packet deleting section 122 receives information packet 103 (information packets #1 to #3 and known information packet #4) as input, deletes known information packet #4 as shown in FIG. 9 and outputs information packet 104 after deleting the known information packet (that is, information packets #1 to #3).

Error detection code adding section 123 receives parity packet 107 and information packet 104 after deleting the known information packet as input and outputs information packets #1 to #3 with a CRC check part and parity packets #1 and #2 with a CRC check part as shown in FIG. 9.

Thus, since erasure correction encoding-related processing section 120 outputs information packets #1 to #3 with a CRC check part and parity packets #1 and #2 with a CRC check part, the coding rate in erasure correction encoding-related processing section 120 can be set to 3/5.

As described above, when encoding section (parity packet generation section) 1212 is an encoder of a coding rate of 2/3, by performing erasure correction encoding of a coding rate of 2/3 on three information packets #1 to #3 and one known information packet #4 and deleting encoded known information packet #4, encoding section (parity packet generation section) 1212 can set the coding rate to 3/5 as erasure correction encoding-related processing section 120 while performing encoding of a coding rate of 2/3.

Thus, even when encoding section (parity packet generation section) 1212 does not provide any erasure correction code of a coding rate of 3/5, the coding rate in erasure correction encoding-related processing section 120 can be set to 3/5, and therefore there is an advantage of being able to reduce the circuit scale of the configurations shown in FIG. 7 and FIG. 8.

[Coding Rate of 1/2]

A case will be described using FIG. 10 where the coding rate in erasure correction encoding-related processing section 120 is set to 1/2 using an erasure correction code of a coding rate of 2/3.

To set the coding rate in erasure correction encoding-related processing section 120 to 1/2, packet generation and known packet insertion section 110 inserts a known information packet. To be more specific, as shown in FIG. 10, information packets #1 and #2 of information packets #1 to #4 are generated from information 101 and information packets #3 and #4 are generated from known information predetermined with the communicating party, for example, information all bits of which are "0." With the known information packets inserted in this way, information packet 103 is made up of information packets #1 and #2 and known information packets #3 and #4.

Rearranging section 1211 receives information packet 103 as input, performs reordering and outputs reordered information packet 105.

Encoding section (parity packet generation section) 1212 receives reordered information packet 105 as input and encodes the erasure correction code. Since encoding section (parity packet generation section) 1212 is an encoder of a coding rate of 2/3, encoding section 1212 generates two parity packets (parity packets #1 and #2) with respect to information packet 103 made up of information packets #1 to #4 (see FIG. 10). Encoding section (parity packet generation section) 1212 outputs parity packets #1 and #2 generated as parity packet 107.

Known information packet deleting section 122 deletes the known information packet from information packet 103. In the example shown in FIG. 10, known information packet deleting section 122 receives information packet 103 (information packets #1 and #2 and known information packets #3 and #4) as input, deletes known information packets #3 and #4 as shown in FIG. 10 and outputs information packet 104 after the deletion of the known information packets (that is, information packets #1 and #2).

Error detection code adding section 123 receives parity packet 107 and information packet 104 after the deletion of the known information packets as input and outputs information packets #1 and #2 with a CRC check part and parity packets #1 and #2 with a CRC check part as shown in FIG. 10.

Thus, information packets #1 and #2 with a CRC check part and parity packets #1 and #2 with a CRC check part are outputted from erasure correction encoding-related processing section 120, and therefore the coding rate in erasure correction encoding-related processing section 120 can be set to 1/2.

As described above, when coding section (parity packet generation section) 1212 is an encoder of a coding rate of 2/3, by performing erasure correction encoding of a coding rate of 2/3 on two information packets #1 and #2 and two known information packets #3 and #4 and deleting encoded known information packets #3 and #4, coding section (parity packet generation section) 1212 can set the coding rate to 1/2 as erasure correction encoding-related processing section 120 while performing encoding of a coding rate of 2/3.

In the case of a coding rate of 2/3, known information packets are not used and a coding rate of 2/3 can be realized by generating parity packets #1 and #2 from information packets #1 to #4 not including known information packets.

Figure 11:
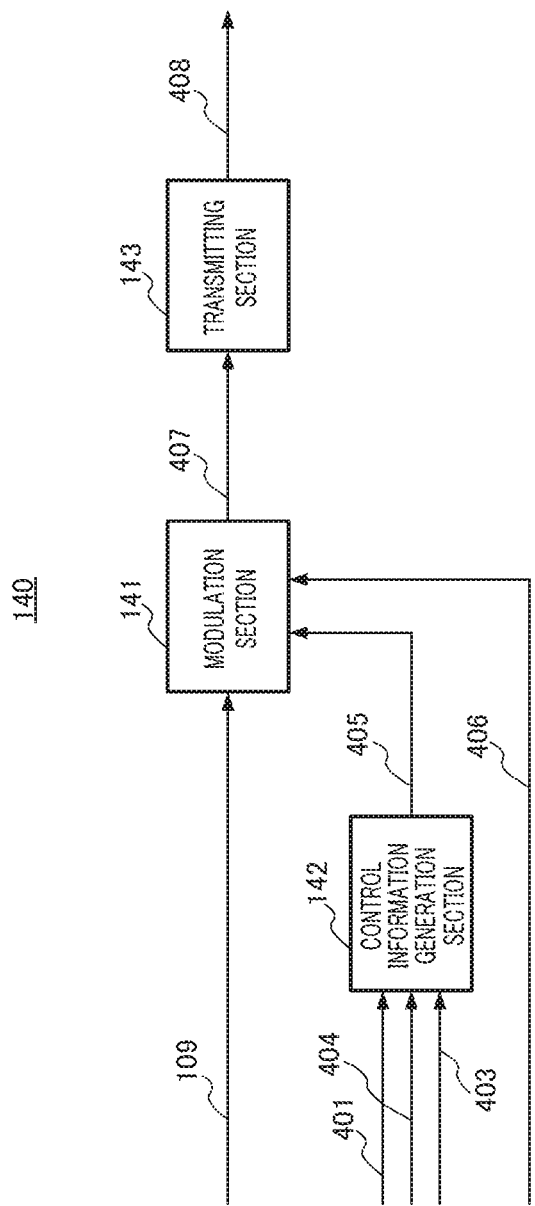
FIG. 11 is a block diagram illustrating a configuration of a transmitting apparatus for transmitting information of the coding rate of the erasure correction code to a communicating party.

When communication apparatus 100 sets the coding rate of the erasure correction code (coding rate in erasure correction encoding-related processing section 120) from the feedback information transmitted from communication apparatus 200, communication apparatus 100 needs to report information of the set coding rate of the erasure correction code (coding rate in erasure correction encoding-related processing section 120) to the communicating party. FIG. 11 is a block diagram illustrating the configuration of transmitting apparatus 140 of communication apparatus 100 for communication apparatus 100 to transmit information of the coding rate of the erasure correction code to communication apparatus 200 which is the communicating party.

Control information generation section 142 receives setting signal 401 relating to the erasure correction code, control signal 404 and other control signal 403 as input, and generates and outputs control information 405 to be transmitted to the communicating party. In this case, suppose control information 405 to be transmitted to the communicating party includes information on the coding rate set as the coding rate in erasure correction encoding-related processing section 120.

Modulation section 141 receives each packet 109 with a CRC check part, control information 405 to be transmitted to the communicating party and frame configuration signal 406 as input, and generates and outputs modulated signal 407 according to frame configuration signal 406.

Transmitting section 143 receives modulated signal 407 as input, performs predetermined processing (processing such as band limitation, frequency conversion, amplification) and outputs transmission signal 408.

Figure 12:
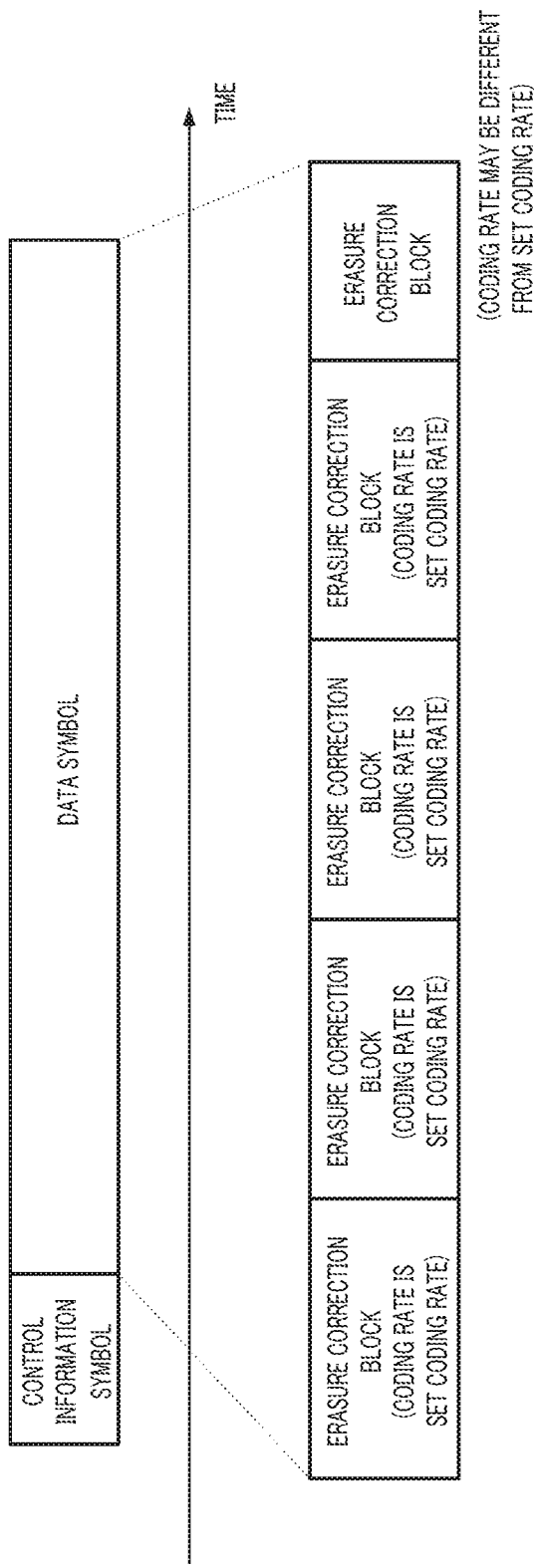
FIG. 12 is a diagram illustrating a frame configuration example on the time axis outputted from the transmitting apparatus.

FIG. 12 is a diagram illustrating a frame configuration example of transmission signal 408 outputted from transmitting apparatus 140 on the time axis. In the example shown in FIG. 12, a frame is made up of a control information symbol and a data symbol. In this case, suppose the data symbol is made up of a plurality of erasure correction blocks. However, when the size of the data symbol is small, the data symbol may be made up of one erasure correction block.

Erasure correction encoding is by bundling a plurality of packets. For example, in the example of FIG. 9, four packets of information packets #1 to #4 are bundled and erasure correction encoding is performed based on the unit of four packets. At this time, in the example of FIG. 9, the erasure correction block is made up of five packets with a CRC check part; information packets #1 to #3 excluding information packet #4 to which known information is assigned and parity packets #1 and #2 with a CRC check part. Thus, the erasure correction block is made up of packets except known information packets, generated based on the unit in which erasure correction encoding is performed. Therefore, the coding rate in the erasure correction block becomes the set coding rate. For example, in the example of FIG. 9, the erasure correction block is made up of five packets and since the number of information packets is three, the coding rate in the erasure correction block is 3/5.

However, when the information to be transmitted is small, the coding rate in the erasure correction block does not always match the set coding rate. When, for example, the information to be transmitted is equal to or less than information packet #1, known information is assigned to information packets #2 to #4, and the erasure correction block is made up of information packet #1 with a CRC check part and parity packets #1 and #2. Therefore, the coding rate in the erasure correction block in this case is 2/3 and is not the same as fixed coding rate 3/5 in the other erasure correction blocks. That is, as shown in FIG. 12, one of the plurality of erasure correction blocks may have a coding rate different from the set coding rate. This is because the number of known information packets included in packets bundled when erasure correction encoding is performed is different.

Figure 13:
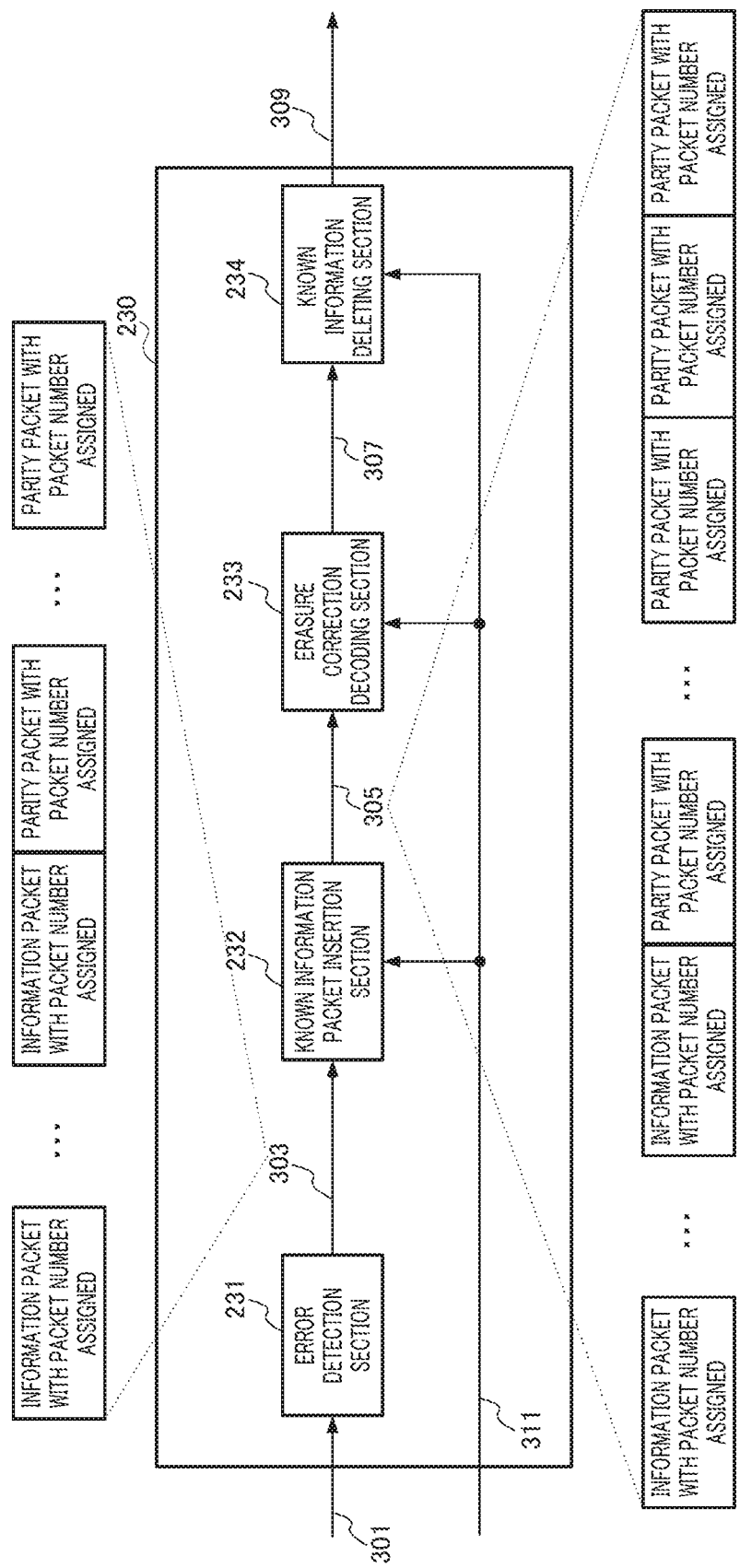
FIG. 13 is a block diagram illustrating an example of a detailed configuration of the erasure correction decoding related processing section.

FIG. 13 is a block diagram illustrating an example a detailed configuration of erasure correction decoding related processing section 230 of communication apparatus 200 in FIG. 6.

Error detection section 231 receives decoded packet 301 of the error correction code in the physical layer as input, performs error detection using, for example, a CRC check, assigns packet numbers to information packets without packet erasure and parity packets without packet erasure and outputs those packets as packet 303.

Known information packet insertion section 232 receives control information 311 including information of the coding rate set for erasure correction, packet 303 (information packet without packet erasure (with packet number assigned) and parity packet without packet erasure (with packet number assigned)) as input and inserts known information packets included in control information 311 and inserted by the communicating party for erasure correction based on information on the set coding rate of the erasure correction code into packet 303. Therefore, known information packet insertion section 232 outputs packet 305 after inserting the known information packet. Here, control information 311 including the information of the coding rate set for erasure correction is obtained by receiving apparatus 150 in FIG. 6 demodulating the control information symbol shown in FIG. 12.

Erasure correction decoding section 233 receives packet 305 as input, also receives control information 311 including the information of the coding rate set for erasure correction as input, performs reordering of packet 305, that is, reordering of information packets without packet erasure (with packet numbers assigned), parity packets without packet erasure (with packet numbers assigned) and data of known information packets, performs erasure correction decoding on the reordered data and decodes information packet 307. Erasure correction decoding section 233 outputs decoded information packet 307.

Known information packet deleting section 234 receives decoded information packet 307 and control information 311 including the information of the coding rate set for erasure correction as input, deletes the known information packets from information packet 307 according to the coding rate and outputs information packet 309 after the deletion of known information packets.

Thus, packet generation and known packet insertion section 110 is provided before erasure correction encoding-related processing section 120 and packet generation and known packet insertion section 110 inserts known information packets, and can thereby change the coding rate in erasure correction encoding-related processing section 120 and can thereby improve both transmission efficiency and erasure correction capability.

Although a configuration has been described above where encoding section (parity packet generation section) 1212 provides one coding rate of the erasure correction code and erasure correction encoding-related processing section 120 inserts known information packets to realize other coding rates, encoding section (parity packet generation section) 1212 may provide, for example, a plurality of erasure correction codes to support different coding rates and erasure correction encoding-related processing section 120 may insert known information packets to further support different coding rates. Furthermore, encoding section (parity packet generation section) 1212 may provide a plurality of erasure correction codes of different code lengths to support erasure correction of long packets and short packets or may insert known information packets into respective erasure correction codes so that erasure correction encoding-related processing section 120 may change the coding rate.

Embodiment 2

Embodiment 1 has described the method of making the coding rate of an erasure correction code variable. A case will be described below where the method of making the coding rate of the erasure correction code variable described in Embodiment 1 will be realized using an LDPC-CC (e.g., see Non-Patent Literature 3).

As a premise thereof, the present embodiment will describe an LDPC-CC having good characteristics first. Embodiment 3 will describe a method of making the coding rate variable when an LDPC-CC is applied to a physical layer which will be described in the present embodiment. Embodiment 4 will describe a method of making the coding rate variable when the LDPC-CC described in the present embodiment is used for an erasure correction code.

An LDPC-CC is a convolutional code defined by a low-density parity check matrix. As an example, FIG. 14 illustrates parity check matrix $H^T[0,n]$ of an LDPC-CC of a coding rate of R=1/2. Here, element $h_1^{(m)}(t)$ of $H^T[0,n]$ has a value of 0 or 1. All elements other than $h_1^{(m)}(t)$ are 0. M represents the LDPC-CC memory length, and n represents the length of an LDPC-CC codeword. As shown in FIG. 14, a characteristic of an LDPC-CC parity check matrix is that it is a parallelogram-shaped matrix in which 1 is placed only in diagonal terms of the matrix and neighboring elements, and the bottom-left and top-right elements of the matrix are zero.

Figure 15:
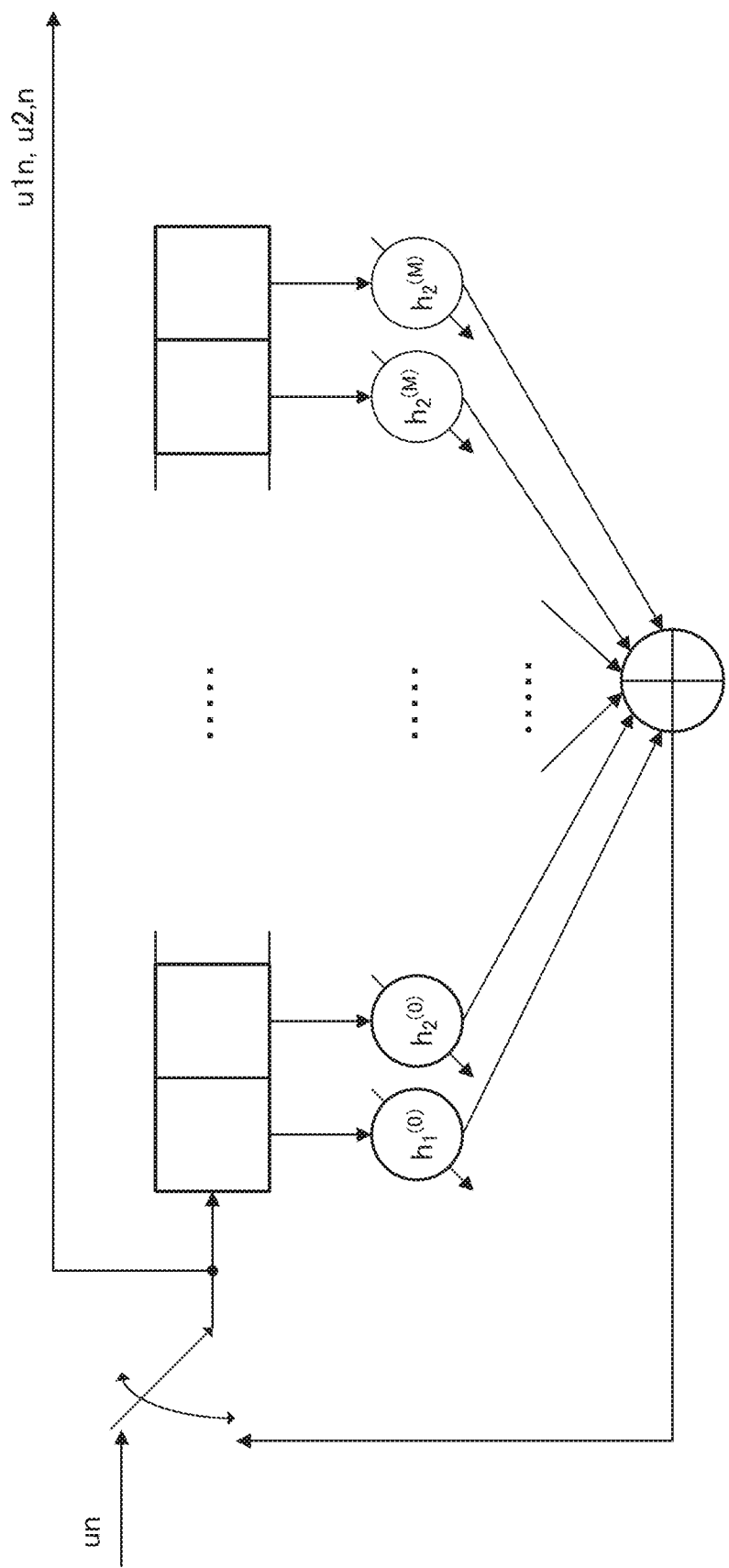
FIG. 15 is a diagram illustrating a configuration example of an encoder of an LDPC-CC defined by parity check matrix $H^T[0, n]$.

Here, FIG. 15 shows a configuration example of an encoder of LDPC-CC defined by parity check matrix $H^T[0,n]$ when $h_1^{(0)}(t)=1$ and $h_2^{(0)}(t)=1$. As shown in FIG. 15, the encoder of LDPC-CC is provided with (M+1) shift registers and a mod 2 (exclusive OR) adder. For this reason, the encoder of LDPC-CC features the ability to be realized by an extremely simple circuit compared to a circuit carrying out multiplication of generator matrices or an encoder of LDPC-BC that carries out computations based on a backward (forward) substitution method. Furthermore, since the encoder shown in FIG. 15 is an encoder of convolutional code, it is not necessary to divide an information sequence into blocks of a fixed length for encoding and an information sequence of an arbitrary length can be encoded.

Hereinafter, an LDPC-CC of a time varying period of g providing good characteristics will be described.

First, an LDPC-CC of a time varying period of 4 having good characteristics will be described. A case in which the coding rate is 1/2 will be described below as an example.

Consider equations 1-1 to 1-4 as parity check polynomials of an LDPC-CC for which the time varying period is 4. At this time, X(D) is a polynomial representation of data (information) and P(D) is a parity polynomial representation. Here, in equations 1-1 to 1-4, parity check polynomials have been assumed in which there are four terms in X(D) and P(D) respectively, the reason being that four terms are desirable from the standpoint of obtaining good received quality.

[1]

$$(D^{a1}+D^{a2}+D^{a3}+D^{a4})X(D)+(D^{b1}+D^{b2}+D^{b3}+D^{b4})P(D)=0 \quad \text{(Equation 1-1)}$$

$$(D^{A1}+D^{A2}+D^{A3}+D^{A4})X(D)+(D^{B1}+D^{B2}+D^{B3}+D^{B4})P(D)=0 \quad \text{(Equation 1-2)}$$

$$(D^{\alpha1}+D^{\alpha2}+D^{\alpha3}+D^{\alpha4})X(D)+(D^{\beta1}+D^{\beta2}+D^{\beta3}+D^{\beta4})P(D)=0 \quad \text{(Equation 1-3)}$$

$$(D^{E1}+D^{E2}+D^{E3}+D^{E4})X(D)+(D^{F1}+D^{F2}+D^{F3}+D^{F4})P(D)=0 \quad \text{(Equation 1-4)}$$

In equation 1-1, it is assumed that a1, a2, a3 and a4 are integers (where $a1 \neq a2 \neq a3 \neq a4$). Use of the notation "$a1 \neq a2 \neq a3 \neq a4$" is assumed to express the fact that a1, a2, a3 and a4 are all mutually different. Also, it is assumed that b1, b2, b3 and b4 are integers (where $b1 \neq b2 \neq b3 \neq b4$). A parity check polynomial of equation 1-1 is called "check equation #1." A sub-matrix based on the parity check polynomial of equation 1-1 is designated first sub-matrix $H_1$.

In equation 1-2, it is assumed that A1, A2, A3, and A4 are integers (where $A1 \neq A2 \neq A3 \neq A4$). Also, it is assumed that B1, B2, B3, and B4 are integers (where $B1 \neq B2 \neq B3 \neq B4$). A parity check polynomial of equation 1-2 is called "check equation #2." A sub-matrix based on the parity check polynomial of equation 1-2 is designated second sub-matrix $H_2$.

In equation 1-3, it is assumed that $\alpha1, \alpha2, \alpha3$, and $\alpha4$ are integers (where $\alpha1 \neq \alpha2 \neq \alpha3 \neq \alpha4$). Also, it is assumed that $\beta1, \beta2, \beta3$, and $\beta4$ are integers (where $\beta1 \neq \beta2 \neq \beta3 \neq \beta4$). A parity check polynomial of equation 1-3 is called "check equation #3." A sub-matrix based on the parity check polynomial of equation 1-3 is designated third sub-matrix $H_3$.

In equation 1-4, it is assumed that E1, E2, E3, and E4 are integers (where $E1 \neq E2 \neq E3 \neq E4$). Also, it is assumed that F1, F2, F3, and F4 are integers (where $F1 \neq F2 \neq F3 \neq F4$). A parity check polynomial of equation 1-4 is called "check equation #4." A sub-matrix based on the parity check polynomial of equation 1-4 is designated fourth sub-matrix $H_4$.

Figure 16:
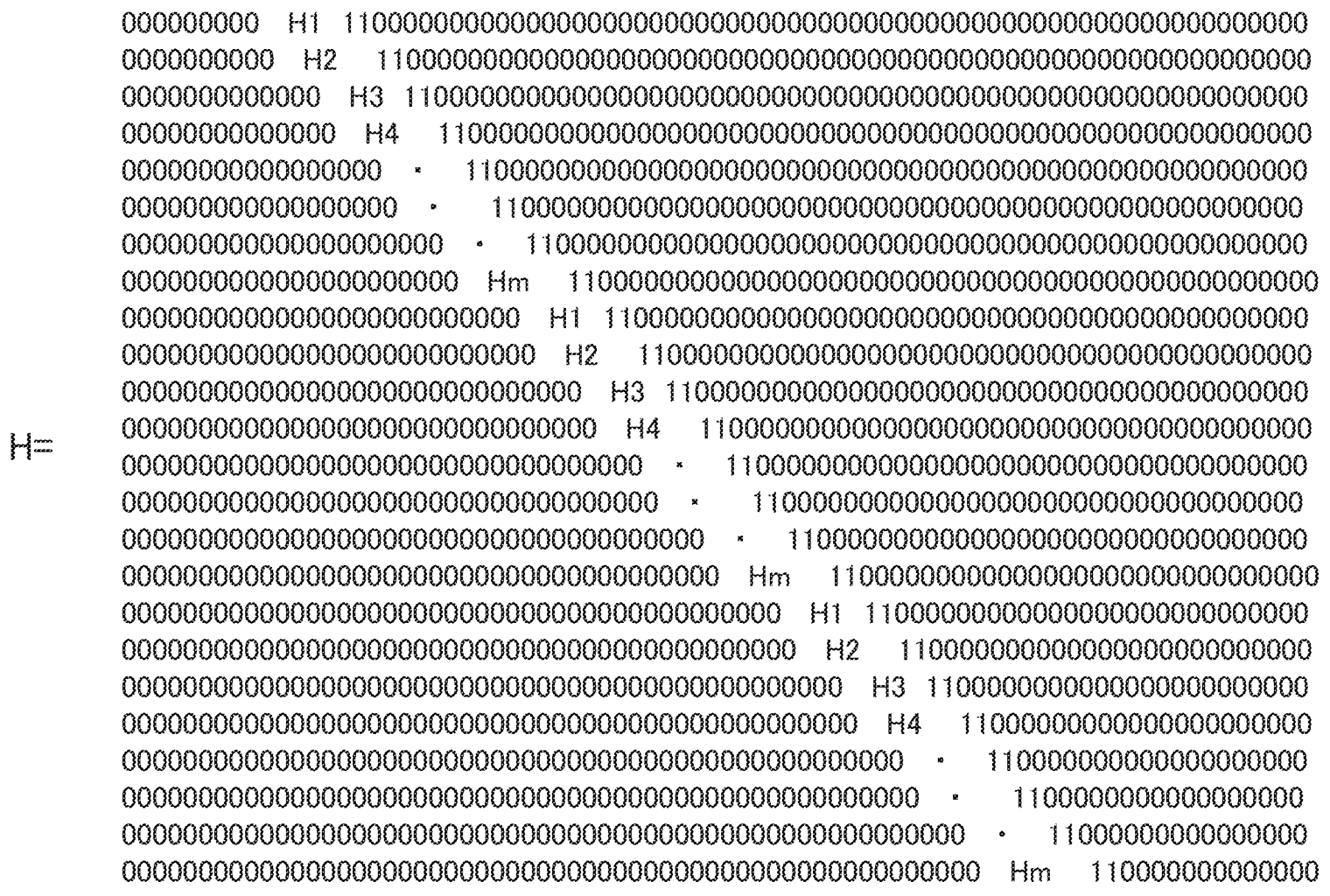

Next, an LDPC-CC of a time varying period of 4 is considered that generates a parity check matrix such as shown in FIG. 16 from first sub-matrix $H_1$, second sub-matrix $H_2$, third sub-matrix $H_3$, and fourth sub-matrix $H_4$.

At this time, if k is designated as a remainder after dividing the values of combinations of degrees of X(D) and P(D), (a1, a2, a3, a4), (b1, b2, b3, b4), (A1, A2, A3, A4), (B1, B2, B3, B4), ($\alpha1, \alpha2, \alpha3, \alpha4$), ($\beta1, \beta2, \beta3, \beta4$), (E1, E2, E3, E4), (F1, F2, F3, F4), in equations 1-1 to 1-4 by 4, provision is made for one each of remainders 0, 1, 2, and 3 to be included in four-coefficient sets represented as shown above (for example, (a1, a2, a3, a4)), and to hold true with respect to all of the above four-coefficient sets.

For example, if degrees (a1, a2, a3, a4) of X(D) of "check equation #1" are set as (a1, a2, a3, a4)=(8, 7, 6, 5), remainders k after dividing degrees (a1, a2, a3, a4) by 4 are (0, 3, 2, 1), and one each of 0, 1, 2 and 3 are included in the four-coefficient set as remainders k. Similarly, if degrees (b1, b2, b3, b4) of P(D) of "check equation #1" are set as (b1, b2, b3, b4)=(4, 3, 2, 1), remainders k after dividing degrees (b1, b2, b3, b4) by 4 are (0, 3, 2, 1), and one each of 0, 1, 2 and 3 are included in the four-coefficient set as remainders k. It is assumed that the above condition about "remainder" also holds true for the four-coefficient sets of X(D) and P(D) of the other parity check equations ("check equation #2," "check equation #3" and "check equation #4").

By this means, the column weight of parity check matrix H configured from equations 1-1 to 1-4 becomes 4 for all columns, which enables a regular LDPC code to be formed. Here, a regular LDPC code is an LDPC code that is defined by a parity check matrix for which each column weight is equally fixed, and is characterized by the fact that its characteristics are stable and an error floor is unlikely to occur. In particular, since the characteristics are good when the column weight is 4, an LDPC-CC offering good reception performance can be obtained by generating an LDPC-CC as described above.

In the above description, a case in which the coding rate is 1/2 has been described as an example, but a regular LDPC code is also formed and good received quality can be obtained when the coding rate is (n−1)/n if the above condition about "remainder" holds true for four-coefficient sets in information $X_1(D), X_2(D), \ldots, X_{n-1}(D)$.

In the case of a time varying period of 2, also, it has been confirmed that a code with good characteristics can be found if the above condition about "remainder" is applied. An LDPC-CC of a time varying period of 2 with good characteristics is described below. A case in which the coding rate is 1/2 is described below as an example.

Consider equations 2-1 and 2-2 as parity check polynomials of an LDPC-CC for which the time varying period is 2. At this time, X(D) is a polynomial representation of data (information) and P(D) is a parity polynomial representation. Here, in equations 2-1 and 2-2, parity check polynomials have been assumed in which there are four terms in X(D) and P(D) respectively, the reason being that four terms are desirable from the standpoint of obtaining good received quality.

[2]

$$(D^{a1}+D^{a2}+D^{a3}+D^{a4})X(D)+(D^{b1}+D^{b2}+D^{b3}+D^{b4})P(D)=0 \quad \text{(Equation 2-1)}$$

$$(D^{A1}+D^{A2}+D^{A3}+D^{A4})X(D)+(D^{B1}+D^{B2}+D^{B3}+D^{B4})P(D)=0 \quad \text{(Equation 2-2)}$$

In equation 2-1, it is assumed that a1, a2, a3, and a4 are integers (where a1≠a2≠a3≠a4). Also, it is assumed that b1, b2, b3, and b4 are integers (where b1≠b2≠b3≠b4). A parity check polynomial of equation 2-1 is called "check equation #1." A sub-matrix based on the parity check polynomial of equation 2-1 is designated first sub-matrix $H_1$.

Furthermore, suppose A1, A2, A3 and A4 in equation 2-2 are integers (where A1≠A2≠A3≠A4). Furthermore, suppose B1, B2, B3 and B4 are integers (where B1≠B2≠B3≠B4). The parity check polynomial of equation 2-2 is called "check equation #2." Suppose the sub-matrix based on the parity check polynomial of equation 2-2 is second sub-matrix $H_2$.

Next, an LDPC-CC of a time varying period of 2 generated from first sub-matrix $H_1$ and second sub-matrix $H_2$ is considered.

At this time, if k is designated as a remainder after dividing the values of combinations of degrees of X(D) and P(D), (a1, a2, a3, a4), (b1, b2, b3, b4), (A1, A2, A3, A4), (B1, B2, B3, B4), in equations 2-1 and 2-2 by 4, provision is made for one each of remainders 0, 1, 2, and 3 to be included in four-coefficient sets represented as shown above (for example, (a1, a2, a3, a4)), and to hold true with respect to all of the above four-coefficient sets.

For example, if degrees (a1, a2, a3, a4) of X(D) of "check equation #1" are set as (a1, a2, a3, a4)=(8, 7, 6, 5), remainders k after dividing degrees (a1, a2, a3, a4) by 4 are (0, 3, 2, 1), and one each of 0, 1, 2 and 3 are included in the four-coefficient set as remainders k. Similarly, if degrees (b1, b2, b3, b4) of P(D) of "check equation #1" are set as (b1, b2, b3, b4)=(4, 3, 2, 1), remainders k after dividing degrees (b1, b2, b3, b4) by 4 are (0, 3, 2, 1), and one each of 0, 1, 2 and 3 are included in the four-coefficient set as remainders k. It is assumed that the above condition about "remainder" also holds true for the four-coefficient sets of X(D) and P(D) of "check equation #2."

By this means, the column weight of parity check matrix H configured from equations 2-1 and 2-2 becomes 4 for all columns, which enables a regular LDPC code to be formed. Here, a regular LDPC code is an LDPC code that is defined by a parity check matrix for which each column weight is equally fixed, and is characterized by the fact that its characteristics are stable and an error floor is unlikely to occur. In particular, since the characteristics are good when the column weight is 8, an LDPC-CC enabling reception performance to be further improved can be obtained by generating an LDPC-CC as described above.

In the above description (LDPC-CCs of a time varying period of 2), a case in which the coding rate is 1/2 has been described as an example, but a regular LDPC code is also formed and good received quality can be obtained when the coding rate is (n−1)/n if the above condition about "remainder" holds true for four-coefficient sets in information $X_1(D), X_2(D), \ldots, X_{n-1}(D)$.

In the case of a time varying period of 3, also, it has been confirmed that a code with good characteristics can be found if the following condition about "remainder" is applied. An LDPC-CC of a time varying period of 3 with good characteristics is described below. A case in which the coding rate is 1/2 is described below as an example.

Consider equations 3-1 to 3-3 as parity check polynomials of an LDPC-CC for which the time varying period is 3. At this time, X(D) is a polynomial representation of data (information) and P(D) is a parity polynomial representation. Here, in equations 3-1 to 3-3, parity check polynomials are assumed such that there are three terms in X(D) and P(D) respectively.

[3]

$$(D^{a1}+D^{a2}+D^{a3})X(D)+(D^{b1}+D^{b2}+D^{b3})P(D)=0 \quad \text{(Equation 3-1)}$$

$$(D^{A1}+D^{A2}+D^{A3})X(D)+(D^{B1}+D^{B2}+D^{B3})P(D)=0 \quad \text{(Equation 3-2)}$$

$$(D^{\alpha1}+D^{\alpha2}+D^{\alpha3})X(D)+(D^{\beta1}+D^{\beta2}+D^{\beta3})P(D)=0 \quad \text{(Equation 3-3)}$$

In equation 3-1, it is assumed that a1, a2, and a3 are integers (where a1≠a2≠a3). Also, it is assumed that b1, b2 and b3 are integers (where b1≠b2≠b3). A parity check polynomial of equation 3-1 is called "check equation #1." A sub-matrix based on the parity check polynomial of equation 3-1 is designated first sub-matrix $H_1$.

In equation 3-2, it is assumed that A1, A2 and A3 are integers (where A1≠A2≠A3). Also, it is assumed that B1, B2 and B3 are integers (where B1≠B2≠B3). A parity check polynomial of equation 3-2 is called "check equation #2." A sub-matrix based on the parity check polynomial of equation 3-2 is designated second sub-matrix $H_2$.

In equation 3-3, it is assumed that α1, α2 and α3 are integers (where α1≠a2≠a3). Also, it is assumed that β1, β2 and β3 are integers (where β1≠β2≠β3). A parity check polynomial of equation 3-3 is called "check equation #3." A sub-matrix based on the parity check polynomial of equation 3-3 is designated third sub-matrix $H_3$.

Next, an LDPC-CC of a time varying period of 3 generated from first sub-matrix $H_1$, second sub-matrix $H_2$ and third sub-matrix $H_3$ is considered.

At this time, if k is designated as a remainder after dividing the values of combinations of degrees of X(D) and P(D), (a1, a2, a3), (b1, b2, b3), (A1, A2, A3), (B1, B2, B3), (α1, α2, α3), (β1, β2, β3), in equations 3-1 to 3-3 by 3, provision is made for one each of remainders 0, 1, and 2 to be included in three-coefficient sets represented as shown above (for example, (a1, a2, a3)), and to hold true with respect to all of the above three-coefficient sets.

For example, if degrees (a1, a2, a3) of X(D) of "check equation #1" are set as (a1, a2, a3)=(6, 5, 4), remainders k after dividing degrees (a1, a2, a3) by 3 are (0, 2, 1), and one each of 0, 1, 2 are included in the three-coefficient set as remainders k. Similarly, if degrees (b1, b2, b3) of P(D) of "check equation #1" are set as (b1, b2, b3)=(3, 2, 1), remainders k after dividing degrees (b1, b2, b3) by 3 are (0, 2, 1), and one each of 0, 1, 2 are included in the three-coefficient set as remainders k. It is assumed that the above condition about "remainder" also holds true for the three-coefficient sets of X(D) and P(D) of "check equation #2" and "check equation #3."

By generating an LDPC-CC as above, it is possible to generate a regular LDPC-CC code in which the row weight is equal in all rows and the column weight is equal in all rows with some exceptions ("exceptions" refer to part in the beginning of a parity check matrix and part in the end of the parity check matrix, where the row weights and columns weights are not the same as row weights and column weights of the other part).

Furthermore, when BP decoding is performed, belief in "check equation #2" and belief in "check equation #3" are propagated accurately to "check equation #1," belief in "check equation #1" and belief in "check equation #3" are propagated accurately to "check equation #2," and belief in "check equation #1" and belief in "check equation #2" are propagated accurately to "check equation #3." Consequently, an LDPC-CC with better received quality can be obtained. This is because, when considered in column units, positions at which "1" is present are arranged so as to propagate belief accurately, as described above.

Figure 17A:
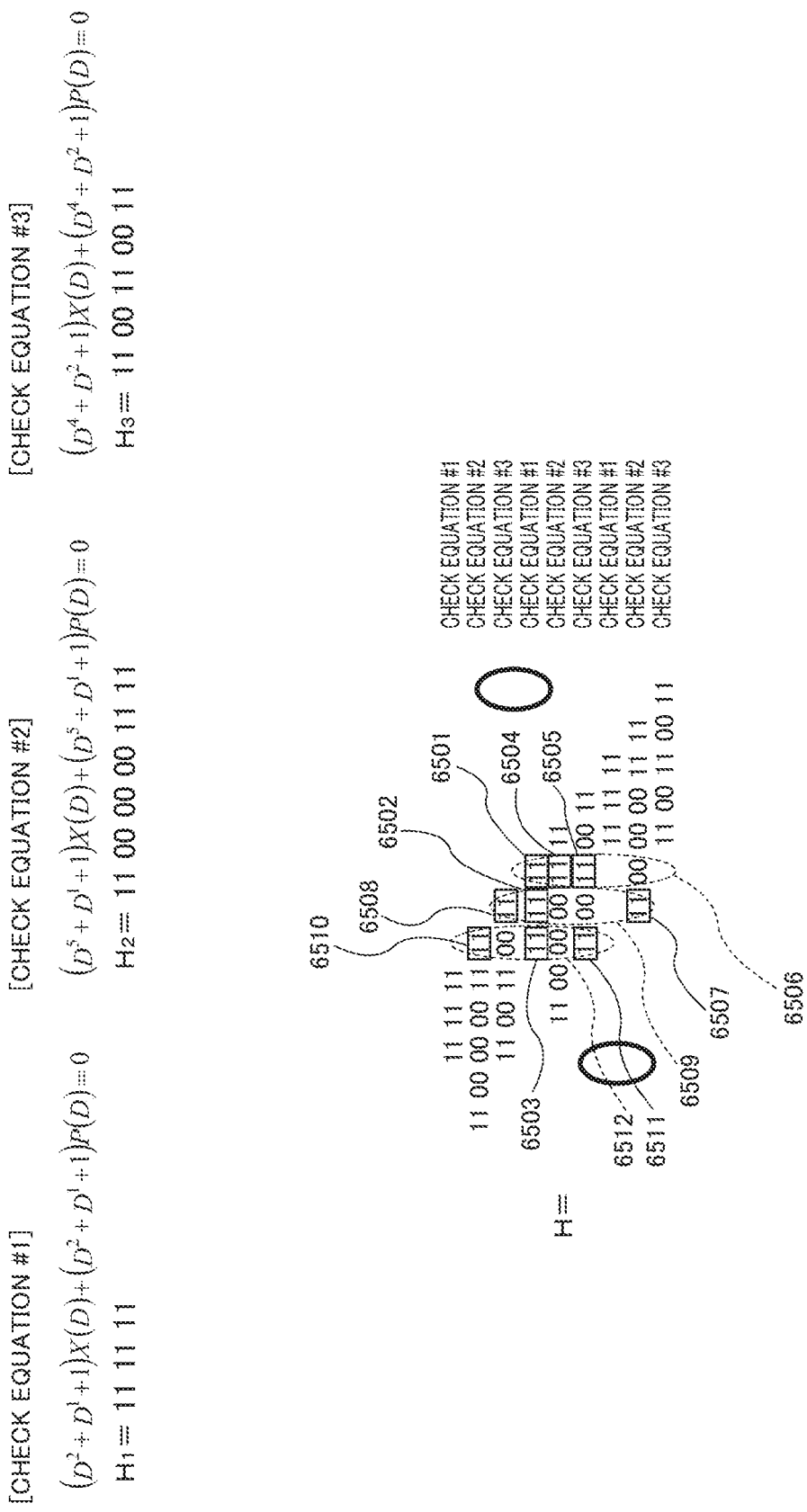
FIG. 17A shows parity check polynomials of an LDPC-CC of a time varying period of 3 and the configuration of parity check matrix H.

Hereinafter, the above-described belief propagation will be described with the accompanying drawings. FIG. 17A shows parity check polynomials of an LDPC-CC of a time varying period of 3 and the configuration of parity check matrix H of this LDPC-CC.

"Check equation #1" illustrates a case in which (a1, a2, a3)=(2, 1, 0) and (b1, b2, b3)=(2, 1, 0) in a parity check polynomial of equation 3-1, and remainders after dividing the coefficients by 3 are as follows: (a1%3, a2%3, a3%3)= (2, 1, 0), (b1%3, b2%3, b3%3)=(2, 1, 0), where "Z %3" represents a remainder after dividing Z by 3.

"Check equation #2" illustrates a case in which (A1, A2, A3)=(5, 1, 0) and (B1, B2, B3)=(5, 1, 0) in a parity check polynomial of equation 3-2, and remainders after dividing the coefficients by 3 are as follows: (A1%3, A2%3, A3%3)= (2, 1, 0), (B1%3, B2%3, B3%3)=(2, 1, 0).

"Check equation #3" illustrates a case in which (α1, α2, α3)=(4, 2, 0) and (β1, β2, β3)=(4, 2, 0) in a parity check polynomial of equation 3-3, and remainders after dividing the coefficients by 3 are as follows: (α1%3, α2%3, α3%3) =(1, 2, 0), (β1%3, β2%3, β3%3)=(1, 2, 0).

Therefore, the example of LDPC-CC of a time varying period of 3 shown in FIG. 17A satisfies the above condition about "remainder," that is, a condition that (a1%3, a2%3, a3%3), (b1%3, b2%3, b3%3), (A1%3, A2%3, A3%3), (B1%3, B2%3, B3%3), (α1%3, α2%3, α3%3) and (β1%3, β2%3, β3%3) are any of the following: (0, 1, 2), (0, 2, 1), (1, 0, 2), (1, 2, 0), (2, 0, 1), (2, 1, 0).

Returning to FIG. 17A again, belief propagation will now be explained. By column computation of column 6506 in BP decoding, for "1" of area 6501 of "check equation #1," belief is propagated from "1" of area 6504 of "check equation #2" and from "1" of area 6505 of "check equation #3." As described above, "1" of area 6501 of "check equation #1" is a coefficient for which a remainder after division by 3 is 0 (a3%3=0 (a3=0) or b3%3=0 (b3=0)). Also, "1" of area 6504 of "check equation #2" is a coefficient for which a remainder after division by 3 is 1 (A2%3=1 (A2=1) or B2%3=1 (B2=1)). Furthermore, "1" of area 6505 of "check equation #3" is a coefficient for which a remainder after division by 3 is 2 (α2%3=2 (α2=2) or β2%3=2 (β2=2)).

Thus, for "1" of area 6501 for which a remainder is 0 in the coefficients of "check equation #1," in column computation of column 6506 in BP decoding, belief is propagated from "1" of area 6504 for which a remainder is 1 in the coefficients of "check equation #2" and from "1" of area 6505 for which a remainder is 2 in the coefficients of "check equation #3."

Similarly, for "1" of area 6502 for which a remainder is 1 in the coefficients of "check equation #1," in column computation of column 6509 in BP decoding, belief is propagated from "1" of area 6507 for which a remainder is 2 in the coefficients of "check equation #2" and from "1" of area 6508 for which a remainder is 0 in the coefficients of "check equation #3."

Similarly, for "1" of area 6503 for which a remainder is 2 in the coefficients of "check equation #1," in column computation of column 6512 in BP decoding, belief is propagated from "1" of area 6510 for which a remainder is 0 in the coefficients of "check equation #2" and from "1" of area 6511 for which a remainder is 1 in the coefficients of "check equation #3."

Figure 17B:
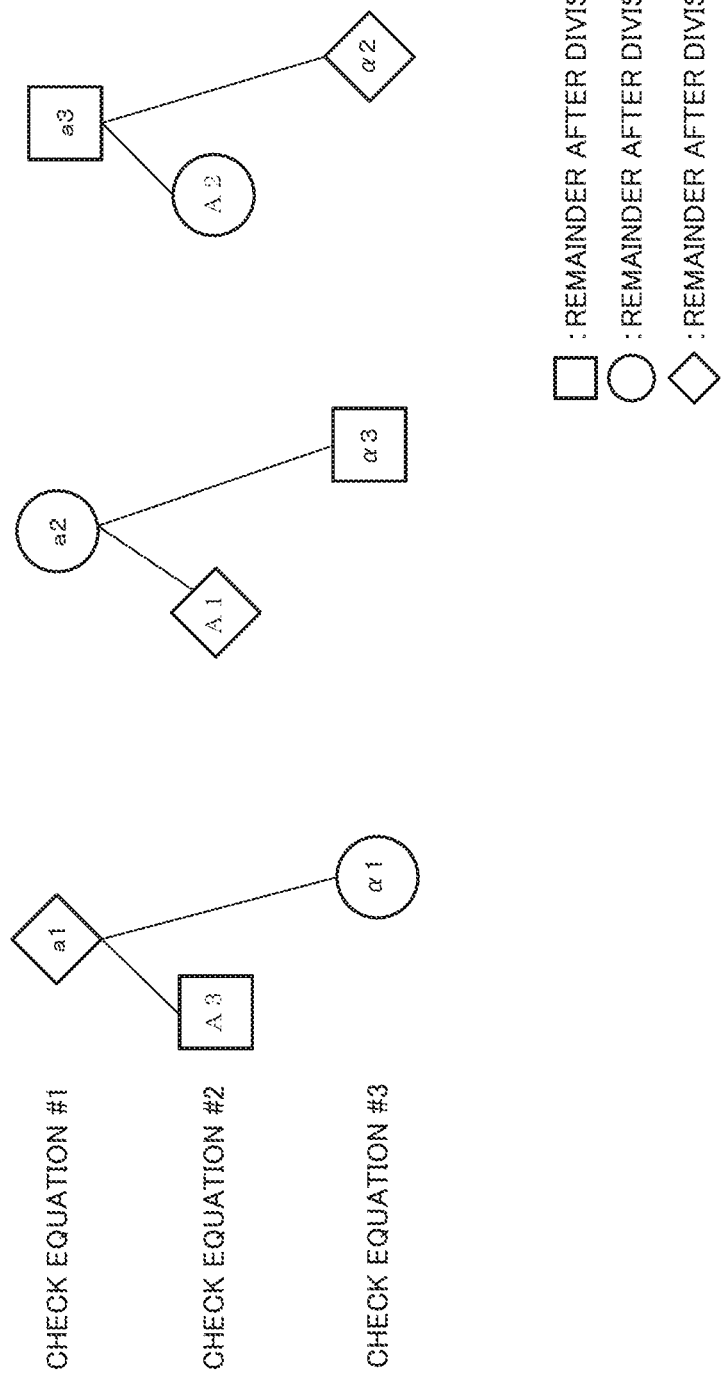
FIG. 17B shows the belief propagation relationship of terms relating to X(D) of "check equation #1" to "check equation #3" in FIG. 17A.

A supplementary explanation of belief propagation will now be given using FIG. 17B. FIG. 17B shows the belief propagation relationship of terms relating to X(D) of "check equation #1" to "check equation #3" in FIG. 17A. "Check equation #1" to "check equation #3" in FIG. 17A illustrate cases in which (a1, a2, a3)=(2, 1, 0), (A1, A2, A3)=(5, 1, 0), and (α1, α2, α3)=(4, 2, 0), in terms relating to X(D) of equations 3-1 to 3-3.

In FIG. 17B, terms (a3, A3, α3) inside squares indicate coefficients for which a remainder after division by 3 is 0. Furthermore, terms (a2, A2, α1) inside circles indicate coefficients for which a remainder after division by 3 is 1. Furthermore, terms (a1, A1, α2) inside diamond-shaped boxes indicate coefficients for which a remainder after division by 3 is 2.

As can be seen from FIG. 17B, for a1 of "check equation #1," belief is propagated from A3 of "check equation #2" and from α1 of "check equation #3" for which remainders after division by 3 differ;

For a2 of "check equation #1," belief is propagated from A1 of "check equation #2" and from α3 of "check equation #3" for which remainders after division by 3 differ. For a3 of "check equation #1," belief is propagated from A2 of "check equation #2" and from α2 of "check equation #3" for which remainders after division by 3 differ. While FIG. 17B shows the belief propagation relationship of terms relating to X(D) of "check equation #1" to "check equation #3," the same applies to terms relating to P(D).

Thus, for "check equation #1," belief is propagated from coefficients for which remainders after division by 3 are 0, 1, and 2 among coefficients of "check equation #2." That is to say, for "check equation #1," belief is propagated from coefficients for which remainders after division by 3 are all different among coefficients of "check equation #2." Therefore, beliefs with low correlation are all propagated to "check equation #1."

Similarly, for "check equation #2," belief is propagated from coefficients for which remainders after division by 3 are 0, 1, and 2 among coefficients of "check equation #1." That is to say, for "check equation #2," belief is propagated from coefficients for which remainders after division by 3 are all different among coefficients of "check equation #1." Also, for "check equation #2," belief is propagated from coefficients for which remainders after division by 3 are 0, 1, and 2 among coefficients of "check equation #3." That is to say, for "check equation #2," belief is propagated from coefficients for which remainders after division by 3 are all different among coefficients of "check equation #3."

Similarly, for "check equation #3," belief is propagated from coefficients for which remainders after division by 3 are 0, 1, and 2 among coefficients of "check equation #1." That is to say, for "check equation #3," belief is propagated from coefficients for which remainders after division by 3 are all different among coefficients of "check equation #1." Also, for "check equation #3," belief is propagated from coefficients for which remainders after division by 3 are 0, 1, and 2 among coefficients of "check equation #2." That is to say, for "check equation #3," belief is propagated from coefficients for which remainders after division by 3 are all different among coefficients of "check equation #2."

By providing for the degrees of parity check polynomials of equations 3-1 to 3-3 to satisfy the above condition about "remainder" in this way, belief is necessarily propagated in all column computations, so that it is possible to perform belief propagation efficiently in all check equations and further increase error correction capability.

A case in which the coding rate is 1/2 has been described above for an LDPC-CC of a time varying period of 3, but the coding rate is not limited to 1/2. A regular LDPC code is also formed and good received quality can be obtained when the coding rate is (n−1)/n (where n is an integer equal to or greater than 2) if the above condition about "remainder" holds true for three-coefficient sets in information $X_1(D)$, $X_2(D), \ldots, X_{n-1}(D)$.

A case in which the coding rate is (n−1)/n (where n is an integer equal to or greater than 2) is described below.

Consider equations 4-1 to 4-3 as parity check polynomials of an LDPC-CC for which the time varying period is 3. At this time, $X_1(D)$, $X_2(D), \ldots, X_{n-1}(D)$ are polynomial representations of data (information) $X_1, X_2, \ldots, X_{n-1}$, and P(D) is a parity polynomial representation. Here, in equations 4-1 to 4-3, parity check polynomials are assumed such that there are three terms in $X_1(D)$, $X_2(D), \ldots, X_{n-1}(D)$ and P(D) respectively.

[4]

$$(D^{a1,1}+D^{a1,2}+D^{a1,3})X_1(D)+(D^{a2,1}+D^{a2,2}+D^{a2,3})X_2(D)+\ldots+(D^{an-1,1}+D^{an-1,2}+D^{an-1,3})X_{n-1}(D)+(D^{b1}+D^{b2}+D^{b3})P(D)=0 \quad \text{(Equation 4-1)}$$

$$(D^{A1,1}+D^{A1,2}+D^{A1,3})X_1(D)+(D^{A2,1}+D^{A2,2}+D^{A2,3})X_2(D)+\ldots+(D^{An-1,1}+D^{An-1,2}+D^{An-1,3})X_{n-1}(D)+(D^{B1}+D^{B2}+D^{B3})P(D)=0 \quad \text{(Equation 4-2)}$$

$$(D^{\alpha1,1}+D^{\alpha1,2}+D^{\alpha1,3})X_1(D)+(D^{\alpha2,1}+D^{\alpha2,2}+D^{\alpha2,3})X_2(D)+\ldots+(D^{\alpha n-1,1}+D^{\alpha n-1,2}+D^{\alpha n-1,3})X_{n-1}(D)+(D^{\beta1}+D^{\beta2}+D^{\beta3})P(D)=0 \quad \text{(Equation 4-3)}$$

In equation 4-1, it is assumed that $a_{i,1}$, $a_{i,2}$, and $a_{i,3}$ (where i=1, 2, . . . , n−1) are integers (where $a_{i,1} \neq a_{i,2} \neq a_{i,3}$). Also, it is assumed that b1, b2 and b3 are integers (where b1≠b2≠b3). A parity check polynomial of equation 4-1 is called "check equation #1." A sub-matrix based on the parity check polynomial of equation 4-1 is designated first sub-matrix $H_1$.

In equation 4-2, it is assumed that $A_{i,1}$, $A_{i,2}$, and $A_{i,3}$ (where i=1, 2, . . . , n−1) are integers (where $A_{i,1} \neq A_{i,2} \neq A_{i,3}$). Also, it is assumed that B1, B2 and B3 are integers (where B1≠B2≠B3). A parity check polynomial of equation 4-2 is called "check equation #2." A sub-matrix based on the parity check polynomial of equation 4-2 is designated second sub-matrix $H_2$.

In equation 4-3, it is assumed that $\beta_{i,1}$, $\beta_{i,2}$, and $\alpha_{i,3}$ (where i=1, 2, . . . , n−1) are integers (where $\alpha_{i,1} \neq \alpha_{i,2} \neq \alpha_{i,3}$). Also, it is assumed that β1, β2 and β3 are integers (where β1≠β2≠β3). A parity check polynomial of equation 4-3 is called "check equation #3." A sub-matrix based on the parity check polynomial of equation 4-3 is designated third sub-matrix $H_3$.

Next, an LDPC-CC of a time varying period of 3 generated from first sub-matrix $H_1$, second sub-matrix $H_2$ and third sub-matrix $H_3$ is considered.

At this time, if k is designated as a remainder after dividing the values of combinations of degrees of $X_1(D)$, $X_2(D), \ldots, X_{n-1}(D)$, and P(D), $(a_{1,1}, a_{1,2}, a_{1,3})$, $(a_{2,1}, a_{2,2}, a_{2,3})$, . . . , $(a_{n-1,1}, a_{n-1,2}, a_{n-1,3})$, (b1, b2, b3), $(A_{1,1}, A_{1,2}, A_{1,3})$, $(A_{2,1}, A_{2,2}, A_{2,3})$, . . . , $(A_{n-1,1}, A_{n-1,2}, A_{n-1,3})$, (B1, B2, B3), $(\alpha_{1,1}, \alpha_{1,2}, \alpha_{1,3})$, $(\alpha_{2,1}, \alpha_{2,2}, \alpha_{2,3})$, . . . , $(\alpha_{n-1,1}, \alpha_{n-1,2}, \alpha_{n-1,3})$, (β1, β2, β3), in equations 4-1 to 4-3 by 3, provision is made for one each of remainders 0, 1, and 2 to be included in three-coefficient sets represented as shown above (for example, $(a_{1,1}, a_{1,2}, a_{1,3})$), and to hold true with respect to all of the above three-coefficient sets.

That is to say, provision is made for $(a_{1,1}\%3, a_{1,2}\%3, a_{1,3}\%3)$, $(a_{2,1}\%3, a_{2,2}\%3, a_{2,3}\%3)$, . . . , $(a_{n-1,1}\%3, a_{n-1,2}\%3, a_{n-1,3}\%3)$, (b1%3, b2%3, b3%3), $(A_{1,1}\%3, A_{1,2}\%3, A_{1,3}\%3)$, $(A_{2,1}\%3, A_{2,2}\%3, A_{2,3}\%3)$, . . . , $(A_{n-1,1}\%3, A_{n-1,2}\%3, A_{n-1,3}\%3)$, (B1%3, B2%3, B3%3), $(\alpha_{1,1}\%3, \alpha_{1,2}\%3, \alpha_{1,3}\%3)$, $(\alpha_{2,1}\%3, \alpha_{2,2}\%3, \alpha_{2,3}\%3)$, . . . , $(\alpha_{n-1,1}\%3, \alpha_{n-1,2}\%3, \alpha_{n-1,3}\%3)$ and (β1%3, β2%3, β3%3) to be any of the following: (0, 1, 2), (0, 2, 1), (1, 0, 2), (1, 2, 0), (2, 0, 1), (2, 1, 0).

Generating an LDPC-CC in this way enables a regular LDPC-CC code to be generated. Furthermore, when BP decoding is performed, belief in "check equation #2" and belief in "check equation #3" are propagated accurately to "check equation #1," belief in "check equation #1" and belief in "check equation #3" are propagated accurately to "check equation #2," and belief in "check equation #1" and belief in "check equation #2" are propagated accurately to "check equation #3." Consequently, an LDPC-CC with better received quality can be obtained in the same way as in the case of a coding rate of 1/2.

It has been confirmed that, as in the case of a time varying period of 3, a code with good characteristics can be found if the condition about "remainder" below is applied to an LDPC-CC for which the time varying period is a multiple of 3 (for example, 6, 9, 12, . . . ). An LDPC-CC of a multiple of a time varying period of 3 with good characteristics is described below. The case of an LDPC-CC of a coding rate of 1/2 and a time varying period of 6 is described below as an example.

Consider equations 5-1 to 5-6 as parity check polynomials of an LDPC-CC for which the time varying period is 6.

[5]

$$(D^{a1,1}+D^{a1,2}+D^{a1,3})X(D)+(D^{b1,1}+D^{b1,2}+D^{b1,3})P(D)=0 \quad \text{(Equation 5-1)}$$

$$(D^{a2,1}+D^{a2,2}+D^{a2,3})X(D)+(D^{b2,1}+D^{b2,2}+D^{b2,3})P(D)=0 \quad \text{(Equation 5-2)}$$

$$(D^{a3,1}+D^{a3,2}+D^{a3,3})X(D)+(D^{b3,1}+D^{b3,2}+D^{b3,3})P(D)=0 \quad \text{(Equation 5-3)}$$

$$(D^{a4,1}+D^{a4,2}+D^{a4,3})X(D)+(D^{b4,1}+D^{b4,2}+D^{b4,3})P(D)=0 \quad \text{(Equation 5-4)}$$

$$(D^{a5,1}+D^{a5,2}+D^{a5,3})X(D)+(D^{b5,1}+D^{b5,2}+D^{b5,3})P(D)=0 \quad \text{(Equation 5-5)}$$

$$(D^{a6,1}+D^{a6,2}+D^{a6,3})X(D)+(D^{b6,1}+D^{b6,2}+D^{b6,3})P(D)=0 \quad \text{(Equation 5-6)}$$

At this time, X(D) is a polynomial representation of data (information) and P(D) is a parity polynomial representation. With an LDPC-CC of a time varying period of 6, if i %6=k (where k=0, 1, 2, 3, 4, 5) is assumed for parity part Pi and information Xi at time i, a parity check polynomial of equation 5-(k+1) holds true. For example, if i=1, i %6=1 (k=1), and therefore equation 6 holds true.

[6]

$$(D^{a2,1}+D^{a2,2}+D^{a2,3})X_1+(D^{b2,1}+D^{b2,2}+D^{b2,3})P_1=0 \quad \text{(Equation 6)}$$

Here, in equations 5-1 to 5-6, parity check polynomials are assumed such that there are three terms in X(D) and P(D) respectively.

In equation 5-1, it is assumed that a1,1, a1,2, a1,3 are integers (where a1,1≠1a1,2≠a1,3). Also, it is assumed that b1,1, b1,2, and b1,3 are integers (where b1, 1≠b1,2≠b1,3). A parity check polynomial of equation 5-1 is called "check equation #1." A sub-matrix based on the parity check polynomial of equation 5-1 is designated first sub-matrix $H_1$.

In equation 5-2, it is assumed that a2,1, a2,2, and a2,3 are integers (where a2,1≠a2,2≠a2,3). Also, it is assumed that b2,1, b2,2, b2,3 are integers (where b2,1≠b2,2≠b2,3). A parity check polynomial of equation 5-2 is called "check equation #2." A sub-matrix based on the parity check polynomial of equation 5-2 is designated second sub-matrix $H_2$.

In equation 5-3, it is assumed that a3,1, a3,2, and a3,3 are integers (where a3,11≠a3,2≠a3,3). Also, it is assumed that b3,1, b3,2, and b3,3 are integers (where b3,1≠b3,2≠b3,3). A parity check polynomial of equation 5-3 is called "check equation #3." A sub-matrix based on the parity check polynomial of equation 5-3 is designated third sub-matrix $H_3$.

In equation 5-4, it is assumed that a4,1, a4,2, and a4,3 are integers (where a4,1≠a4,2≠a4,3). Also, it is assumed that b4,1, b4,2, and b4,3 are integers (where b4,1≠b4,2≠b4,3). A parity check polynomial of equation 5-4 is called "check equation #4." A sub-matrix based on the parity check polynomial of equation 5-4 is designated fourth sub-matrix $H_4$.

In equation 5-5, it is assumed that a5,1, a5,2, and a5,3 are integers (where a5,1≠a5,2≠a5,3). Also, it is assumed that b5,1, b5,2, and b5,3 are integers (where b5,1≠b5,2≠b5,3). A parity check polynomial of equation 5-5 is called "check equation #5." A sub-matrix based on the parity check polynomial of equation 5-5 is designated fifth sub-matrix $H_5$.

In equation 5-6, it is assumed that a6,1, a6,2, and a6,3 are integers (where a6,1≠a6,2≠a6,3). Also, it is assumed that b6,1, b6,2, and b6,3 are integers (where b6,1≠b6,2≠b6,3). A parity check polynomial of equation 5-6 is called "check equation #6." A sub-matrix based on the parity check polynomial of equation 5-6 is designated sixth sub-matrix $H_6$.

Next, an LDPC-CC of a time varying period of 6 is considered that is generated from first sub-matrix $H_1$, second sub-matrix $H_2$, third sub-matrix $H_3$, fourth sub-matrix $H_4$, fifth sub-matrix $H_5$ and sixth sub-matrix $H_6$.

At this time, if k is designated as a remainder after dividing the values of combinations of degrees of X(D) and P(D), (a1,1, a1,2, a1,3), (b1,1, b1,2, b1,3), (a2,1, a2,2, a2,3), (b2,1, b2,2, b2,3), (a3,1, a3,2, a3,3), (b3,1, b3,2, b3,3), (a4,1, a4,2, a4,3), (b4,1, b4,2, b4,3), (a5,1, a5,2, a5,3), (b5,1, b5,2, b5,3), (a6,1, a6,2, a6,3), (b6,1, b6,2, b6,3), in equations 5-1 to 5-6 by 3, provision is made for one each of remainders 0, 1, and 2 to be included in three-coefficient sets represented as shown above (for example, (a1,1, a1,2, a1,3)), and to hold true with respect to all of the above three-coefficient sets. That is to say, provision is made for (a1,1%3, a1,2%3, a1,3%3), (b1,1%3, b1,2%3, b1,3%3), (a2,1%3, a2,2%3, a2,3%3), (b2,1%3, b2,2%3, b2,3%3), (a3,1%3, a3,2%3, a3,3%3), (b3,1%3, b3,2%3, b3,3%3), (a4,1%3, a4,2%3, a4,3%3), (b4,1%3, b4,2%3, b4,3%3), (a5,1%3, a5,2%3, a5,3%3), (b5,1%3, b5,2%3, b5,3%3), (a6,1%3, a6,2%3, a6,3%3) and (b6,1%3, b6,2%3, b6,3%3) to be any of the following: (0, 1, 2), (0, 2, 1), (1, 0, 2), (1, 2, 0), (2, 0, 1), (2, 1, 0).

By generating an LDPC-CC in this way, if an edge is present when a Tanner graph is drawn for "check equation #1," belief in "check equation #2 or check equation #5" and belief in "check equation #3 or check equation #6" are propagated accurately.

Also, if an edge is present when a Tanner graph is drawn for "check equation #2," belief in "check equation #1 or check equation #4" and belief in "check equation #3 or check equation #6" are propagated accurately.

If an edge is present when a Tanner graph is drawn for "check equation #3," belief in "check equation #1 or check equation #4" and belief in "check equation #2 or check equation #5" are propagated accurately. If an edge is present when a Tanner graph is drawn for "check equation #4," belief in "check equation #2 or check equation #5" and belief in "check equation #3 or check equation #6" are propagated accurately.

If an edge is present when a Tanner graph is drawn for "check equation #5," belief in "check equation #1 or check equation #4" and belief in "check equation #3 or check equation #6" are propagated accurately. If an edge is present when a Tanner graph is drawn for "check equation #6," belief in "check equation #1 or check equation #4" and belief in "check equation #2 or check equation #5" are propagated accurately.

Consequently, an LDPC-CC of a time varying period of 6 can maintain better error correction capability in the same way as when the time varying period is 3.

Figure 17C:
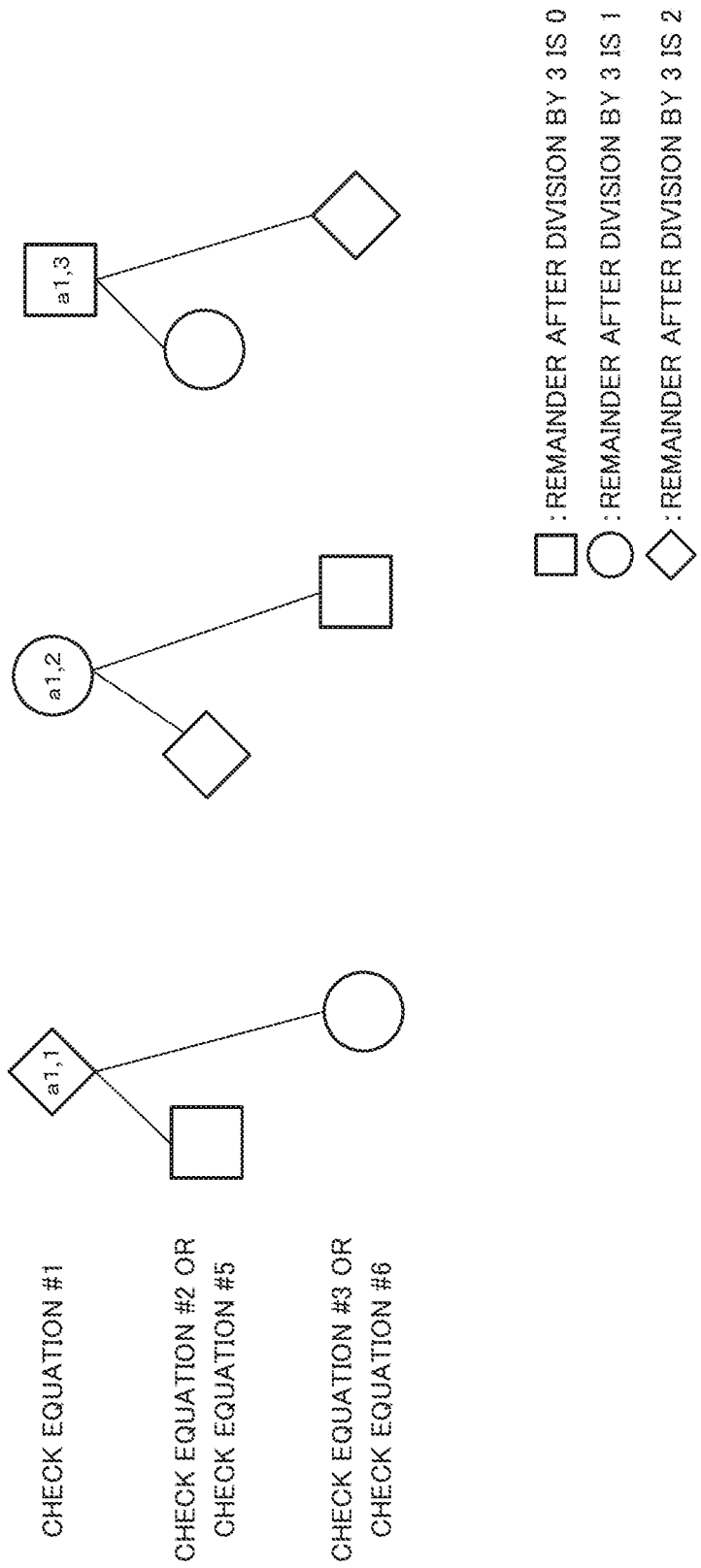
FIG. 17C shows the belief propagation relationship of terms relating to X(D) of "check equation #1" to "check equation #6"

In this regard, belief propagation will be described using FIG. 17C. FIG. 17C shows the belief propagation relationship of terms relating to X(D) of "check equation #1" to "check equation #6." In FIG. 17C, a square indicates a coefficient for which a remainder after division by 3 in ax,y (where x=1, 2, 3, 4, 5, 6, and y=1, 2, 3) is 0.

A circle indicates a coefficient for which a remainder after division by 3 in ax,y (where x=1, 2, 3, 4, 5, 6, and y=1, 2, 3) is 1. A diamond-shaped box indicates a coefficient for which a remainder after division by 3 in ax,y (where x=1, 2, 3, 4, 5, 6, and y=1, 2, 3) is 2.

As can be seen from FIG. 17C, if an edge is present when a Tanner graph is drawn, for a1,1 of "check equation #1," belief is propagated from "check equation #2 or #5" and "check equation #3 or #6" for which remainders after division by 3 differ. Similarly, if an edge is present when a Tanner graph is drawn, for a1,2 of "check equation #1," belief is propagated from "check equation #2 or #5" and "check equation #3 or #6" for which remainders after division by 3 differ.

Similarly, if an edge is present when a Tanner graph is drawn, for a1,3 of "check equation #1," belief is propagated from "check equation #2 or #5" and "check equation #3 or #6" for which remainders after division by 3 differ. While FIG. 17C shows the belief propagation relationship of terms relating to X(D) of "check equation #1" to "check equation #6," the same applies to terms relating to P(D).

Thus, belief is propagated to each node in a Tanner graph of "check equation #1" from coefficient nodes of other than "check equation #1." Therefore, beliefs with low correlation are all propagated to "check equation #1," enabling an improvement in error correction capability to be expected.

In FIG. 17C, "check equation #1" has been focused upon, but a Tanner graph can be drawn in a similar way for "check equation #2" to "check equation #6," and belief is propagated to each node in a Tanner graph of "check equation #K" from coefficient nodes of other than "check equation #K." Therefore, beliefs with low correlation are all propagated to "check equation #K" (where K=2, 3, 4, 5, 6), enabling an improvement in error correction capability to be expected.

By providing for the degrees of parity check polynomials of equations 5-1 to 5-6 to satisfy the above condition about "remainder" in this way, belief can be propagated efficiently in all check equations, and the possibility of being able to further improve error correction capability is increased.

A case in which the coding rate is 1/2 has been described above for an LDPC-CC of a time varying period of 6, but the coding rate is not limited to 1/2. The possibility of obtaining good received quality can be increased when the coding rate is (n−1)/n (where n is an integer equal to or greater than 2) if the above condition about "remainder" holds true for three-coefficient sets in information $X_1(D)$, $X_2(D)$, . . . , $X_{n-1}(D)$.

A case in which the coding rate is (n−1)/n (where n is an integer equal to or greater than 2) is described below.

Consider equations 7-1 to 7-6 as parity check polynomials of an LDPC-CC for which the time varying period is 6.

[7]

$$(D^{a\#1,1,1}+D^{a\#1,1,2}+D^{a\#1,1,3})X_1(D)+(D^{a\#1,2,1}+D^{a\#1,2,2}+D^{a\#1,2,3})X_2(D)+ \ldots +(D^{a\#1,n-1,1}+D^{a\#1,n-1,2}+D^{a\#1,n-1,3})X_{n-1}(D)+(D^{b\#1,1}+D^{b\#1,2}+D^{b\#1,3})P(D)=0 \quad \text{(Equation 7-1)}$$

$$(D^{a\#2,1,1}+D^{a\#2,1,2}+D^{a\#2,1,3})X_1(D)+(D^{a\#2,2,1}+D^{a\#2,2,2}+D^{a\#2,2,3})X_2(D)+ \ldots +(D^{a\#2,n-1,1}+D^{a\#2,n-1,2}+D^{a\#2,n-1,3})X_{n-1}(D)+(D^{b\#2,1}+D^{b\#2,2}+D^{b\#2,3})P(D)=0 \quad \text{(Equation 7-2)}$$

$$(D^{a\#3,1,1}+D^{a\#3,1,2}+D^{a\#3,1,3})X_1(D)+(D^{a\#3,2,1}+D^{a\#3,2,2}+D^{a\#3,2,3})X_2(D)+ \ldots +(D^{a\#3,n-1,1}+D^{a\#3,n-1,2}+D^{a\#3,n-1,3})X_{n-1}(D)+(D^{b\#3,1}+D^{b\#3,2}+D^{b\#3,3})P(D)=0 \quad \text{(Equation 7-3)}$$

$$(D^{a\#4,1,1}+D^{a\#4,1,2}+D^{a\#4,1,3})X_1(D)+(D^{a\#4,2,1}+D^{a\#4,2,2}+D^{a\#4,2,3})X_2(D)+ \ldots +(D^{a\#4,n-1,1}+D^{a\#4,n-1,2}+D^{a\#4,n-1,3})X_{n-1}(D)+(D^{b\#4,1}+D^{b\#4,2}+D^{b\#4,3})P(D)=0 \quad \text{(Equation 7-4)}$$

$$(D^{a\#5,1,1}+D^{a\#5,1,2}+D^{a\#5,1,3})X_1(D)+(D^{a\#5,2,1}+D^{a\#5,2,2}+D^{a\#5,2,3})X_2(D)+ \ldots +(D^{a\#5,n-1,1}+D^{a\#5,n-1,2}+D^{a\#5,n-1,3})X_{n-1}(D)+(D^{b\#5,1}+D^{b\#5,2}+D^{b\#5,3})P(D)=0 \quad \text{(Equation 7-5)}$$

$$(D^{a\#6,1,1}+D^{a\#6,1,2}+D^{a\#6,1,3})X_1(D)+(D^{a\#6,2,1}+D^{a\#6,2,2}+D^{a\#6,2,3})X_2(D)+ \ldots +(D^{a\#6,n-1,1}+D^{a\#6,n-1,2}+D^{a\#6,n-1,3})X_{n-1}(D)+(D^{b\#6,1}+D^{b\#6,2}+D^{b\#6,3})P(D)=0 \quad \text{(Equation 7-6)}$$

At this time, $X_1(D), X_2(D), \ldots, X_{n-1}(D)$ are polynomial representations of data (information) $X_1, X_2, \ldots, X_{n-1}$, and P(D) is a parity polynomial representation. Here, in equations 7-1 to 7-6, parity check polynomials are assumed such that there are three terms in $X_1(D), X_2(D), \ldots, X_{n-1}(D)$, and P(D) respectively. As in the case of the above coding rate of 1/2, and in the case of a time varying period of 3, the possibility of being able to obtain higher error correction capability is increased if the condition below (<Condition #1>) is satisfied in an LDPC-CC of a time varying period of 6 and a coding rate of (n−1)/n (where n is an integer equal to or greater than 2) represented by parity check polynomials of equations 7-1 to 7-6.

In an LDPC-CC of a time varying period of 6 and a coding rate of (n−1)/n (where n is an integer equal to or greater than 2), the parity part and information at time i are represented by Pi and $X_{i,1}, X_{i,2}, \ldots, X_{i,n-1}$ respectively. If i %6=k (where k=0, 1, 2, 3, 4, 5) is assumed at this time, a parity check polynomial of equation 7-(k+1) holds true. For example, if i=8, i %6=2 (k=2), and therefore equation 8 holds true.

[8]

$$(D^{a\#3,1,1}+D^{a\#3,1,2}+D^{a\#3,1,3})X_{8,1}+(D^{a\#3,2,1}+D^{a\#3,2,2}+D^{a\#3,2,3})X_{8,2}+ \ldots +(D^{a\#3,n-1,1}+D^{a\#3,n-1,2}+D^{a\#3,n-1,3})X_{8,n-1}+(D^{b\#3,1}+D^{b\#3,2}+D^{b\#3,3})P_8=0 \quad \text{(Equation 8)}$$

<Condition #1>

In equations 7-1 to 7-6, combinations of degrees of $X_1(D), X_2(D), \ldots, X_{n-1}(D)$, and P(D) satisfy the following condition:

($a_{\#1,1,1}\%3$, $a_{\#1,1,2}\%3$, $a_{\#1,1,3}\%3$), ($a_{\#1,2,1}\%3$, $a_{\#1,2,2}\%3$, $a_{\#1,2,3}\%3$), . . . , ($a_{\#1,k,1}\%3$, $a_{\#1,k,2}\%3$, $a_{\#1,k,3}\%3$), . . . , ($a_{\#1,n-1,1}\%3$, $a_{\#1,n-1,2}\%3$, $a_{\#1,n-1,3}\%3$) and ($b_{\#1,1}\%3$, $b_{\#1,2}\%3$, $b_{\#1,3}\%3$) are any of (0, 1, 2), (0, 2, 1), (1, 0, 2), (1, 2, 0), (2, 0, 1), or (2, 1, 0) (where k=1, 2, 3, . . . , n−1);

($a_{\#2,1,1}\%3$, $a_{\#2,1,2}\%3$, $a_{\#2,1,3}\%3$), ($a_{\#2,2,1}\%3$, $a_{\#2,2,2}\%3$, $a_{\#2,2,3}\%3$), . . . , ($a_{\#2,k,1}\%3$, $a_{\#2,k,2}\%3$, $a_{\#2,k,3}\%3$), . . . , ($a_{\#2,n-1,1}\%3$, $a_{\#2,n-1,2}\%3$, $a_{\#2,n-1,3}\%3$) and ($b_{\#2,1}\%3$, $b_{\#2,2}\%3$, $b_{\#2,3}\%3$) are any of (0, 1, 2), (0, 2, 1), (1, 0, 2), (1, 2, 0), (2, 0, 1), or (2, 1, 0) (where k=1, 2, 3, . . . , n−1);

($a_{\#3,1,1}\%3$, $a_{\#3,1,2}\%3$, $a_{\#3,1,3}\%3$), ($a_{\#3,2,1}\%3$, $a_{\#3,2,2}\%3$, $a_{\#3,2,3}\%3$), . . . , ($a_{\#3,k,1}\%3$, $a_{\#3,k,2}\%3$, $a_{\#3,k,3}\%3$), . . . , ($a_{\#3,n-1,1}\%3$, $a_{\#3,n-1,2}\%3$, $a_{\#3,n-1,3}\%3$) and ($b_{\#3,1}\%3$, $b_{\#3,2}\%3$, $b_{\#3,3}\%3$) are any of (0, 1, 2), (0, 2, 1), (1, 0, 2), (1, 2, 0), (2, 0, 1), or (2, 1, 0) (where k=1, 2, 3, . . . , n−1);

($a_{\#4,1,1}\%3$, $a_{\#4,1,2}\%3$, $a_{\#4,1,3}\%3$), ($a_{\#4,2,1}\%3$, $a_{\#4,2,2}\%3$, $a_{\#4,2,3}\%3$), . . . , ($a_{\#4,k,1}\%3$, $a_{\#4,k,2}\%3$, $a_{\#4,k,3}\%3$), . . . , ($a_{\#4,n-1,1}\%3$, $a_{\#4,n-1,2}\%3$, $a_{\#4,n-1,3}\%3$) and ($b_{\#4,1}\%3$, $b_{\#4,2}\%3$, $b_{\#4,3}\%3$) are any of (0, 1, 2), (0, 2, 1), (1, 0, 2), (1, 2, 0), (2, 0, 1), or (2, 1, 0) (where k=1, 2, 3, . . . , n−1);

($a_{\#5,1,1}$%3, $a_{\#5,1,2}$%3, $a_{\#5,1,3}$%3), ($a_{\#5,2,1}$%3, $a_{\#5,2,2}$%3, $a_{\#5,2,3}$%3), ..., ($a_{\#5,k,1}$%3, $a_{\#5,k,2}$%3, $a_{\#5,k,3}$%3), ..., ($a_{\#5,n-1,1}$%3, $a_{\#5,n-1,2}$%3, $a_{\#5,n-1,3}$%3) and ($b_{\#5,1}$%3, $b_{\#5,2}$%3, $b_{\#5,3}$%3) are any of (0, 1, 2), (0, 2, 1), (1, 0, 2), (1, 2, 0), (2, 0, 1), or (2, 1, 0) (where k=1, 2, 3, ..., n−1); and ($a_{\#6,1,1}$%3, $a_{\#6,1,2}$%3, $a_{\#6,1,3}$%3), ($a_{\#6,2,1}$%3, $a_{\#6,2,2}$%3, $a_{\#6,2,3}$%3), ..., ($a_{\#6,k,1}$%3, $a_{\#6,k,2}$%3, $a_{\#6,k,3}$%3), ..., ($a_{\#6,n-1,1}$%3, $a_{\#6,n-1,2}$%3, $a_{\#6,n-1,3}$%3) and ($b_{\#6,1}$%3, $b_{\#6,2}$%3, $b_{\#6,3}$%3) are any of (0, 1, 2), (0, 2, 1), (1, 0, 2), (1, 2, 0), (2, 0, 1), or (2, 1, 0) (where k=1, 2, 3, ..., n−1).

In the above description, a code having high error correction capability has been described for an LDPC-CC of a time varying period of 6, but a code having high error correction capability can also be generated when an LDPC-CC of a time varying period of 3g (where g=1, 2, 3, 4, ...) (that is, an LDPC-CC for which the time varying period is a multiple of 3) is created in the same way as with the design method for an LDPC-CC of a time varying period of 3 or 6. A configuration method for this code is described in detail below.

Consider equations 9-1 to 9-3g as parity check polynomials of an LDPC-CC for which the time varying period is 3g (where g=1, 2, 3, 4, ...) and the coding rate is (n−1)/n (where n is an integer equal to or greater than 2).

[9]

$$(D^{a\#1,1,1} + D^{a\#1,1,2} + D^{a\#1,1,3})X_1(D) + \qquad \text{(Equation 9-1)}$$
$$(D^{a\#1,2,1} + D^{a\#1,2,2} + D^{a\#1,2,3})X_2(D) + \cdots +$$
$$(D^{a\#1,n-1,1} + D^{a\#1,n-1,2} + D^{a\#1,n-1,3})X_{n-1}(D) +$$
$$(D^{b\#1,1} + D^{b\#1,2} + D^{b\#1,3})P(D) = 0$$

$$(D^{a\#2,1,1} + D^{a\#2,1,2} + D^{a\#2,1,3})X_1(D) + \qquad \text{(Equation 9-2)}$$
$$(D^{a\#2,2,1} + D^{a\#2,2,2} + D^{a\#2,2,3})X_2(D) + \cdots +$$
$$(D^{a\#2,n-1,1} + D^{a\#2,n-1,2} + D^{a\#2,n-1,3})X_{n-1}(D) +$$
$$(D^{b\#2,1} + D^{b\#2,2} + D^{b\#2,3})P(D) = 0$$

$$(D^{a\#3,1,1} + D^{a\#3,1,2} + D^{a\#3,1,3})X_1(D) + \qquad \text{(Equation 9-3)}$$
$$(D^{a\#3,2,1} + D^{a\#3,2,2} + D^{a\#3,2,3})X_2(D) + \cdots +$$
$$(D^{a\#3,n-1,1} + D^{a\#3,n-1,2} + D^{a\#3,n-1,3})X_{n-1}(D) +$$
$$(D^{b\#3,1} + D^{b\#3,2} + D^{b\#3,3})P(D) = 0$$

$$\vdots$$

$$(D^{a\#k,1,1} + D^{a\#k,1,2} + D^{a\#k,1,3})X_1(D) + \qquad \text{(Equation 9-k)}$$
$$(D^{a\#k,2,1} + D^{a\#k,2,2} + D^{a\#k,2,3})X_2(D) + \cdots +$$
$$(D^{a\#k,n-1,1} + D^{a\#k,n-1,2} + D^{a\#k,n-1,3})X_{n-1}(D) +$$
$$(D^{b\#k,1} + D^{b\#k,2} + D^{b\#k,3})P(D) = 0$$

$$\vdots$$

$$(D^{a\#3g-2,1,1} + D^{a\#3g-2,1,2} + D^{a\#3g-2,1,3})X_1(D) + \qquad \text{(Equation 9-(3g-2))}$$
$$(D^{a\#3g-2,2,1} + D^{a\#3g-2,2,2} + D^{a\#3g-2,2,3})X_2(D) +$$
$$\cdots + (D^{a\#3g-2,n-1,1} + D^{a\#3g-2,n-1,2} + D^{a\#3g-2,n-1,3})X_{n-1}(D) +$$
$$(D^{b\#3g-2,1} + D^{b\#3g-2,2} + D^{b\#3g-2,3})P(D) = 0$$

$$(D^{a\#3g-1,1,1} + D^{a\#3g-1,1,2} + D^{a\#3g-1,1,3})X_1(D) + \qquad \text{(Equation 9-(3g-1))}$$
$$(D^{a\#3g-1,2,1} + D^{a\#3g-1,2,2} + D^{a\#3g-1,2,3})X_2(D) +$$
$$\cdots + (D^{a\#3g-1,n-1,1} + D^{a\#3g-1,n-1,2} + D^{a\#3g-1,n-1,3})X_{n-1}(D) +$$
$$(D^{b\#3g-1,1} + D^{b\#3g-1,2} + D^{b\#3g-1,3})P(D) = 0$$

$$(D^{a\#3g,1,1} + D^{a\#3g,1,2} + D^{a\#3g,1,3})X_1(D) + \qquad \text{(Equation 9-3g)}$$
$$(D^{a\#3g,2,1} + D^{a\#3g,2,2} + D^{a\#3g,2,3})X_2(D) + \cdots +$$
$$(D^{a\#3g,n-1,1} + D^{a\#3g,n-1,2} + D^{a\#3g,n-1,3})X_{n-1}(D) +$$
$$(D^{b\#3g,1} + D^{b\#3g,2} + D^{b\#3g,3})P(D) = 0$$

At this time, $X_1(D)$, $X_2(D)$, ..., $X_{n-1}(D)$ are polynomial representations of data (information) $X_1$, $X_2$, ..., $X_{n-1}$, and P(D) is a parity polynomial representation. Here, in equations 9-1 to 9-3g, parity check polynomials are assumed such that there are three terms in $X_1(D)$, $X_2(D)$, ..., $X_{n-1}(D)$, and P(D) respectively.

As in the case of an LDPC-CC of a time varying period of 3 and an LDPC-CC of a time varying period of 6, the possibility of being able to obtain higher error correction capability is increased if the condition below (<Condition #2>) is satisfied in an LDPC-CC of a time varying period of 3g and a coding rate of (n−1)/n (where n is an integer equal to or greater than 2) represented by parity check polynomials of equations 9-1 to 9-3g.

In an LDPC-CC of a time varying period of 3g and a coding rate of (n−1)/n (where n is an integer equal to or greater than 2), the parity part and information at time i are represented by $P_i$ and $X_{i,1}$, $X_{i,2}$, ..., $X_{i,n-1}$ respectively. If i %3g=k (where k=0, 1, 2, ... 3g−1) is assumed at this time, a parity check polynomial of equation 9-(k+1) holds true. For example, if i=2, i %3g=2 (k=2), and therefore equation 10 holds true.

[10]

$$(D^{a\#3,1,1}+D^{a\#3,1,2}+D^{a\#3,1,3})X_{2,1}+(D^{a\#3,2,1}+D^{a\#3,2,2}+D^{a\#3,2,3})X_{2,2}+ \ldots +(D^{a\#3,n-1,1}+D^{a\#3,n-1,2}+D^{a\#3,n-1,3})X_{2,n-1}+(D^{b\#3,1}+D^{b\#3,2}+D^{b\#3,3})P_2=0 \qquad \text{(Equation 10)}$$

In equations 9-1 to 9-3g, it is assumed that $a_{\#k,p,1}$, $a_{\#k,p,2}$ and $a_{\#k,p,3}$ are integers (where $a_{\#k,p,1} \neq a_{\#k,p,2} \neq a_{\#k,p,3}$) (where k=1, 2, 3, ..., 3g, and p=1, 2, 3, ..., n−1). Also, it is assumed that $b_{\#k,1}$, $b_{\#k,2}$ and $b_{\#k,3}$ are integers (where $b_{\#k,1} \neq b_{\#k,2} \neq b_{\#k,3}$). A parity check polynomial of equation 9-k (where k=1, 2, 3, ..., 3g) is called "check equation #k." A sub-matrix based on the parity check polynomial of equation 9-k is designated k-th sub-matrix $H_k$. Next, an LDPC-CC of a time varying period of 3g is considered that is generated from first sub-matrix $H_1$, second sub-matrix $H_2$, third sub-matrix $H_3$, ..., and 3g-th sub-matrix $H_{3g}$.

<Condition #2>

In equations 9-1 to 9-3g, combinations of degrees of $X_1(D)$, $X_2(D)$, ..., $X_{n-1}(D)$, and P(D) satisfy the following condition:

($a_{\#1,1,1}$%3, $a_{\#1,1,2}$%3, $a_{\#1,1,3}$%3), ($a_{\#1,2,1}$%3, $a_{\#1,2,2}$%3, $a_{\#1,2,3}$%3), ..., ($a_{\#1,p,1}$%3, $a_{\#1,p,2}$%3, $a_{\#1,p,3}$%3), ..., ($a_{\#1,n-1,1}$%3, $a_{\#1,n-1,2}$%3, $a_{\#1,n-1,3}$%3) and ($b_{\#1,1}$%3, $b_{\#1,2}$%3, $b_{\#1,3}$%3) are any of (0, 1, 2), (0, 2, 1), (1, 0, 2), (1, 2, 0), (2, 0, 1), or (2, 1, 0) (where p=1, 2, 3, ..., n−1);

($a_{\#2,1,1}$%3, $a_{\#2,1,2}$%3, $a_{\#2,1,3}$%3), ($a_{\#2,2,1}$%3, $a_{\#2,2,2}$%3, $a_{\#2,2,3}$%3), ..., ($a_{\#2,p,1}$%3, $a_{\#2,p,2}$%3, $a_{\#2,p,3}$%3), ..., ($a_{\#2,n-1,1}$%3, $a_{\#2,n-1,2}$%3, $a_{\#2,n-1,3}$%3) and ($b_{\#2,1}$%3, $b_{\#2,2}$%3, $b_{\#2,3}$%3) are any of (0, 1, 2), (0, 2, 1), (1, 0, 2), (1, 2, 0), (2, 0, 1), or (2, 1, 0) (where p=1, 2, 3, ..., n−1);

($a_{\#3,1,1}$%3, $a_{\#3,1,2}$%3, $a_{\#3,1,3}$%3), ($a_{\#3,2,1}$%3, $a_{\#3,2,2}$%3, $a_{\#3,2,3}$%3), ..., ($a_{\#3,p,1}$%3, $a_{\#3,p,2}$%3, $a_{\#3,p,3}$%3), ..., ($a_{\#3,n-1,1}$%3, $a_{\#3,n-1,2}$%3, $a_{\#3,n-1,3}$%3) and ($b_{\#3,1}$%3, $b_{\#3,2}$%3, $b_{\#3,3}$%3) are any of (0, 1, 2), (0, 2, 1), (1, 0, 2), (1, 2, 0), (2, 0, 1), or (2, 1, 0) (where p=1, 2, 3, . . . , n–1);

●

●

●

$(a_{\#k,1,1}\%3, a_{\#k,1,2}\%3, a_{\#k,1,3}\%3), (a_{\#k,2,1}\%3, a_{\#k,2,2}\%3, a_{\#k,2,3}\%3), \ldots , (a_{\#k,p,1}\%3, a_{\#k,p,2}\%3, a_{\#k,p,3}\%3), \ldots , (a_{\#k,n-1,1}\%3, a_{\#k,n-1,2}\%3, a_{\#k,n-1,3}\%3)$ and $(b_{\#k,1}\%3, b_{\#k,2}\%3, b_{\#k,3}\%3)$ are any of (0, 1, 2), (0, 2, 1), (1, 0, 2), (1, 2, 0), (2, 0, 1), or (2, 1, 0) (where p=1, 2, 3, . . . , n–1) (where k=1, 2, 3, . . . , 3g);

●

●

●

$(a_{\#3g-2,1,1}\%3, a_{\#3g-2,1,2}\%3, a_{\#3g-2,1,3}\%3), (a_{\#3g-2,2,1}\%3, a_{\#3g-2, 2, 2}\%3, a_{\#3g-2,2,3}\%3), \ldots , (a_{\#3g-2,p,1}\%3, a_{\#3g-2,p,2}\%3, a_{\#3g-2,p,3}\%3), \ldots , (a_{\#3g-2,n-1,1}\%3, a_{\#3g-2,n-1,2}\%3, a_{\#3g-2,n-1,3}\%3)$, and $(b_{\#3g-2,1}\%3, b_{\#3g-2,2}\%3, b_{\#3g-2,3}\%3)$ are any of (0, 1, 2), (0, 2, 1), (1, 0, 2), (1, 2, 0), (2, 0, 1), or (2, 1, 0) (where p=1, 2, 3, . . . , n–1);

$(a_{\#3g-1, 1, 1}\%3, a_{\#3g-1,1,2}\%3, a_{\#3g-1,1,3}\%3), (a_{\#3g-1,2,1}\%3, a_{\#3g-1,2,2}\%3, a_{\#3g-1,2,3}\%3), \ldots , (a_{\#3g-1,p,1}\%3, a_{\#3g-1,p,2}\%3, a_{\#3g-1,p,3}\%3), \ldots , (a_{\#3g-1,n-1,1}\%3, a_{\#3g-1,n-1,2}\%3, a_{\#3g-1,n-1,3}\%3)$ and $(b_{\#3g-1,1}\%3, b_{\#3g-1,2}\%3, b_{\#3g-1,3}\%3)$ are any of (0, 1, 2), (0, 2, 1), (1, 0, 2), (1, 2, 0), (2, 0, 1), or (2, 1, 0) (where p=1, 2, 3, . . . , n–1); and $(a_{\#3g,1,1}\%3, a_{\#3g,1,2}\%3, a_{\#3g,1,3}\%3), (a_{\#3g,2,1}\%3, a_{\#3g,2,2}\%3, a_{\#3g,2,3}\%3), \ldots , (a_{\#3g,p,1}\%3, a_{\#3g,p,2}\%3, a_{\#3g,p,3}\%3), \ldots , (a_{\#3g,n-1,1}\%3, a_{\#3g,n-1,2}\%3, a_{\#3g,n-1,3}\%3)$ and $(b_{\#3g,1}3, b_{\#3g,2}\%3, b_{\#3g,3}\%3)$ are any of (0, 1, 2), (0, 2, 1), (1, 0, 2), (1, 2, 0), (2, 0, 1), or (2, 1, 0) (where p=1, 2, 3, . . . , n–1).

Taking ease of performing encoding into account, it is desirable for one "0" to be present among the three items $(b_{\#k,1}\%3, b_{\#k,2}\%3, b_{\#k,3}\%3)$ (where k=1, 2, . . . , 3g) in equations 9-1 to 9-3g. This is because of a feature that, if $D^0=1$ holds true and $b_{\#k,1}$, $b_{\#k,2}$ and $b_{\#k,3}$ are integers equal to or greater than 0 at this time, parity part P can be found sequentially.

Also, in order to provide relevancy between parity bits and data bits of the same point in time, and to facilitate a search for a code having high correction capability, it is desirable for:

one "0" to be present among the three items $(a_{\#k,1,1}\%3, a_{\#k,1,2}\%3, a_{\#k,1,3}\%3)$;

one "0" to be present among the three items $(a_{\#k,2,1}\%3, a_{\#k,2,2}\%3, a_{\#k,2,3}\%3)$;

●

●

● one "0" to be present among the three items $(a_{\#k, p,1}\%3, a_{\#k, p,2}\%3, a_{\#k, p,3}\%3)$;

●

●

● one "0" to be present among the three items $(a_{\#k,n-1,1}\%3, a_{\#k, n-1,2}\%3, a_{\#k, n-1,3}\%3)$, (where k=1, 2, . . . , 3g).

Next, an LDPC-CC of a time varying period of 3g (where g=2, 3, 4, 5, . . . ) that takes ease of encoding into account is considered. At this time, if the coding rate is (n−1)/n (where n is an integer equal to or greater than 2), LDPC-CC parity check polynomials can be represented as shown below.

[11]

$$(D^{a\#1,1,1} + D^{a\#1,1,2} + D^{a\#1,1,3})X_1(D) + \\ (D^{a\#1,2,1} + D^{a\#1,2,2} + D^{a\#1,2,3})X_2(D) + \cdots + \\ (D^{a\#1,n-1,1} + D^{a\#1,n-1,2} + D^{a\#1,n-1,3})X_{n-1}(D) + \\ (D^{b\#1,1} + D^{b\#1,2} + 1)P(D) = 0$$ (Equation 11-1)

$$(D^{a\#2,1,1} + D^{a\#2,1,2} + D^{a\#2,1,3})X_1(D) + \\ (D^{a\#2,2,1} + D^{a\#2,2,2} + D^{a\#2,2,3})X_2(D) + \cdots + \\ (D^{a\#2,n-1,1} + D^{a\#2,n-1,2} + D^{a\#2,n-1,3})X_{n-1}(D) + \\ (D^{b\#2,1} + D^{b\#2,2} + 1)P(D) = 0$$ (Equation 11-2)

$$(D^{a\#3,1,1} + D^{a\#3,1,2} + D^{a\#3,1,3})X_1(D) + \\ (D^{a\#3,2,1} + D^{a\#3,2,2} + D^{a\#3,2,3})X_2(D) + \cdots + \\ (D^{a\#3,n-1,1} + D^{a\#3,n-1,2} + D^{a\#3,n-1,3})X_{n-1}(D) + \\ (D^{b\#3,1} + D^{b\#3,2} + 1)P(D) = 0$$ (Equation 11-3)

$$\vdots$$

$$(D^{a\#k,1,1} + D^{a\#k,1,2} + D^{a\#k,1,3})X_1(D) + \\ (D^{a\#k,2,1} + D^{a\#k,2,2} + D^{a\#k,2,3})X_2(D) + \cdots + \\ (D^{a\#k,n-1,1} + D^{a\#k,n-1,2} + D^{a\#k,n-1,3})X_{n-1}(D) + \\ (D^{b\#k,1} + D^{b\#k,2} + 1)P(D) = 0$$ (Equation 11-k)

$$\vdots$$

$$(D^{a\#3g-2,1,1} + D^{a\#3g-2,1,2} + D^{a\#3g-2,1,3})X_1(D) + \\ (D^{a\#3g-2,2,1} + D^{a\#3g-2,2,2} + D^{a\#3g-2,2,3})X_2(D) + \\ \cdots + \\ (D^{a\#3g-2,n-1,1} + D^{a\#3g-2,n-1,2} + D^{a\#3g-2,n-1,3}) \\ X_{n-1}(D) + (D^{b\#3g-2,1} + D^{b\#3g-2,2} + 1)P(D) = 0$$ (Equation 11-(3g-2))

$$(D^{a\#3g-1,1,1} + D^{a\#3g-1,1,2} + D^{a\#3g-1,1,3})X_1(D) + \\ (D^{a\#3g-1,2,1} + D^{a\#3g-1,2,2} + D^{a\#3g-1,2,3})X_2(D) + \\ \cdots + (D^{a\#3g-1,n-1,1} + D^{a\#3g-1,n-1,2} + 1)X_{n-1}(D) + \\ (D^{b\#3g-1,1} + D^{b\#3g-1,2} + 1)P(D) = 0$$ (Equation 11-(3g-1))

$$(D^{a\#3g,1,1} + D^{a\#3g,1,2} + D^{a\#3g,1,3})X_1(D) + \\ (D^{a\#3g,2,1} + D^{a\#3g,2,2} + D^{a\#3g,2,3})X_2(D) + \cdots + \\ (D^{a\#3g,n-1,1} + D^{a\#3g,n-1,2} + D^{a\#3g,n-1,3})X_{n-1}(D) + \\ (D^{b\#3g,1} + D^{b\#3g,2} + 1)P(D) = 0$$ (Equation 11-3g)

At this time, $X_1(D), X_2(D), \ldots , X_{n-1}(D)$ are polynomial representations of data (information) $X_1, X_2, \ldots , X_{n-1}$, and P(D) is a parity polynomial representation. Here, in equations 11-1 to 11-3g, parity check polynomials are assumed such that there are three terms in $X_1, X_2, \ldots , X_{n-1}(D)$, and P(D) respectively. In an LDPC-CC of a time varying period of 3g and a coding rate of (n−1)/n (where n is an integer equal to or greater than 2), the parity part and information at time i are represented by Pi and $X_{i,1}, X_{i, 2}, \ldots , X_{i,n-1}$ respectively. If i %3g=k (where k=0, 1, 2, . . . , 3g−1) is assumed at this time, a parity check polynomial of equation 11-(k+1) holds true. For example, if i=2, i %3=2 (k=2), and therefore equation 12 holds true.

[12]

$$(D^{a\#3,1,1}+D^{a\#3,1,2}+D^{a\#3,1,3})X_{2,1}+(D^{a\#3,2,1}+D^{a\#3,2,2}+D^{a\#3,2,3})X_{2,2}+ \ldots +(D^{a\#3,n-1,1}+D^{a\#3,n-1,2}+D^{a\#3,n-1,3})X_{2,n-1}+(D^{b\#3,1}+D^{b\#3,2}+D^{b\#3,3})P_2=0$$ (Equation 12)

If <Condition #3> and <Condition #4> are satisfied at this time, the possibility of being able to create a code having higher error correction capability is increased.

<Condition #3>

In equations 11-1 to 11-3g, combinations of degrees of $X_1(D), X_2(D), \ldots X_{n-1}(D)$, and $P(D)$ satisfy the following condition:

$(a_{\#1,1,1}\%3, a_{\#1,1,2}\%3, a_{\#1,1,3}\%3), (a_{\#1,2,1}\%3, a_{\#1,2,2}\%3, a_{\#1,2,3}\%3), \ldots, (a_{\#1,p,1}\%3, a_{\#1,p,2}\%3, a_{\#1,p,3}\%3), \ldots,$ and $(a_{\#1,n-1,1}\%3, a_{\#1,n-1,2}\%3, a_{\#1,n-1,3}\%3)$ are any of $(0, 1, 2), (0, 2, 1), (1, 0, 2), (1, 2, 0), (2, 0, 1),$ or $(2, 1, 0)$ (where p=1, 2, 3, . . . , n−1);

$(a_{\#2,1,1}\%3, a_{\#2,1,2}\%3, a_{\#2,1,3}\%3), (a_{\#2,2,1}\%3, a_{\#2,2,2}\%3, a_{\#2,2,3}\%3), \ldots, (a_{\#2,p,1}\%3, a_{\#2,p,2}\%3, a_{\#2,p,3}\%3), \ldots,$ and $(a_{\#2,n-1,1}\%3, a_{\#2,n-1,2}\%3, a_{\#2,n-1,3}\%3)$ are any of $(0, 1, 2), (0, 2, 1), (1, 0, 2), (1, 2, 0), (2, 0, 1),$ or $(2, 1, 0)$ (where p=1, 2, 3, . . . , n−1);

$(a_{\#3,1,1}\%3, a_{\#3,1,2}\%3, a_{\#3,1,3}\%3), (a_{\#3,2,1}\%3, a_{\#3,2,2}\%3, a_{\#3,2,3}\%3), \ldots, (a_{\#3,p,1}\%3, a_{\#3,p,2}\%3, a_{\#3,p,3}\%3), \ldots,$ and $(a_{\#3,n-1,1}\%3, a_{\#3,n-1,2}\%3, a_{\#3,n-1,3}\%3)$ are any of $(0, 1, 2), (0, 2, 1), (1, 0, 2), (1, 2, 0), (2, 0, 1),$ or $(2, 1, 0)$ (where p=1, 2, 3, . . . , n−1);

•

•

•

$(a_{\#k,1,1}\%3, a_{\#k,1,2}\%3, a_{\#k,1,3}\%3), (a_{\#k,2,1}\%3, a_{\#k,2,2}\%3, a_{\#k,2,3}\%3), \ldots, (a_{\#k,p,1}\%3, a_{\#k,p,2}\%3, a_{\#k,p,3}\%3), \ldots,$ and $(a_{\#k,n-1,1}\%3, a_{\#k,n-1,2}\%3, a_{\#k,n-1,3}\%3)$ are any of $(0, 1, 2), (0, 2, 1), (1, 0, 2), (1, 2, 0), (2, 0, 1),$ or $(2, 1, 0)$ (where p=1, 2, 3, . . . , n−1, and k=1, 2, 3, . . . , 3g);

•

•

•

$(a_{\#3g-2,1,1}\%3, a_{\#3g-2,1,2}\%3, a_{\#3g-2,1,3}\%3), (a_{\#3g-2,2,1}\%3, a_{\#3g-2,2,2}\%3, a_{\#3g-2,2,3}\%3), \ldots, (a_{\#3g-2,p,1}\%3, a_{\#3g-2,p,2}\%3, a_{\#3g-2,p,3}\%3), \ldots,$ and $(a_{\#3g-2,n-1,1}\%3, a_{\#3g-2,n-1,2}\%3, a_{\#3g-2,n-1,3}\%3)$ are any of $(0, 1, 2), (0, 2, 1), (1, 0, 2), (1, 2, 0), (2, 0, 1),$ or $(2, 1, 0)$ (where p=1, 2, 3, . . . n−1);

$(a_{\#3g-1,1,1}\%3, a_{\#3g-1,1,2}\%3, a_{\#3g-1,1,3}\%3), (a_{\#3g-1,2,1}\%3, a_{\#3g-1,2,2}\%3, a_{\#3g-1,2,3}\%3), \ldots, (a_{\#3g-1,p,1}\%3, a_{\#3g-1,p,2}\%3, a_{\#3g-1,p,3}\%3), \ldots,$ and $(a_{\#3g-1,n-1,1}\%3, a_{\#3g-1,n-1,2}\%3, a_{\#3g-1,n-1,3}\%3)$ are any of $(0, 1, 2), (0, 2, 1), (1, 0, 2), (1, 2, 0), (2, 0, 1),$ or $(2, 1, 0)$ (where p=1, 2, 3, . . . n−1); and $(a_{\#3g,1,1}\%3, a_{\#3g,1,2}\%3, a_{\#3g,1,3}\%3), (a_{\#3g,2,1}\%3, a_{\#3g,2,2}\%3, a_{\#3g,2,3}\%3), \ldots, (a_{\#3g,p,1}\%3, a_{\#3g,p,2}\%3, a_{\#3g,p,3}\%3), \ldots,$ and $(a_{\#3g,n-1,1}\%3, a_{\#3g,n-1,2}\%3, a_{\#3g,n-1,3}\%3)$ are any of $(0, 1, 2), (0, 2, 1), (1, 0, 2), (1, 2, 0), (2, 0, 1),$ or $(2, 1, 0)$ (where p=1, 2, 3, . . . , n−1).

In addition, in equations 11-1 to 11-3g, combinations of degrees of $P(D)$ satisfy the following condition:

$(b_{\#1,1}\%3, b_{\#1,2}\%3), (b_{\#2,1}\%3, b_{\#2,2}\%3), (b_{\#3,1}\%3, b_{\#3,2}\%3), \ldots, (b_{\#k,1}\%3, b_{\#k,2}\%3), \ldots, (b_{\#3g-2,1}\%3, b_{\#3g-2,2}\%3), (b_{\#3g-1,1}\%3, b_{\#3g-1,2}\%3),$ and $(b_{\#3g,1}\%3, b_{\#3g,2}\%3)$ are any of $(1, 2),$ or $(2, 1)$ (where k=1, 2, 3, . . . , 3g).

<Condition #3> has a similar relationship with respect to equations 11-1 to 11-3g as <Condition #2> has with respect to equations 9-1 to 9-3g. If the condition below (<Condition #4>) is added for equations 11-1 to 11-3g in addition to <Condition #3>, the possibility of being able to create an LDPC-CC having higher error correction capability is increased.

<Condition #4>

Degrees of $P(D)$ of equations 11-1 to 11-3g satisfy the following condition:

all values other than multiples of 3 (that is, 0, 3, 6, . . . , 3g−3) from among integers from 0 to 3g−1 (0, 1, 2, 3, 4, . . . , 3g-2, 3g-1) are present in the values of 6g degrees of $(b_{\#1,1}\%3g, b_{\#1,2}\%3g), (b_{\#2,1}\%3g, b_{\#2,2}\%3g), (b_{\#3,1}\%3g, b_{\#3,2}\%3g), \ldots, (b_{\#k,1}\%3g, b_{\#k,2}\%3g), \ldots, (b_{\#3g-2,1}\%3g, b_{\#3g-2,2}\%3g), (b_{\#3g-1,1}\%3g, b_{\#3g-1,2}\%3g), (b_{\#3g,1}\%3g, b_{\#3g,2}\%3g)$.

The possibility of obtaining good error correction capability is high if there is also randomness while regularity is maintained for positions at which 1's are present in a parity check matrix. With an LDPC-CC for which the time varying period is 3g (where g=2, 3, 4, 5, . . . ) and the coding rate is (n−1)/n (where n is an integer equal to or greater than 2) that has parity check polynomials of equations 11-1 to 11-3g, if a code is created in which <Condition #4> is applied in addition to <Condition #3>, it is possible to provide randomness while maintaining regularity for positions at which 1's are present in a parity check matrix, and therefore the possibility of obtaining good error correction capability is increased.

Next, an LDPC-CC of a time varying period of 3g (where g=2, 3, 4, 5, . . . ) is considered that enables encoding to be performed easily and provides relevancy to parity bits and data bits of the same point in time. At this time, if the coding rate is (n−1)/n (where n is an integer equal to or greater than 2), LDPC-CC parity check polynomials can be represented as shown below.

[13]

$$(D^{a\#1,1,1} + D^{a\#1,1,2} + 1)X_1(D) + \quad \text{(Equation 13-1)}$$
$$(D^{a\#1,2,1} + D^{a\#1,2,2} + 1)X_2(D) + \cdots +$$
$$(D^{a\#1,n-1,1} + D^{a\#1,n-1,2} + 1)X_{n-1}(D) +$$
$$(D^{b\#1,1} + D^{b\#1,2} + 1)P(D) = 0$$

$$(D^{a\#2,1,1} + D^{a\#2,1,2} + 1)X_1(D) + \quad \text{(Equation 13-2)}$$
$$(D^{a\#2,2,1} + D^{a\#2,2,2} + 1)X_2(D) + \cdots +$$
$$(D^{a\#2,n-1,1} + D^{a\#2,n-1,2} + 1)X_{n-1}(D) +$$
$$(D^{b\#2,1} + D^{b\#2,2} + 1)P(D) = 0$$

$$(D^{a\#3,1,1} + D^{a\#3,1,2} + 1)X_1(D) + \quad \text{(Equation 13-3)}$$
$$(D^{a\#3,2,1} + D^{a\#3,2,2} + 1)X_2(D) + \cdots +$$
$$(D^{a\#3,n-1,1} + D^{a\#3,n-1,2} + 1)X_{n-1}(D) +$$
$$(D^{b\#3,1} + D^{b\#3,2} + 1)P(D) = 0$$

$$\vdots$$

$$(D^{a\#k,1,1} + D^{a\#k,1,2} + 1)X_1(D) + \quad \text{(Equation 13-k)}$$
$$(D^{a\#k,2,1} + D^{a\#k,2,2} + 1)X_2(D) + \cdots +$$
$$(D^{a\#k,n-1,1} + D^{a\#k,n-1,2} + 1)X_{n-1}(D) +$$
$$(D^{b\#k,1} + D^{b\#k,2} + 1)P(D) = 0$$

$$\vdots$$

$$(D^{a\#3g-2,1,1} + D^{a\#3g-2,1,2} + 1)X_1(D) + \quad \text{(Equation 13-(3g-2))}$$
$$(D^{a\#3g-2,2,1} + D^{a\#3g-2,2,2} + 1)X_2(D) + \cdots +$$
$$(D^{a\#3g-2,n-1,1} + D^{a\#3g-2,n-1,2} + 1)X_{n-1}(D) +$$
$$(D^{b\#3g-2,1} + D^{b\#3g-2,2} + 1)P(D) = 0$$

$$(D^{a\#3g-1,1,1} + D^{a\#3g-1,1,2} + 1)X_1(D) + \quad \text{(Equation 13-(3g-1))}$$
$$(D^{a\#3g-1,2,1} + D^{a\#3g-1,2,2} + 1)X_2(D) + \cdots +$$
$$(D^{a\#3g-1,n-1,1} + D^{a\#3g-1,n-1,2} + 1)X_{n-1}(D) +$$
$$(D^{b\#3g-1,1} + D^{b\#3g-1,2} + 1)P(D) = 0$$

$$(D^{a\#3g,1,1} + D^{a\#3g,1,2} + 1)X_1(D) + \quad \text{(Equation 13-3g)}$$
$$(D^{a\#3g,2,1} + D^{a\#3g,2,2} + 1)X_2(D) + \cdots +$$
$$(D^{a\#3g,n-1,1} + D^{a\#3g,n-1,2} + 1)X_{n-1}(D) +$$
$$(D^{b\#3g,1} + D^{b\#3g,2} + 1)P(D) = 0$$

At this time, $X_1(D), X_2(D), \ldots, X_{n-1}(D)$ are polynomial representations of data (information) $X_1, X_2, \ldots, X_{n-1}$, and P(D) is a parity polynomial representation. In equations 13-1 to 13-3g, parity check polynomials are assumed such that there are three terms in $X_1(D), X_2(D), \ldots, X_{n-1}(D)$, and P(D) respectively, and term $D^0$ is present in $X_1(D), X_2(D), \ldots, X_{n-1}(D)$, and P(D) (where k=1, 2, 3, ..., 3g).

In an LDPC-CC of a time varying period of 3g and a coding rate of (n−1)/n (where n is an integer equal to or greater than 2), the parity part and information at time i are represented by Pi and $X_{i,1}, X_{i,2}, \ldots, X_{i,n-1}$ respectively. If i %3g=k (where k=0, 1, 2, ..., 3g−1) is assumed at this time, a parity check polynomial of equation 13-(k+1) holds true. For example, if i=2, i %3g=2 (k=2), and therefore equation 14 holds true.

[14]

$$(D^{a\#3,1,1}+D^{a\#3,1,2}+1)X_{2,1}+(D^{a\#3,2,1}+D^{a\#3,2,2}+1)X_{2,2}+\ldots+(D^{a\#3,n-1,1}+D^{a\#3,n-1,2}+1)X_{2,n-1}+(D^{b\#3,1}+D^{b\#3,2}+1)P_2=0 \quad \text{(Equation 14)}$$

If following <Condition #5> and <Condition #6> are satisfied at this time, the possibility of being able to create a code having higher error correction capability is increased.

<Condition #5>

In equations 13-1 to 13-3g, combinations of degrees of $X_1(D), X_2(D), \ldots X_{n-1}(D)$, and P(D) satisfy the following condition:

$(a_{\#1,1,1}\%3, a_{\#1,1,2}\%3), (a_{\#1,2,1}\%3, a_{\#1,2,2}\%3), \ldots, (a_{\#1,p,1}\%3, a_{\#1,p,2}\%3), \ldots,$ and $(a_{\#1,n-1,1}\%3, a_{\#1,n-1,2}\%3)$ are any of (1, 2), (2, 1) (p=1, 2, 3, ..., n−1);

$(a_{\#2,1,1}\%3, a_{\#2,1,2}\%3), (a_{\#2,2,1}\%3, a_{\#2,2,2}\%3), \ldots, (a_{\#2,p,1}\%3, a_{\#2,p,2}\%3), \ldots,$ and $(a_{\#2,n-1,1}\%3, a_{\#2,n-1,2}\%3)$ are any of (1, 2), or (2, 1) (where p=1, 2, 3, ..., n−1);

$(a_{\#3,1,1}\%3, a_{\#3,1,2}\%3), (a_{\#3,2,1}\%3, a_{\#3,2,2}\%3), \ldots, (a_{\#3,p,1}\%3, a_{\#3,p,2}\%3), \ldots,$ and $(a_{\#3,n-1,1}\%3, a_{\#3,n-1,2}\%3)$ are any of (1, 2), or (2, 1) (where p=1, 2, 3, ..., n−1);

●

●

●

$(a_{\#k,1,1}\%3, a_{\#k,1,2}\%3), (a_{\#k,2,1}\%3, a_{\#k,2,2}\%3), \ldots, (a_{\#k,p,1}\%3, a_{\#k,p,2}\%3), \ldots,$ and $(a_{\#k,n-1,1}\%3, a_{\#k,n-1,2}\%3)$ are any of (1, 2), or (2, 1) (where p=1, 2, 3, ..., n−1) (where k=1, 2, 3, ..., 3g)

●

●

●

$(a_{\#3g-2,1,1}\%3, a_{\#3g-2,1,2}\%3), (a_{\#3g-2,2,1}\%3, a_{\#3g-2,2,2}\%3), \ldots, (a_{\#3g-2,p,1}\%3, a_{\#3g-2,p,2}\%3), \ldots,$ and $(a_{\#3g-2,n-1,1}\%3, a_{\#3g-2,n-1,2}\%3)$ are any of (1, 2), or (2, 1) (where p=1, 2, 3, ... n−1);

$(a_{\#3g-1,1,1}\%3, a_{\#3g-1,1,2}\%3), (a_{\#3g-1,2,1}\%3, a_{\#3g-1,2,2}\%3), \ldots, (a_{\#3g-1,p,1}\%3, a_{\#3g-1,p,2}\%3), \ldots,$ and $(a_{\#3g-1,n-1,1}\%3, a_{\#3g-1,n-1,2}\%3)$ are any of (1, 2), or (2, 1) (where p=1, 2, 3, ... n−1); and $(a_{\#3g,1,1}\%3, a_{\#3g,1,2}\%3), (a_{\#3g,2,1}\%3, a_{\#3g,2,2}\%3), \ldots, (a_{\#3g,p,1}\%3, a_{\#3g,p,2}\%3), \ldots,$ and $(a_{\#3g,n-1,1}\%3, a_{\#3g,n-1,2}\%3)$ are any of (1, 2), or (2, 1) (where p=1, 2, 3, ..., n−1). In addition, in equations 13-1 to 13-3g, combinations of degrees of P(D) satisfy the following condition:

$(b_{\#1,1}\%3, b_{\#1,2}\%3), (b_{\#2,1}\%3, b_{\#2,2}\%3), (b_{\#3,1}\%3, b_{\#3,2}\%3), \ldots, (b_{\#k,1}\%3, b_{\#k,2}\%3), \ldots, (b_{\#3g-2,1}\%3, b_{\#3g-2,2}\%3), (b_{\#3g-1,1}\%3, b_{\#3g-1,2}\%3),$ and $(b_{\#3g,1}\%3, b_{\#3g,2}\%3)$ are any of (1, 2), or (2, 1) (where k=1, 2, 3, ..., 3g).

<Condition #5> has a similar relationship with respect to equations 13-1 to 13-3g as <Condition #2> has with respect to equations 9-1 to 9-3g. If the condition below (<Condition #6>) is added for equations 13-1 to 13-3g in addition to <Condition #5>, the possibility of being able to create a code having high error correction capability is increased.

<Condition #6>

Degrees of $X_1(D)$ of equations 13-1 to 13-3g satisfy the following condition:

all values other than multiples of 3 (that is, 0, 3, 6, ..., 3g−3) from among integers from 0 to 3g−1 (0, 1, 2, 3, 4, ..., 3g-2, 3g−1) are present in the following 6g values of $(a_{\#1,1,1}\%3g, a_{\#1,1,2}\%3g), (a_{\#2,1,1}\%3g, a_{\#2,1,2}\%3g), \ldots, (a_{\#p,1,1}\%3g, a_{\#p,1,2}\%3g), \ldots,$ and $(a_{\#3g,1,1}\%3g, a_{\#3g,1,2}\%3g)$ (where p=1, 2, 3, ..., 3g);

Degrees of $X_2(D)$ of equations 13-1 to 13-3g satisfy the following condition:

all values other than multiples of 3 (that is, 0, 3, 6, ..., 3g−3) from among integers from 0 to 3g−1 (0, 1, 2, 3, 4, ..., 3g-2, 3g−1) are present in the following 6g values of $(a_{\#1,2,1}\%3g, a_{\#1,2,2}\%3g), (a_{\#2,2,1}\%3g, a_{\#2,2,2}\%3g), \ldots, (a_{\#p,2,1}\%3g, a_{\#p,2,2}\%3g), \ldots,$ and $(a_{\#3g,2,1}\%3g, a_{\#3g,2,2}\%3g)$ (where p=1, 2, 3, ..., 3g);

Degrees of $X_3(D)$ of equations 13-1 to 13-3g satisfy the following condition:

all values other than multiples of 3 (that is, 0, 3, 6, ..., 3g−3) from among integers from 0 to 3g−1 (0, 1, 2, 3, 4, ..., 3g-2, 3g−1) are present in the following 6g values of $(a_{\#1,3,1}\%3g, a_{\#1,3,2}\%3g), (a_{\#2,3,1}\%3g, a_{\#2,3,2}\%3g), \ldots, (a_{\#p,3,1}\%3g, a_{\#p,3,2}\%3g), \ldots,$ and $(a_{\#3g,3,1}\%3g, a_{\#3g,3,2}\%3g)$ (where p=1, 2, 3, ..., 3g);

●

●

●

Degrees of Xk(D) of equations 13-1 to 13-3g satisfy the following condition:

all values other than multiples of 3 (that is, 0, 3, 6, ..., 3g−3) from among integers from 0 to 3g−1 (0, 1, 2, 3, 4, ..., 3g-2, 3g−1) are present in the following 6g values of $(a_{\#1,k,1}\%3g, a_{\#1,k,2}\%3g), (a_{\#2,k,1}\%3g, a_{\#2,k,2}\%3g), \ldots, (a_{\#p,k,1}\%3g, a_{\#p,k,2}\%3g), \ldots,$ and $(a_{\#3g,k,1}\%3g, a_{\#3g,k,2}\%3g)$ (where p=1, 2, 3, ..., 3g, and k=1, 2, 3, ..., n−1);

●

●

●

Degrees of $X_{n-1}(D)$ of equations 13-1 to 13-3g satisfy the following condition:

all values other than multiples of 3 (that is, 0, 3, 6, ..., 3g−3) from among integers from 0 to 3g−1 (0, 1, 2, 3, 4, ..., 3g-2, 3g−1) are present in the following 6g values of $(a_{\#1,n-1,1}\%3g, a_{\#1,n-1,2}\%3g), (a_{\#2,n-1,1}\%3g, a_{\#2,n-1,2}\%3g), \ldots, (a_{\#p,n-1,1}\%3g, a_{\#p,n-1,2}\%3g), \ldots,$ and $(a_{\#3g,n-1,1}\%3g, a_{\#3g,n-1,2}\%3g)$ (where p=1, 2, 3, ..., 3g); and Degrees of P(D) of equations 13-1 to 13-3g satisfy the following condition:

all values other than multiples of 3 (that is, 0, 3, 6, ..., 3g−3) from among integers from 0 to 3g−1 (0, 1, 2, 3, 4, ..., 3g-2, 3g−1) are present in the following 6g values of $(b_{\#1,1}\%3g, b_{\#1,2}\%3g), (b_{\#2,1}\%3g, b_{\#2,2}\%3g), (b_{\#3,1}\%3g, b_{\#3,2}\%3g), \ldots, (b_{\#k,1}\%3g, b_{\#k,2}\%3g), \ldots, (b_{\#3g-2,1}\%3g, b_{\#3g-2,2}\%3g), (b_{\#3g-1,1}\%3g, b_{\#3g-1,2}\%3g)$ and $(b_{\#3g,1}\%3g, b_{\#3g,2}\%3g)$ (where k=1, 2, 3, ..., n−1).

The possibility of obtaining good error correction capability is high if there is also randomness while regularity is maintained for positions at which 1's are present in a parity check matrix. With an LDPC-CC for which the time varying period is 3g (where g=2, 3, 4, 5, . . . ) and the coding rate is (n−1)/n (where n is an integer equal to or greater than 2) that has parity check polynomials of equations 13-1 to 13-3g, if a code is created in which <Condition #6> is applied in addition to <Condition #5>, it is possible to provide randomness while maintaining regularity for positions at which 1's are present in a parity check matrix, and therefore the possibility of obtaining good error correction capability is increased.

The possibility of being able to create an LDPC-CC having higher error correction capability is also increased if a code is created using <Condition #6'> instead of <Condition #6>, that is, using <Condition #6'> in addition to <Condition #5>.

<Condition #6'>

Degrees of $X_1(D)$ of equations 13-1 to 13-3g satisfy the following condition:

all values other than multiples of 3 (that is, 0, 3, 6, . . . , 3g−3) from among integers from 0 to 3g−1 (0, 1, 2, 3, 4, . . . , 3g-2, 3g-1) are present in the following 6g values of $(a_{\#1,1,1}\%3g, a_{\#1,1,2}\%3g), (a_{\#2,1,1}\%3g, a_{\#2,1,2}\%3g), \ldots , (a_{\#p,1,1}\%3g, a_{\#p,1,2}\%3g), \ldots ,$ and $(a_{\#3g,1,1}\%3g, a_{\#3g,1,2}\%3g)$ (where p=1, 2, 3, . . . , 3g);

Degrees of $X_2(D)$ of equations 13-1 to 13-3g satisfy the following condition:

all values other than multiples of 3 (that is, 0, 3, 6, . . . , 3g−3) from among integers from 0 to 3g−1 (0, 1, 2, 3, 4, . . . , 3g-2, 3g-1) are present in the following 6g values of $(a_{\#1,2,1}\%3g, a_{\#1,2,2}\%3g), (a_{\#2,2,1}\%3g, a_{\#2,2,2}\%3g), \ldots , (a_{\#p,2,1}\%3g, a_{\#p,2,2}\%3g), \ldots ,$ and $(a_{\#3g,2,1}\%3g, a_{\#3g,2,2}\%3g)$ (where p=1, 2, 3, . . . , 3g);

Degrees of $X_3(D)$ of equations 13-1 to 13-3g satisfy the following condition:

all values other than multiples of 3 (that is, 0, 3, 6, . . . , 3g−3) from among integers from 0 to 3g−1 (0, 1, 2, 3, 4, . . . , 3g-2, 3g-1) are present in the following 6g values of $(a_{\#1,3,1}\%3g, a_{\#1,3,2}\%3g), (a_{\#2,3,1}\%3g, a_{\#2,3,2}\%3g), \ldots , (a_{\#p,3,1}\%3g, a_{\#p,3,2}\%3g), \ldots ,$ and $(a_{\#3g,3,1}\%3g, a_{\#3g,3,2}\%3g)$ (where p=1, 2, 3, . . . , 3g);

•

•

•

Degrees of $X_k(D)$ of equations 13-1 to 13-3g satisfy the following condition:

all values other than multiples of 3 (that is, 0, 3, 6, . . . , 3g−3) from among integers from 0 to 3g−1 (0, 1, 2, 3, 4, . . . , 3g-2, 3g-1) are present in the following 6g values of $(a_{\#1,k,1}\%3g, a_{\#1,k,2}\%3g), (a_{\#2,k,1}\%3g, a_{\#2,k,2}\%3g), \ldots , (a_{\#p,k,1}\%3g, a_{\#p,k,2}\%3g), \ldots , (a_{\#3g,k,1}\%3g, a_{\#3g,k,2}\%3g)$ (where p=1, 2, 3, . . . , 3g, and k=1, 2, 3, . . . , n−1);

•

•

•

Degrees of $X_{n-1}(D)$ of equations 13-1 to 13-3g satisfy the following condition:

all values other than multiples of 3 (that is, 0, 3, 6, . . . , 3g−3) from among integers from 0 to 3g−1 (0, 1, 2, 3, 4, . . . , 3g-2, 3g-1) are present in the following 6g values of $(a_{\#1,n-1,1}\%3g, a_{\#1,n-1,2}\%3g), (a_{\#2,n-1,1}\%3g, a_{\#2,n-1,2}\%3g), \ldots , (a_{\#p,n-1,1}\%3g, a_{\#p,n-1,2}\%3g), \ldots , (a_{\#3g,n-1,1}\%3g, a_{\#3g,n-1,2}\%3g)$ (where p=1, 2, 3, . . . , 3g); or Degrees of P(D) of equations 13-1 to 13-3g satisfy the following condition:

all values other than multiples of 3 (that is, 0, 3, 6, . . . , 3g−3) from among integers from 0 to 3g−1 (0, 1, 2, 3, 4, . . . , 3g-2, 3g-1) are present in the following 6g values of $(b_{\#i,1}\%3g, b_{\#1,2}\%3g), (b_{\#2,1}\%3g, b_{\#2,2}\%3g), (b_{\#3,1}\%3g, b_{\#3,2}\%3g), \ldots , (b_{\#k,1}\%3g, b_{\#k,2}\%3g), \ldots , (b_{\#3g-2,1}\%3g, b_{\#3g-2,2}\%3g), (b_{\#3g-1,1}\%3g, b_{\#3g-1,2}\%3g), (b_{\#3g,1}\%3g, b_{\#3g,2}\%3g)$ (where k=1, 2, 3, . . . , 3g).

The above description relates to an LDPC-CC of a time varying period of 3g and a coding rate of (n−1)/n (where n is an integer equal to or greater than 2). Below, conditions are described for degrees of an LDPC-CC of a time varying period of 3g and a coding rate of 1/2 (n=2).

Consider equations 15-1 to 15-3g as parity check polynomials of an LDPC-CC for which the time varying period is 3g (where g=1, 2, 3, 4, . . . ) and the coding rate is 1/2 (n=2).

[15]

$$(D^{a\#1,1,1} + D^{a\#1,1,2} + D^{a\#1,1,3})X(D) + \\ (D^{b\#1,1} + D^{b\#1,2} + D^{b\#1,3})P(D) = 0 \quad \text{(Equation 15-1)}$$

$$(D^{a\#2,1,1} + D^{a\#2,1,2} + D^{a\#2,1,3})X(D) + \\ (D^{b\#2,1} + D^{b\#2,2} + D^{b\#2,3})P(D) = 0 \quad \text{(Equation 15-2)}$$

$$(D^{a\#3,1,1} + D^{a\#3,1,2} + D^{a\#3,1,3})X(D) + \\ (D^{b\#3,1} + D^{b\#3,2} + D^{b\#3,3})P(D) = 0 \quad \text{(Equation 15-3)}$$

$$\vdots$$

$$(D^{a\#k,1,1} + D^{a\#k,1,2} + D^{a\#k,1,3})X(D) + \\ (D^{b\#k,1} + D^{b\#k,2} + D^{b\#k,3})P(D) = 0 \quad \text{(Equation 15-k)}$$

$$\vdots$$

$$(D^{a\#3g-2,1,1} + D^{a\#3g-2,1,2} + D^{a\#3g-2,1,3})X(D) + \\ (D^{b\#3g-2,1} + D^{b\#3g-2,2} + D^{b\#3g-2,3})P(D) = 0 \quad \text{(Equation 15-(3g-2))}$$

$$(D^{a\#3g-1,1,1} + D^{a\#3g-1,1,2} + D^{a\#3g-1,1,3})X(D) + \\ (D^{b\#3g-1,1} + D^{b\#3g-1,2} + D^{b\#3g-1,3})P(D) = 0 \quad \text{(Equation 15-(3g-1))}$$

$$(D^{a\#3g,1,1} + D^{a\#3g,1,2} + D^{a\#3g,1,3})X(D) + \\ (D^{b\#3g,1} + D^{b\#3g,2} + D^{b\#3g,3})P(D) = 0 \quad \text{(Equation 15-3g)}$$

At this time, X is a polynomial representation of data (information) X and P(D) is a parity polynomial representation. Here, in equations 15-1 to 15-3g, parity check polynomials are assumed such that there are three terms in X(D) and P(D) respectively.

Thinking in the same way as in the case of an LDPC-CC of a time varying period of 3 and an LDPC-CC of a time varying period of 6, the possibility of being able to obtain higher error correction capability is increased if the condition below (<Condition #2-1>) is satisfied in an LDPC-CC of a time varying period of 3g and a coding rate of 1/2 (n=2) represented by parity check polynomials of equations 15-1 to 15-3g.

In an LDPC-CC of a time varying period of 3g and a coding rate of 1/2 (n=2), the parity part and information at time i are represented by Pi and $X_{i,1}$ respectively. If i %3g=k (where k=0, 1, 2, . . . , 3g−1) is assumed at this time, a parity check polynomial of equation 15-(k+1) holds true. For example, if i=2, i %3g=2 (k=2), and therefore equation 16 holds true.

[16]

$$(D^{a\#3,1,1}+D^{a\#3,1,2}+D^{a\#3,1,3})X_{2,1}+(D^{b\#3,1}+D^{b\#3,2}+D^{b\#3,3})P_2=0 \quad \text{(Equation 16)}$$

In equations 15-1 to 15-3g, it is assumed that $a_{\#k,1,1}$, $a_{\#k,1,2}$, and $a_{\#k,1,3}$ are integers (where $a_{\#k,1,1} \neq a_{\#k,1,2} \neq a_{\#k,1,3}$) (where k=1, 2, 3, . . . , 3g). Also, it is assumed that $b_{\#k,1}$, $b_{\#k,2}$, and $b_{\#k,3}$ are integers (where $b_{\#k,1} \neq b_{\#k,2} \neq b_{\#k,3}$). A parity check polynomial of equation 15-k (k=1, 2, 3, . . . , 3g) is called "check equation #k." A sub-matrix based on the parity check polynomial of equation 15-k is designated k-th sub-matrix $H_k$. Next, an LDPC-CC of a time varying period of 3g is considered that is generated from first sub-matrix $H_1$, second sub-matrix $H_2$, third sub-matrix $H_3$, . . . , and 3g-th sub-matrix $H_{3g}$.

<Condition #2-1>

In equations 15-1 to 15-3g, combinations of degrees of X(D) and P(D) satisfy the following condition:

($a_{\#1,1,1}\%3$, $a_{\#1,1,2}\%3$, $a_{\#1,1,3}\%3$) and ($b_{\#1,1}\%3$, $b_{\#1,2}\%3$, $b_{\#1,3}\%3$) are any of (0, 1,2), (0,2, 1), (1, 0,2), (1,2, 0), (2, 0, 1), or (2, 1, 0);

($a_{\#2,1,1}\%3$, $a_{\#2,1,2}\%3$, $a_{\#2,1,3}\%3$) and ($b_{\#2,1}\%3$, $b_{\#2,2}\%3$, $b_{\#2,3}\%3$) are any of (0, 1, 2), (0, 2, 1), (1, 0, 2), (1, 2, 0), (2, 0, 1), or (2, 1, 0);

($a_{\#3,1,1}\%3$, $a_{\#3,1,2}\%3$, $a_{\#3,1,3}\%3$) and ($b_{\#3,1}\%3$, $b_{\#3,2}\%3$, $b_{\#3,3}\%3$) are any of (0, 1, 2), (0, 2, 1), (1, 0, 2), (1, 2, 0), (2, 0, 1), or (2, 1, 0);

•
•
•

($a_{\#k,1,1}\%3$, $a_{\#k,1,2}\%3$, $a_{\#k,1,3}\%3$) and ($b_{\#k,1}\%3$, $b_{\#k,2}\%3$, $b_{\#k,3}\%3$) are any of (0, 1, 2), (0, 2, 1), (1, 0, 2), (1, 2, 0), (2, 0, 1), or (2, 1, 0) (where k=1, 2, 3, . . . , 3g);

•
•
•

($a_{\#3g-2,1,1}\%3$, $a_{\#3g-2,1,2}\%3$, $a_{\#3g-2,1,3}\%3$) and ($b_{\#3g-2,1}\%3$, $b_{\#3g-2,2}\%3$, $b_{\#3g-2,3}\%3$) are any of (0, 1, 2), (0, 2, 1), (1, 0, 2), (1, 2, 0), (2, 0, 1), or (2, 1, 0);

($a_{\#3g-1, 1, 1}\%3$, $a_{\#3g-1,1,2}\%3$, $a_{\#3g-1,1,3}\%3$) and ($b_{\#3g-1,1}\%3$, $b_{\#3g-1,2}\%3$, $b_{\#3g-1,3}\%3$) are any of (0, 1, 2), (0, 2, 1), (1, 0, 2), (1, 2, 0), (2, 0, 1), or (2, 1, 0); and ($a_{\#3g,1,1}\%3$, $a_{\#3g,1,2}\%3$, $a_{\#3g,1,3}\%3$) and ($b_{\#3g,1}\%3$, $b_{\#3g,2}\%3$, $b_{\#3g,3}\%3$) are any of (0, 1, 2), (0, 2, 1), (1, 0, 2), (1, 2, 0), (2, 0, 1), or (2, 1, 0).

Taking ease of performing encoding into account, it is desirable for one "0" to be present among the three items ($b_{\#k,1}\%3$, $b_{\#k,2}\%3$, $b_{\#k,3}\%3$) (where k=1, 2, . . . , 3g) in equations 15-1 to 15-3g. This is because of a feature that, if $D^0=1$ holds true and $b_{\#k,1}$, $b_{\#k,2}$ and $b_{\#k,3}$ are integers equal to or greater than 0 at this time, parity part P can be found sequentially.

Also, in order to provide relevancy between parity bits and data bits of the same point in time, and to facilitate a search for a code having high correction capability, it is desirable for one "0" to be present among the three items ($a_{\#k,1,1}\%3$, $a_{\#k,1,2}\%3$, $a_{\#k,1,3}\%3$) (where k=1, 2, . . . , 3g).

Next, an LDPC-CC of a time varying period of 3g (where g=2, 3, 4, 5, . . . ) that takes ease of encoding into account is considered. At this time, if the coding rate is 1/2 (n=2), LDPC-CC parity check polynomials can be represented as shown below.

[17]

$$(D^{a\#1,1,1} + D^{a\#1,1,2} + D^{a\#1,1,3})X(D) + \quad \text{(Equation 17-1)}$$
$$(D^{b\#1,1} + D^{b\#1,2} + 1)P(D) = 0$$

$$(D^{a\#2,1,1} + D^{a\#2,1,2} + D^{a\#2,1,3})X(D) + \quad \text{(Equation 17-2)}$$
$$(D^{b\#2,1} + D^{b\#2,2} + 1)P(D) = 0$$

$$(D^{a\#3,1,1} + D^{a\#3,1,2} + D^{a\#3,1,3})X(D) + \quad \text{(Equation 17-3)}$$
$$(D^{b\#3,1} + D^{b\#3,2} + 1)P(D) = 0$$

$$\vdots$$

$$(D^{a\#k,1,1} + D^{a\#k,1,2} + D^{a\#k,1,3})X(D) + \quad \text{(Equation 17-k)}$$
$$(D^{b\#k,1} + D^{b\#k,2} + 1)P(D) = 0$$

$$\vdots$$

$$(D^{a\#3g-2,1,1} + D^{a\#3g-2,1,2} + D^{a\#3g-2,1,3})X(D) + \quad \text{(Equation 17-(3g-2))}$$
$$(D^{b\#3g-2,1} + D^{b\#3g-2,2} + 1)P(D) = 0$$

$$(D^{a\#3g-1,1,1} + D^{a\#3g-1,1,2} + D^{a\#3g-1,1,3})X(D) + \quad \text{(Equation 17-(3g-1))}$$
$$(D^{b\#3g-1,1} + D^{b\#3g-1,2} + 1)P(D) = 0$$

$$(D^{a\#3g,1,1} + D^{a\#3g,1,2} + D^{a\#3g,1,3})X(D) + \quad \text{(Equation 17-3g)}$$
$$(D^{b\#3g,1} + D^{b\#3g,2} + 1)P(D) = 0$$

At this time, X(D) is a polynomial representation of data (information) X and P(D) is a parity polynomial representation. Here, in equations 17-1 to 17-3g, parity check polynomials are assumed such that there are three terms in X(D) and P(D) respectively. In an LDPC-CC of a time varying period of 3g and a coding rate of 1/2 (n=2), the parity part and information at time i are represented by Pi and $X_{i,1}$ respectively. If i %3g=k (where k=0, 1, 2, . . . , 3g-1) is assumed at this time, a parity check polynomial of equation 17-(k+1) holds true. For example, if i=2, i %3g=2 (k=2), and therefore equation 18 holds true.

[18]

$$(D^{a\#3,1,1}+D^{a\#3,1,2}+D^{a\#3,1,3})X_{2,1}+(D^{b\#3,1}+D^{b\#3,2}+1)P_2=0 \quad \text{(Equation 18)}$$

If <Condition #3-1> and <Condition #4-1> are satisfied at this time, the possibility of being able to create a code having higher error correction capability is increased.

<Condition #3-1>

In equations 17-1 to 17-3g, combinations of degrees of X(D) satisfy the following condition:

($a_{\#1,1,1}\%3$, $a_{\#1,1,2}\%3$, $a_{\#1,1,3}\%3$) are any of (0, 1, 2), (0, 2, 1), (1, 0, 2), (1, 2, 0), (2, 0, 1), or (2, 1, 0);

($a_{\#2,1,1}\%3$, $a_{\#2,1,2}\%3$, $a_{\#2,1,3}\%3$) are any of (0, 1, 2), (0, 2, 1), (1, 0, 2), (1, 2, 0), (2, 0, 1), or (2, 1, 0);

($a_{\#3,1,1}\%3$, $a_{\#3,1,2}\%3$, $a_{\#3,1,3}\%3$) are any of (0, 1, 2), (0, 2, 1), (1, 0, 2), (1, 2, 0), (2, 0, 1), or (2, 1, 0);

•
•
•

($a_{\#k,1,1}$%3, $a_{\#k,1,2}$%3, $a_{\#k,1,3}$%3) are any of (0, 1, 2), (0, 2, 1), (1, 0, 2), (1, 2, 0), (2, 0, 1), or (2, 1, 0) (where k=1, 2, 3, . . . , 3g);

•

•

•

($a_{\#3g-2,1,1}$%3, $a_{\#3g-2,1,2}$%3, $a_{\#3g-2,1,3}$%3) are any of (0, 1, 2), (0, 2, 1), (1, 0, 2), (1, 2, 0), (2, 0, 1), or (2, 1, 0);
($a_{\#3g-1,1,1}$%3, $a_{\#3g-1,1,2}$%3, $a_{\#3g-1,1,3}$%3) are any of (0, 1, 2), (0, 2, 1), (1, 0, 2), (1, 2, 0), (2, 0, 1), or (2, 1, 0); and
($a_{\#3g,1,1}$%3, $a_{\#3g,1,2}$%3, $a_{\#3g,1,3}$%3) are any of (0, 1, 2), (0, 2, 1), (1, 0, 2), (1, 2, 0), (2, 0, 1), or (2, 1, 0).

In addition, in equations 17-1 to 17-3g, combinations of degrees of P(D) satisfy the following condition:
($b_{\#1,1}$%3, $b_{\#1,2}$%3), ($b_{\#2,1}$%3, $b_{\#2,2}$%3), ($b_{\#3,1}$%3, $b_{\#3,2}$%3), . . . , ($b_{\#k,1}$%3, $b_{\#k,2}$%3), . . . , ($b_{\#3g-2,1}$%3, $b_{\#3g-2,2}$%3), ($b_{\#3g-1,1}$%3, $b_{\#3g-1,2}$%3), and ($b_{\#3g,1}$%3, $b_{\#3g,2}$%3) are any of (1, 2), or (2, 1) (k=1, 2, 3, . . . , 3g).

<Condition #3-1> has a similar relationship with respect to equations 17-1 to 17-3g as <Condition #2-1> has with respect to equations 15-1 to 15-3g. If the condition below (<Condition #4-1>) is added for equations 17-1 to 17-3g in addition to <Condition #3-1>, the possibility of being able to create an LDPC-CC having higher error correction capability is increased.

<Condition #4-1>

Degrees of P(D) of equations 17-1 to 17-3g satisfy the following condition:

all values other than multiples of 3 (that is, 0, 3, 6, . . . , 3g-3) from among integers from 0 to 3g-1 (0, 1, 2, 3, 4, . . . , 3g-2, 3g-1) are present in the following 6g values of ($b_{\#1,1}$%3g, $b_{\#1,2}$%3g), ($b_{\#2,1}$%3g, $b_{\#2,2}$%3g), ($b_{\#3,1}$%3g, $b_{\#3,2}$%3g), . . . , ($b_{\#k,1}$%3g, $b_{\#k,2}$%3g), . . . , ($b_{\#3g-2,1}$%3g, $b_{\#3g-2,2}$%3g), ($b_{\#3g-1,1}$%3g, $b_{\#3g-1,2}$%3g), and ($b_{\#3g,1}$%3g, $b_{\#3g,2}$%3g).

The possibility of obtaining good error correction capability is high if there is also randomness while regularity is maintained for positions at which 1's are present in a parity check matrix. With an LDPC-CC for which the time varying period is 3g (where g=2, 3, 4, 5, . . . ) and the coding rate is 1/2 (n=2) that has parity check polynomials of equations 17-1 to 17-3g, if a code is created in which <Condition #4-1> is applied in addition to <Condition #3-1>, it is possible to provide randomness while maintaining regularity for positions at which 1's are present in a parity check matrix, and therefore the possibility of obtaining better error correction capability is increased.

Next, an LDPC-CC of a time varying period of 3g (where g=2, 3, 4, 5, . . . ) is considered that enables encoding to be performed easily and provides relevancy to parity bits and data bits of the same point in time. At this time, if the coding rate is 1/2 (n=2), LDPC-CC parity check polynomials can be represented as shown below.

[19]

$$(D^{a\#1,1,1} + D^{a\#1,1,2} + 1)X(D) + \\ (D^{b\#1,1} + D^{b\#1,2} + 1)P(D) = 0 \quad \text{(Equation 19-1)}$$

$$(D^{a\#2,1,1} + D^{a\#2,1,2} + 1)X(D) + \\ (D^{b\#2,1} + D^{b\#2,2} + 1)P(D) = 0 \quad \text{(Equation 19-2)}$$

-continued $$(D^{a\#3,1,1} + D^{a\#3,1,2} + 1)X(D) + \\ (D^{b\#3,1} + D^{b\#3,2} + 1)P(D) = 0 \quad \text{(Equation 19-3)}$$

$$\vdots$$

$$(D^{a\#k,1,1} + D^{a\#k,1,2} + 1)X(D) + \\ (D^{b\#k,1} + D^{b\#k,2} + 1)P(D) = 0 \quad \text{(Equation 19-k)}$$

$$\vdots$$

$$(D^{a\#3g-2,1,1} + D^{a\#3g-2,1,2} + 1)X(D) + \\ (D^{b\#3g-2,1} + D^{b\#3g-2,2} + 1)P(D) = 0 \quad \text{(Equation 19-(3g-2))}$$

$$(D^{a\#3g-1,1,1} + D^{a\#3g-1,1,2} + 1)X(D) + \\ (D^{b\#3g-1,1} + D^{b\#3g-1,2} + 1)P(D) = 0 \quad \text{(Equation 19-(3g-1))}$$

$$(D^{a\#3g,1,1} + D^{a\#3g,1,2} + 1)X(D) + \\ (D^{b\#3g,1} + D^{b\#3g,2} + 1)P(D) = 0 \quad \text{(Equation 19-3g)}$$

At this time, X(D) is a polynomial representation of data (information) X and P(D) is a parity polynomial representation. In equations 19-1 to 19-3g, parity check polynomials are assumed such that there are three terms in X(D) and P(D) respectively, and a $D^0$ term is present in X(D) and P(D) (where k=1, 2, 3, . . . , 3g).

In an LDPC-CC of a time varying period of 3g and a coding rate of 1/2 (n=2), the parity part and information at time i are represented by Pi and $X_{i,1}$ respectively. If i %3g=k (where k=0, 1, 2, . . . , 3g-1) is assumed at this time, a parity check polynomial of equation 19-(k+1) holds true. For example, if i=2, i %3g=2 (k=2), and therefore equation 20 holds true.

[20]

$$(D^{a\#3,1,1} + D^{a\#3,1,2} + 1)X_{2,1} + (D^{b\#3,1} + D^{b\#3,2} + 1)P_2 = 0 \quad \text{(Equation 20)}$$

If following <Condition #5-1> and <Condition #6-1> are satisfied at this time, the possibility of being able to create a code having higher error correction capability is increased.

<Condition #5-1>

In equations 19-1 to 19-3g, combinations of degrees of X(D) satisfy the following condition:
($a_{\#1,1,1}$%3, $a_{\#1,1,2}$%3) is (1, 2) or (2, 1);
($a_{\#2,1,1}$%3, $a_{\#2,1,2}$%3) is (1, 2) or (2, 1);
($a_{\#3,1,1}$%3, $a_{\#3,1,2}$%3) is (1, 2) or (2, 1);

•

•

•

($a_{\#k,1,1}$%3, $a_{\#k,1,2}$%3) is (1, 2) or (2, 1) (where k=1, 2, 3, . . . , 3g);

•

•

•

($a_{\#3g-2,1,1}$%3, $a_{\#3g-2,1,2}$%3) is (1, 2) or (2, 1),
($a_{\#3g-1,1,1}$%3, $a_{\#3g-1,1,2}$%3) is (1, 2) or (2, 1); and
($a_{\#3g,1,1}$%3, $a_{\#3g,1,2}$%3) is (1, 2) or (2, 1).

In addition, in equations 19-1 to 19-3g, combinations of degrees of P(D) satisfy the following condition:
($b_{\#1,1}$%3, $b_{\#1,2}$%3), ($b_{\#2,1}$%3, $b_{\#2,2}$%3), ($b_{\#3,1}$%3, $b_{\#3,2}$%3), . . . , ($b_{\#k,1}$%3, $b_{\#k,2}$%3), . . . , ($b_{\#3g-2,1}$%3, $b_{\#3g-2,2}$%3), ($b_{\#3g-1,1}$%3, $b_{\#3g-1,2}$%3), and ($b_{\#3g,1}$%3, $b_{\#3g,2}$%3) are any of (1, 2), or (2, 1) (where k=1, 2, 3, . . . , 3g).

<Condition #5-1> has a similar relationship with respect to equations 19-1 to 19-3g as <condition #2-1> has with respect to equations 15-1 to 15-3g. If the condition below (<condition #6-1>) is added for equation 19-1 to 19-3g in addition to <condition #5-1>, the possibility of being able to create an LDPC-CC having higher error correction capability is increased.

<Condition #6-1>

Degrees of X(D) of equations 19-1 to 19-3g satisfy the following condition:

all values other than multiples of 3 (that is, 0, 3, 6, . . . , 3g-3) from among integers from 0 to 3g-1 (0, 1, 2, 3, 4, . . . , 3g-2, 3g-1) are present in the following 6g values of $(a_{\#1,1,1}\%3g, a_{\#1,1,2}\%3g), (a_{\#2,1,1}\%3g, a_{\#2,1,2}\%3g), \ldots, (a_{\#p,1,1}\%3g, a_{\#p,1,2}\%3g), \ldots, (a_{\#3g,1,1}\%3g, a_{\#3g,1,2}\%3g)$ (where p=1, 2, 3, . . . , 3g); and Degrees of P(D) of equations 19-1 to 19-3g satisfy the following condition:

all values other than multiples of 3 (that is, 0, 3, 6, . . . , 3g-3) from among integers from 0 to 3g-1 (0, 1, 2, 3, 4, . . . , 3g-2, 3g-1) are present in the following 6g values of $(b_{\#1,1}\%3g, b_{\#1,2}\%3g), (b_{\#2,1}\%3g, b_{\#2,2}\%3g), (b_{\#3,1}\%3g, b_{\#3,2}\%3g), \ldots, (b_{\#k,1}\%3g, b_{\#k,2}\%3g), \ldots, (b_{\#3g-2,1}\%3g, b_{\#3g-2,2}\%3g), (b_{\#3g-1,1}\%3g, b_{\#3g-1,2}\%3g)$, and $(b_{\#3g,1}\%3g, b_{\#3g,2}\%3g)$ (where k=1, 2, 3, . . . , 3g).

The possibility of obtaining good error correction capability is high if there is also randomness while regularity is maintained for positions at which 1's are present in a parity check matrix. With an LDPC-CC for which the time varying period is 3g (where g=2, 3, 4, 5, . . . ) and the coding rate is 1/2 that has parity check polynomials of equations 19-1 to 19-3g, if a code is created in which <Condition #6-1> is applied in addition to <Condition #5-1>, it is possible to provide randomness while maintaining regularity for positions at which 1's are present in a parity check matrix, so that the possibility of obtaining better error correction capability is increased.

The possibility of being able to create an LDPC-CC having higher error correction capability is also increased if a code is created using <Condition #6'-1> instead of <Condition #6-1>, that is, using <Condition #6'-1> in addition to <Condition #5-1>.

<Condition #6'-1>

Degrees of X(D) of equations 19-1 to 19-3g satisfy the following condition:

all values other than multiples of 3 (that is, 0, 3, 6, . . . , 3g-3) from among integers from 0 to 3g-1 (0, 1, 2, 3, 4, . . . , 3g-2, 3g-1) are present in the following 6g values of $(a_{\#1,1,1}\%3g, a_{\#1,1,2}\%3g), (a_{\#2,1,1}\%3g, a_{\#2,1,2}\%3g), \ldots, (a_{\#p,1,1}\%3g, a_{\#p,1,2}\%3g), \ldots$, and $(a_{\#3g,1,1}\%3g, a_{\#3g,1,2}\%3g)$ (where p=1, 2, 3, . . . , 3g); or degrees of P(D) of equations 19-1 to 19-3g satisfy the following condition:

all values other than multiples of 3 (that is, 0, 3, 6, . . . , 3g-3) from among integers from 0 to 3g-1 (0, 1, 2, 3, 4, . . . , 3g-2, 3g-1) are present in the following 6g values of $(b_{\#1,1}\%3g, b_{\#1,2}\%3g), (b_{\#2,1}\%3g, b_{\#2,2}\%3g), (b_{\#3,1}\%3g, b_{\#3,2}\%3g), \ldots, (b_{\#k,1}\%3g, b_{\#k,2}\%3g), \ldots, (b_{\#3g-2,1}\%3g, b_{\#3g-2,2}\%3g), (b_{\#3g-1,1}\%3g, b_{\#3g-1,2}\%3g)$ and $(b_{\#3g,1}\%3g, b_{\#3g,2}\%3g)$ (where k=1, 2, 3, . . . , 3g).

An LDPC-CC of a time varying period of g with good characteristics has been described above. When the above LDPC-CC is used for the erasure correction encoding section of Embodiment 1, it has been confirmed that the characteristics are further improved if there is no loop 4 (circular path (circulating path) starting from a certain node and ending at the node, having a length of 4) or no loop 6 (loop having a length of 6, also referred to as "girth 6") when a Tanner graph is drawn.

Also, for an LDPC-CC, it is possible to provide encoded data (codeword) by multiplying information vector n by generator matrix G. That is, encoded data (codeword) c can be represented as c=n×G. Here, generator matrix G is found based on parity check matrix H designed in advance. To be more specific, generator matrix G refers to a matrix satisfying $G \times H^T = 0$.

For example, a convolutional code of a coding rate of 1/2 and generator polynomial $G=[1 \ G_1(D)/G_0(D)]$ will be considered as an example. At this time, Gi represents a feed-forward polynomial and $G_0$ represents a feedback polynomial. If a polynomial representation of an information sequence (data) is X(D), and a polynomial representation of a parity sequence is P(D), a parity check polynomial is represented as shown in equation 21 below.

[21]

$$G_1(D)X(D)+G_0(D)P(D)=0 \qquad \text{(Equation 21)}$$

where D is a delay operator.

FIG. 18 shows information relating to a (7,5) convolutional code. A (7,5) convolutional code generator matrix is represented by $G=[1 \ (D^2+1)/(D^2+D+1)]$. Therefore, a parity check polynomial is as shown in equation 22 below.

[22]

$$(D^2+1)X(D)+(D^2+D+1)P(D)=0 \qquad \text{(Equation 22)}$$

Here, data at point in time i is represented by $X_i$, and parity part by Pi, and transmission sequence $W_i$ is represented by $W_i=(X_1, P_i)$. Then, transmission vector w is represented by $w=(X_1, P_1, X_2, P_2, \ldots, X_i, P_i \ldots)^T$. Thus, from equation 22, parity check matrix H can be represented as shown in FIG. 18. At this time, the relational equation in equation 23 below holds true.

$$Hw=0 \qquad \text{(Equation 23)}$$

Therefore, with parity check matrix H, the decoding side can perform decoding using BP (belief propagation) decoding, min-sum decoding which approximates BP decoding, offset BP decoding, normalized BP decoding, shuffled BP decoding, as shown in Non-Patent Literature 4 to Non-Patent Literature 9.

(Time-invariant/time varying LDPC-CCs (of a coding rate of (n-1)/n) based on a convolutional code (where n is a natural number))

An overview of time-invariant/time varying LDPC-CCs based on a convolutional code is given below.

A parity check polynomial represented as shown in equation 24 will be considered, with polynomial representations of a coding rate of R=(n-1)/n as information $X_1, X_2, \ldots, X_{n-1}$ as $X_1(D), X_2(D), \ldots, X_{n-1}(D)$, and a parity polynomial representation P as P(D).

[24]

$$(D^{a1,1}+D^{a1,2}+ \ldots +D^{a1,r1}+1)X_1(D)+(D^{a2,1}+ \\
D^{a2,2}+ \ldots +D^{a2,r2}+1)X_2(D)+ \ldots +(D^{an-1,1}+ \\
D^{an-1,2}+ \ldots +D^{an-1,r_{n-1}}+1)X_{n-1}(D)+D \ D^{b1}+ \\
D^{b2}+ \ldots +D^{bs}+1)P(D)=0 \qquad \text{(Equation 24)}$$

In equation 24, at this time, $a_{p,p}$ (where p=1, 2, . . . , n-1 and q=1, 2, . . . , rp) is, for example, a natural number, and satisfies the condition $a_{p,1} \neq a_{p,2} \neq \ldots \neq a_{p,rp}$. Also, $b_q$ (where q=1, 2, . . . , s) is a natural number, and satisfies the condition $b_1 \neq b_2 \neq \ldots \neq b_s$. A code defined by a parity check matrix based on a parity check polynomial of equation 24 at this time is called a time-invariant LDPC-CC here.

Here, m different parity check polynomials based on equation 24 are provided (where m is an integer equal to or greater than 2). These parity check polynomials are represented as shown below.

[25]

$$A_{X1,i}(D)X_1(D)+A_{X2,i}(D)X_2(D)+ \ldots +A_{Xn-1,i}(D)X_{n-1}(D)+B_i(D)P(D)=0 \quad \text{(Equation 25)}$$

In equation 25, i=0, 1, ..., m−1.

Then in equation 25, information $X_1, X_2, \ldots, X_{n-1}$ at point in time j is represented as $X_{1,j}, X_{2,j}, \ldots, X_{n-1,j}$, parity part P at point in time j is represented as $P_j$, and $u_j=(X_{1,j}, X_{2,j}, \ldots, X_{n-1,j}, P_j)^T$. At this time, information $X_{1,j}, X_{2,j}, \ldots, X_{n-1,j}$, and parity part $P_j$ at point in time j satisfy the parity check polynomial of equation 26.

[26]

$$A_{X1,k}(D)X_1(D)+A_{X2,k}(D)X_2(D)+ \ldots +A_{Xn-1,k}(D)X_{n-1}(D)+B_k(D)P(D)=0(k=j \bmod m) \quad \text{(Equation 26)}$$

where "j mod m" is the remainder after dividing j by m.

A code defined by a parity check matrix based on the parity check polynomial of equation 26 is called a time varying LDPC-CC here. At this time, the time-invariant LDPC-CC defined by the parity check polynomial of equation 24 and the time varying LDPC-CC defined by the parity check polynomial of equation 26 have a characteristic of enabling parity to be easily found sequentially by means of a register and exclusive OR.

Figure 19:
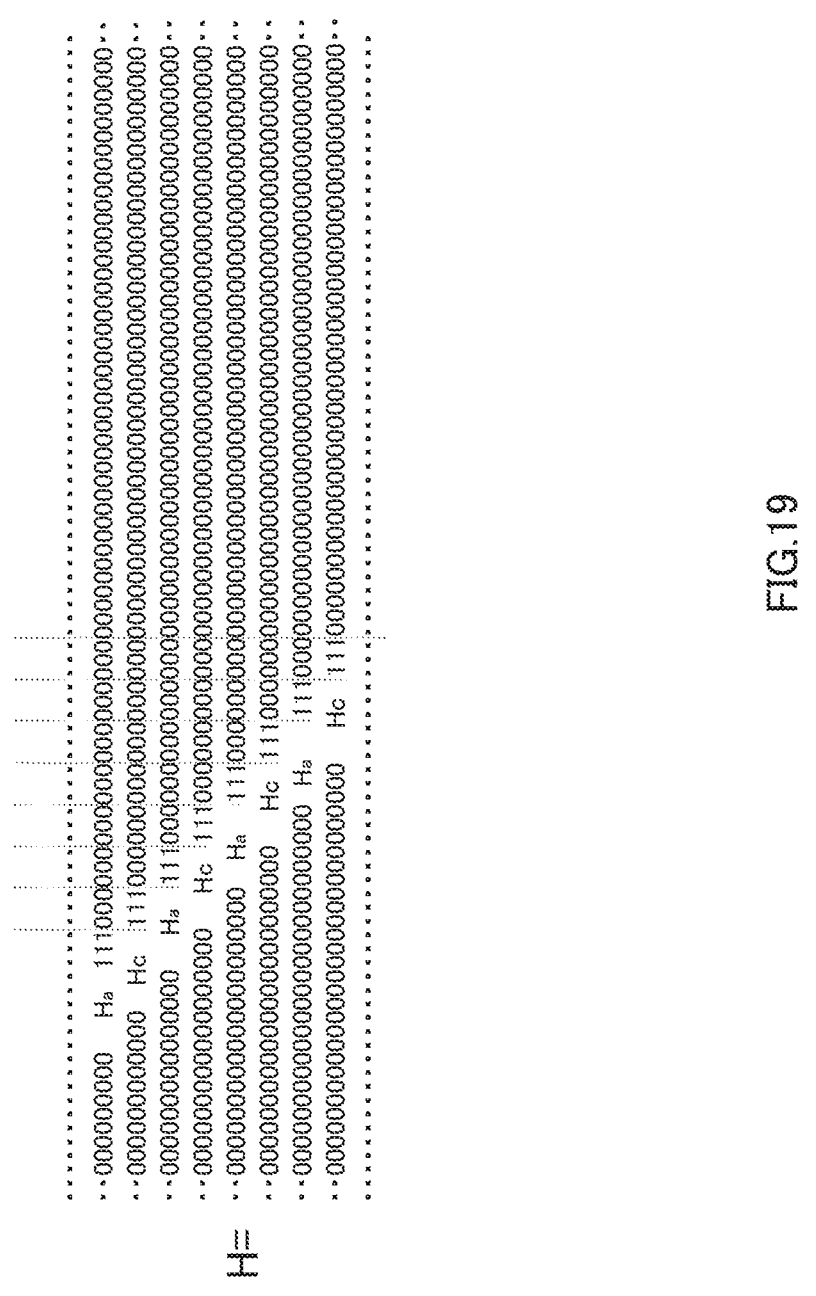

For example, the configuration of parity check matrix H of an LDPC-CC of a coding rate of 2/3 and of a time varying period of 2 based on equation 24 to equation 26 is shown in FIG. 19. Two different check polynomials of a time varying period of 2 based on equation 26 are designated "check equation #1" and "check equation #2." In FIG. 19, (Ha, 111) is a part corresponding to "check equation #1," and (Hc, 111) is a part corresponding to "check equation #2." Below, (Ha, 111) and (Hc, 111) are defined as sub-matrices.

Thus, LDPC-CC parity check matrix H of a time varying period of 2 of this proposal can be defined by a first sub-matrix representing a parity check polynomial of "check equation #1," and by a second sub-matrix representing a parity check polynomial of "check equation #2." Specifically, in parity check matrix H, a first sub-matrix and second sub-matrix are arranged alternately in the row direction. When the coding rate is 2/3, a configuration is employed in which a sub-matrix is shifted three columns to the right between an i'th row and (i+1)-th row, as shown in FIG. 19.

In the case of a time varying LDPC-CC of a time varying period of 2, an i'th row sub-matrix and an (i+1)-th row sub-matrix are different sub-matrices. That is to say, either sub-matrix (Ha, 11) or sub-matrix (Hc, 11) is a first sub-matrix, and the other is a second sub-matrix. If transmission vector u is represented as $u=(X_{1,0}, X_{2,0}, P_0, X_{i,1}, X_{2,1}, P_1, \ldots, X_{1,k}, X_{2,k}, P_k, \ldots)^T$, the relationship Hu=0 holds true.

Next, an LDPC-CC for which the time varying period is m is considered in the case of a coding rate of 2/3. In the same way as when the time varying period is 2, m parity check polynomials represented by equation 24 are provided. Then "check equation #1" represented by equation 24 is provided. "Check equation #2" to "check equation #m" represented by equation 24 are provided in a similar way. Data X and parity part P of point in time mi+1 are represented by $X_{mi+1}$ and $P_{mi+1}$ respectively, data X and parity part P of point in time mi+2 are represented by $X_{mi+2}$ and $P_{mi+2}$ respectively, ..., and data X and parity part P of point in time mi+m are represented by $X_{mi+m}$ and $P_{mi+m}$ respectively (where i is an integer).

Consider an LDPC-CC for which parity $P_{mi+1}$ of point in time mi+1 is found using "check equation #1," parity $P_{mi+2}$ of point in time mi+2 is found using "check equation #2," ..., and parity part $P_{mi+m}$ of point in time mi+m is found using "check equation #m." An LDPC-CC code of this kind provides the following advantages:

An encoder can be configured easily, and a parity part can be found sequentially.

Termination bit reduction and received quality improvement in puncturing upon termination can be expected.

Figure 20:
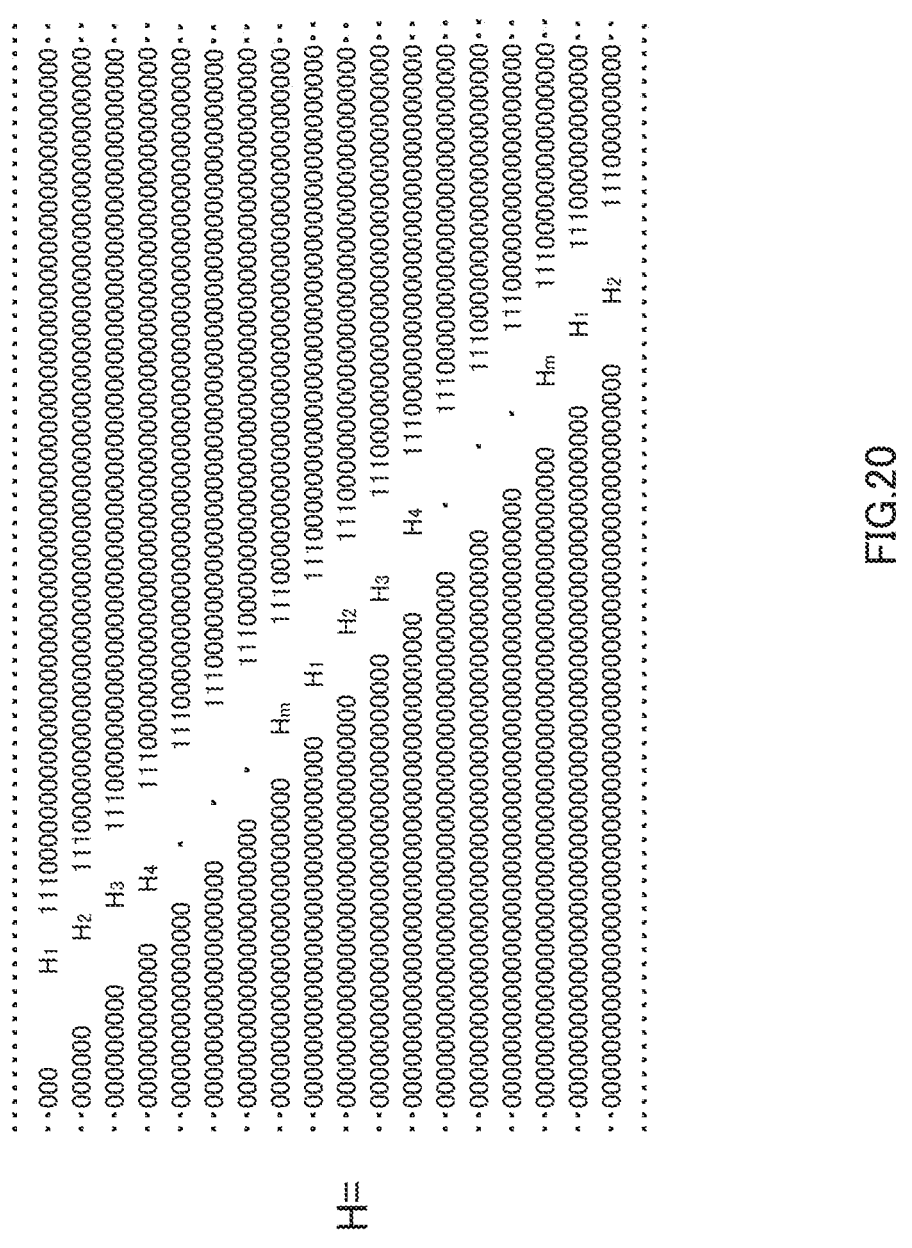

FIG. 20 shows the configuration of the above LDPC-CC parity check matrix of a coding rate of 2/3 and a time varying period of m. In FIG. 20, ($H_1$, 111) is a part corresponding to "check equation #1," ($H_2$, 111) is a part corresponding to "check equation #2," ..., and ($H_m$, 111) is a part corresponding to "check equation #m." Below, ($H_1$, 111) is defined as a first sub-matrix, ($H_2$, 111) is defined as a second sub-matrix, ..., and ($H_m$, 111) is defined as an m-th sub-matrix.

Thus, LDPC-CC parity check matrix H of a time varying period of m of this proposal can be defined by a first sub-matrix representing a parity check polynomial of "check equation #1," a second sub-matrix representing a parity check polynomial of "check equation #2," ..., and an m-th sub-matrix representing a parity check polynomial of "check equation #m." Specifically, parity check matrix H is configured such that first to m-th sub-matrix are arranged periodically in the row direction (see FIG. 20). When the coding rate is 2/3, a configuration is employed in which a sub-matrix is shifted three columns to the right between an i-th row and (i+1)-th row (see FIG. 20).

If transmission vector u is represented as $u=(X_{1,0}, X_{2,0}, P_0, X_{1,1}, X_{2,1}, P_1, \ldots X_{1,k}, X_{2,k}, P_k, \ldots)^T$, the relationship Hu=0 holds true.

In the above description, a case of a coding rate of 2/3 has been described as an example of a time-invariant/time varying LDPC-CC based on a convolutional code of a coding rate of (n−1)/n, but a time-invariant/time varying LDPC-CC parity check matrix based on a convolutional code of a coding rate of (n−1)/n can be created by thinking in a similar way.

The representation method of an LDPC-CC of a time varying period of m using numerical formulas handled in the present specification and the relationship between a parity check polynomial and a parity check matrix will be described again in Embodiment 5.

That is to say, in the case of a coding rate of 2/3, in FIG. 20, ($H_1$, 111) is a part (first sub-matrix) corresponding to "check equation #1," ($H_2$,111) is a part (second sub-matrix) corresponding to "check equation #2," ..., and ($H_m$,111) is a part (m-th sub-matrix) corresponding to "check equation #m," while, in the case of a coding rate of (n−1)/n, the situation is as shown in FIG. 21. That is to say, a part (first sub-matrix) corresponding to "check equation #1" is represented by ($H_1$, 11 ... 1), and a part (k-th sub-matrix) corresponding to "check equation #k" (where k=2, 3, ..., m) is represented by ($H_k$, 11 ... 1). At this time, the number of 1's of parts excluding $H_k$ in the k-th sub-matrix is n. Also, in parity check matrix H, a configuration is employed in which a sub-matrix is shifted n columns to the right between an i'th row and (i+1)-th row (see FIG. 21).

If transmission vector u is represented as $u=(X_{1,0}, X_{2,0}, \ldots, X_{n-1,0}, P_0, X_{1,1}, X_{2,1}, \ldots, X_{n-1,1}, P_1, \ldots, X_{1,k}, X_{2,k}, \ldots, X_{n-1,k}, P_k, \ldots)^T$, the relationship Hu=0 holds true.

Figure 22:
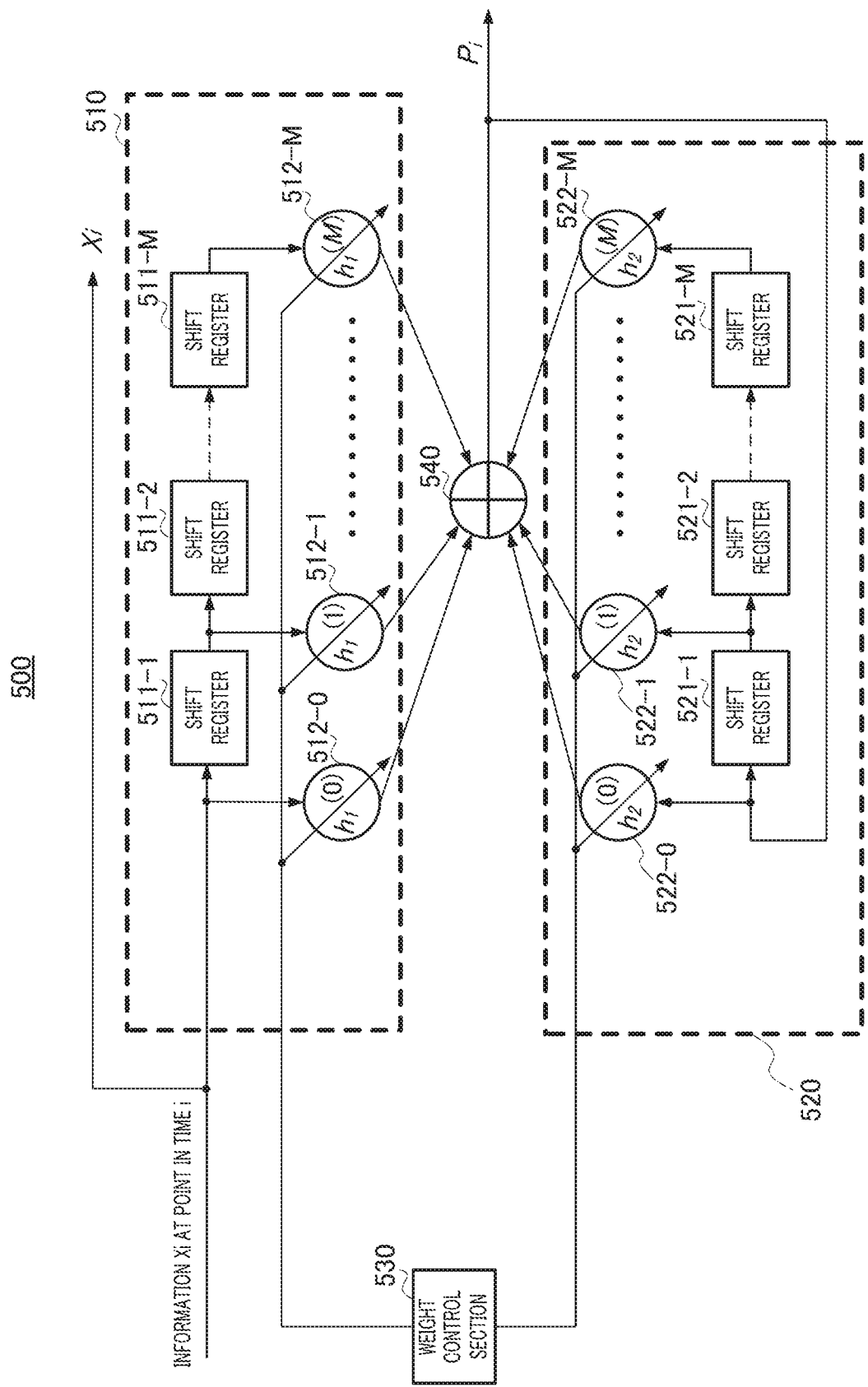
FIG. 22 is a diagram illustrating an example of the configuration of an LDPC-CC encoding section.

FIG. 22 shows an example of the configuration of an LDPC-CC encoder when the coding rate is R=1/2. As shown in FIG. 22, LDPC-CC encoder 500 is provided mainly with data computing section 510, parity computing section 520, weight control section 530, and mod 2 adder 140.

Data computing section 510 is provided with shift registers 511-1 to 511-M and weight multipliers 512-0 to 512-M.

Parity computing section 520 is provided with shift registers 521-1 to 521-M and weight multipliers 522-0 to 522-M.

Shift registers 111-1 to 111-M and 521-1 to 521-M are registers storing $v_{1,t-i}$ and $v_{2,t-i}$ (where i=0, . . . , M) respectively, and, at a timing at which the next input comes in, send a stored value to the adjacent shift register to the right, and store a new value sent from the adjacent shift register to the left. The initial state of the shift registers is all-zeros.

Weight multipliers 512-0 to 512-M and 522-0 to 522-M switch values of $h_1^{(m)}$ and $h_2^{(m)}$ to 0 or 1 in accordance with a control signal outputted from weight control section 530.

Based on a parity check matrix stored internally, weight control section 530 outputs values of $h_1^{(m)}$ and $h_2^{(m)}$ at that timing, and supplies them to weight multipliers 512-0 to 512-M and 522-0 to 522-M.

Mod 2 adder 540 adds all mod 2 computation results to the outputs of weight multipliers 512-0 to 512-M, 522-0 to 522-M, and calculates $v_{2,t}$.

By employing this kind of configuration, LDPC-CC encoder 500 can perform LDPC-CC encoding in accordance with a parity check matrix.

If the arrangement of rows of a parity check matrix stored by weight control section 530 differs on a row-by-row basis, LDPC-CC encoder 500 is a time varying convolutional encoder. Also, in the case of an LDPC-CC of a coding rate of (q−1)/q, a configuration needs to be employed in which (q−1) data computing sections 510 are provided and mod 2 adder 540 performs mod 2 addition of the outputs of weight multipliers.

Embodiment 3

Embodiment 2 has described an LDPC-CC having good characteristics. The present embodiment will describe a shortening method that makes a coding rate variable when the LDPC-CC described in Embodiment 2 is applied to a physical layer. "Shortening" refers to generating a code of a second coding rate from a code of a first coding rate (first coding rate > second coding rate). Hereinafter, a shortening method of generating an LDPC-CC of a coding rate of 1/3 from an LDPC-CC of a coding rate of 1/2 will be described as an example.

FIG. 23 shows an example of check equations of an LDPC-CC of a coding rate of 1/2 and parity check matrix H. The LDPC-CC of a coding rate of 1/2 shown in FIG. 23 is an example of the LDPC-CC of a time varying period of 3 having good characteristics described in Embodiment 1 and parity check matrix H is made up of equations 27-1 to equation 27-3.

[27]

$(D^{a1}+D^{a2}+D^{a3})X(D)+(D^{b1}+D^{b2}+D^{b3})P(D)=(D^2+D^1+1)X(D)+(D^2+D^1+1)P(D)=0$ (Equation 27-1)

$(D^{A1}+D^{A2}+D^{A3})X(D)+(D^{B1}+D^{B2}+D^{B3})P(D)=(D^5+D^1+1)X(D)+(D^5+D^1+1)P(D)=0$ (Equation 27-2)

$(D^{\alpha1}+D^{\alpha2}+D^{\alpha3})X(D)+(D^{\beta1}+D^{\beta2}+D^{\beta3})P(D)=(D^4+D^2+1)X(D)+(D^4+D^2+1)P(D)=0$ (Equation 27-3)

Therefore, equations 27-1 to 27-3 satisfy the condition relating to "remainder" (remainder rule) that "when k is designated as a remainder after dividing the values of combinations of degrees of X(D) and P(D), (a1, a2, a3), (b1, b2, b3), (A1, A2, A3), (B1, B2, B3), (α1, α2, α3), (β1, β2, β3), in equations 27-1 to 27-3 by 3, provision is made for one each of remainders 0, 1, and 2 to be included in three-coefficient sets represented as shown above (for example, (a1, a2, a3)), and to hold true with respect to all of the above three-coefficient sets."

In FIG. 23, suppose the information and parity part at time i are represented by Xi and Pi respectively. If codeword $w=(X0, P0, X1, P1, \ldots, Xi, Pi, \ldots)^T$ is assumed, parity check matrix H and codeword w in FIG. 23 satisfy equation 23. In this case, frame 601 in FIG. 23 shows codeword w corresponding to columns of parity check matrix H. That is, codeword w has the correspondence with columns of parity check matrix H as $(\ldots, X_{3k}, P_{3k}, X_{3k+1}, P_{3k+1}, X_{3k+2}, P_{3k+2}, X_{3(k+1)}, P_{3(k+1)}, X_{3(k+1)+1}, P_{3(k+1)+1}, \ldots)$.

Hereinafter, a shortening method for realizing a coding rate of 1/3 from an LDPC-CC of a coding rate of 1/2 in a physical layer will be described.

[Method #1-1]

The shortening method inserts known information (e.g., 0's) into information X on a regular basis. For example, known information is inserted into 3 k bits of 6 k bits of information and encoding is applied to the information of 6k bits including known information using an LDPC-CC of a coding rate of 1/2. A parity part of 6k bits is generated in this way. In this case, the 3k bits of known information out of the information 6k bits are assumed to be bits not to transmit. This allows a coding rate of 1/3 to be realized.

The known information is not limited to 0, but may be 1 or any predetermined value other than 1, and needs only to be reported to the communication apparatus which is the communicating party in advance or determined as a specification.

[Method #1-2]

As shown in FIG. 24, the shortening method assumes 3×2×2k bits made up of information and parity part as one period and inserts known information at each period according to a similar rule (insertion rule). "Inserting known information according to a similar rule (insertion rule)" means inserting known information (e.g., 0 (or 1 or a predetermined value)) in X0, X2, X4 in the first one period when 12 bits made up of information and parity part are assumed to be one period as shown in FIG. 25. Positions at which known information is inserted at each period are equalized such that known information (e.g., 0 (or 1 or a predetermined value)) is inserted in X6, X8, X10 at the next one period, . . . , and known information is inserted in X6i, X6i+2, X6i+4 at an i-th one period.

In the same way as with [method #1-1], for example, known information is inserted in 3k bits of the information 6k bits, encoding is applied to the information of 6k bits including known information using an LDPC-CC of a coding rate of 1/2, and a parity part of 6k bits is thereby generated. In this case, if known information of 3k bits is assumed to be bits not to transmit, a coding rate of 1/3 can be realized. Hereinafter, the relationship between positions at which known information is inserted and error correction capability will be described using FIG. 26A.

Figure 26A:
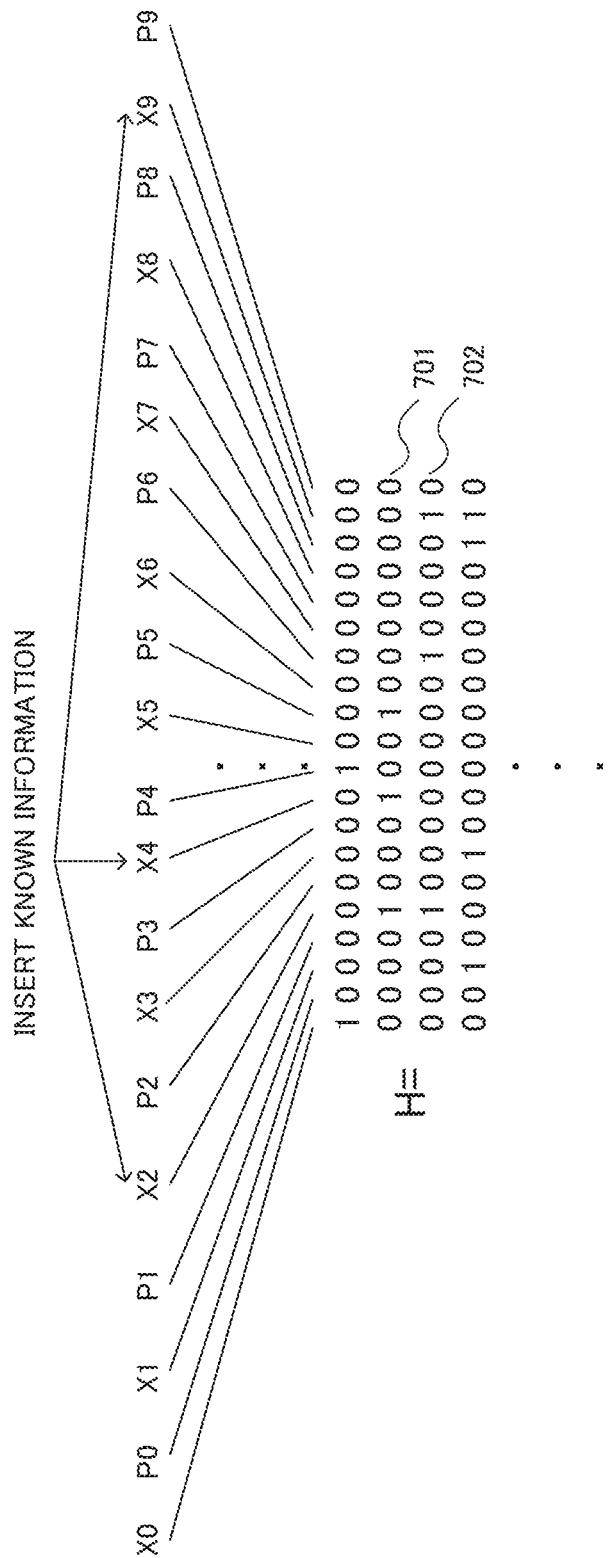
FIG. 26A is a diagram illustrating a relationship between a position at which known information is inserted and error correction capability.

FIG. 26A shows the correspondence between a part of parity check matrix H and codeword w (X0, P0, X1, P1, X2, P2, . . . , X9, P9). Elements "1" are arranged in columns corresponding to X2 and X4 in row 701 in FIG. 26A. Furthermore, elements "1" are arranged in columns corresponding to X2 and X9 in row 702 in FIG. 26A. Therefore, when known information is inserted in X2, X4 and X9, all information corresponding to columns whose elements are "1" is known in row 701 and row 702. Thus, unknown values only correspond to parity part in row 701 and row 702, and it is thereby possible to update a log likelihood ratio with high reliability in row computation in BP decoding.

That is, when realizing a coding rate smaller than the original coding rate by inserting known information, it is important, from the standpoint of obtaining high error correction capability, to increase the number of rows, all of which correspond to known information or rows, a large number of which correspond to known information (e.g., all bits except one bit correspond to known information) of the information out of the parity part and information in each row of a parity check matrix, that is, parity check polynomial.

In the case of a time-varying LDPC-CC, since there is regularity in a pattern of parity check matrix H in which elements "1" are arranged, and therefore by inserting known information on a regular basis at each period based on parity check matrix H, it is possible to increase the number of rows in which unknown values only correspond to parity or rows with fewer unknown information bits, and thereby obtain an LDPC-CC of a coding rate of 1/3 providing good characteristics.

According to following [method #1-3], it is possible to realize an LDPC-CC having high error correction capability, a coding rate of 1/3 and a time varying period of 3 from the LDPC-CC having good characteristics, a coding rate of 1/2, and a time varying period of 3 described in Embodiment 2.

The shortening method will be described below which realizes a coding rate of 1/3 from an LDPC-CC of a coding rate of 1/2 and a time varying period of 3 represented by equations 3-1 to 3-3 that satisfy the condition relating to "remainder" (remainder rule) that "when k is designated as a remainder after dividing the values of combinations of degrees of X(D) and P(D), (a1, a2, a3), (b1, b2, b3), (A1, A2, A3), (B1, B2, B3), ($\alpha$1, $\alpha$2, $\alpha$3), ($\beta$1, $\beta$2, $\beta$3), in equations 3-1 to 3-3 by 3, provision is made for one each of remainders 0, 1, and 2 to be included in three-coefficient sets represented as shown above (for example, (a1, a2, a3)), and to hold true with respect to all of the above three-coefficient sets."

[Method #1-3]

The shortening method inserts known information (e.g., 0 (or 1 or a predetermined value)) in 3k Xj's (where j takes any value of 6i to 6(i+k-1)+5, and there are 3k different values) out of 6k bits of information $X_{6i}$, $X_{6i+1}$, $X_{6i+2}$, $X_{6i+3}$, $X_{6i+4}$, $X_{6i+5}$, . . . , $X_{6(i+k-1)}$), $X_{6(i+k-1)+1}$, $X_{6(i+k-1)+2}$, $X_{6(i+k-1)+3}$, $X_{6(i+k-1)+4}$, $X_{6(i+k-1)+5}$ at periods of 3×2×2k bits made up of information and parity part.

In this case, when known information is inserted in 3k Xj's, provision is made such that, of the remainders after dividing 3k different j's by 3, the number of remainders which become 0 is k, the number of remainders which become 1 is k and the number of remainders which become 2 is k.

By this means, by providing a condition for positions at which known information is inserted, it is possible to increase, as much as possible, the number of rows in which all information is known information or rows having many pieces of known information (e.g., all bits except one bit correspond to known information) in each row of parity check matrix H, that is, a parity check polynomial. This will be described below.

It is assumed that the LDPC-CC of a coding rate of 1/2 and a time varying period of 3 shown in equations 3-1 to 3-3 is designed based on a condition relating to "remainder" (remainder rule). That is, assume that equations 3-1 to 3-3 satisfy the condition relating to "remainder" (remainder rule) that "when k is designated as a remainder after dividing the values of combinations of degrees of X(D) and P(D), (a1, a2, a3), (b1, b2, b3), (A1, A2, A3), (B1, B2, B3), ($\alpha$1, $\alpha$2, $\alpha$3), ($\beta$1, $\beta$2, $\beta$3), in equations 3-1 to 3-3 by 3, provision is made for one each of remainders 0, 1, and 2 to be included in three-coefficient sets represented as shown above (for example, (a1, a2, a3)), and to hold true with respect to all of the above three-coefficient sets."

FIG. 26B shows the correspondence between a parity check matrix of an LDPC-CC of a coding rate of 1/2 and a time varying period of 3 that satisfies the above remainder rule and points in time. The parity check matrix in FIG. 26B is an example where check equation #1 is parity check polynomial 27-1, check equation #2 is parity check polynomial 27-2 and check equation #3 is parity check polynomial 27-3.

As shown in FIG. 26B, elements corresponding to information at point in time j, point in time (j−1) and point in time (j−2) in equation 27-1 are 1's. Therefore, 0, 1 and 2 are present at points in time at which elements "1" in equation 27-1 are present, that is, in remainders after dividing values of (j, (j−1), (j−2)) by 3, regardless of the value of j. 0, 1 and 2 are present in the remainders after dividing values of (j, (j−1), (j−2)) by 3, regardless of the value of j in this way because equation 27-1 satisfies the above remainder rule.

Similarly, since parity check polynomial 27-2 also satisfies the above remainder rule, 0, 1 and 2 are present at points in time at which elements "1" in equation 27-2 are present, that is, in remainders after dividing values of (j, (j−1), (j−5)) by 3, regardless of the value of j.

Similarly, since parity check polynomial 27-3 also satisfies the above remainder rule, 0, 1 and 2 are present at points in time at which elements "1" in equation 27-3 are present, that is, in remainders after dividing values of (j, (j−2), (j−4)) by 3, regardless of the value of j.

As described above, in parity check matrix H, the greater the number of rows in which all information corresponding to columns whose elements are 1's becomes known information or information corresponding to columns whose elements are 1's becomes known information, the higher is the reliability with which a high log likelihood ratio can be updated in row computation in BP decoding. Therefore, when realizing a coding rate of 1/3 by inserting known information in 3k bits of information 6k bits in a period of 3×2×2k bits made up of information and parity part, when information at point in time j is represented by Xj, if the number of remainders after dividing j by 3 which become 0, the number of remainders which become 1 and the number of remainders which become 2 are the same, it is possible, when the characteristics of above equations 27-1, 27-2 and 27-3 are taken into account, to increase the number of rows in which all information corresponding to columns whose elements are 1's becomes known information or rows in which information corresponding to columns whose elements are 1's becomes known information.

Thus, the insertion rule according to [method #1-3] focusing on the number of remainders is important in creating an LDPC-CC of a coding rate of 1/3 and a time varying period of 3 having high error correction capability from an LDPC-CC of a coding rate of 1/2 and a time varying period of 3 created based on the remainder rule.

This will be described returning to FIG. 25 again. As shown in FIG. 25, assuming 3×2×2×1 bits (that is, k=1) to be one period, consider a case where known information (e.g., 0 (or 1 or a predetermined value)) is inserted in $X_{6i}$, $X_{6i+2}$, $X_{6i+4}$ of information and parity part $X_{6i}$, $P_{6i}$, $X_{6i+1}$, $P_{6i+1}$, $X_{6i+2}$, $P_{6i+2}$, $X_{6i+3}$, $P_{6i+3}$, $X_{6i+4}$, $P_{6i+4}$, $X_{6i+5}$, $P_{6i+5}$.

In this case, as j of Xj in which known information is inserted, there are three different values of 6i, 6i+2 and 6i+4. In this case, the remainder after dividing 6i by 3 is 0, the remainder after dividing 6i+2 by 3 is 2 and the remainder after dividing 6i+4 by 3 is 1. Therefore, the number of remainders which become 0 is 1, the number of remainders which become 1 is 1 and the number of remainders which become 2 is 1, which satisfies the insertion rule of above [method #1-3]. Thus, the example shown in FIG. 25 can be said to be an example satisfying the insertion rule of above [method #1-3].

On the other hand, when the insertion rule of above [method #1-3] is not satisfied as described above, the number of rows in which unknown values only correspond to parity part decreases. Thus, the insertion rule of [method #1-3] becomes important in shortening an LDPC-CC of a coding rate of 1/2 that satisfies the condition relating to "remainder" (remainder rule) and acquiring an LDPC-CC of a coding rate of 1/3 and having good characteristics.

Next, a shortening method will be described which realizes a coding rate smaller than coding rate (n−1)/n from the LDPC-CC of a coding rate (n−1)/n (n is an integer equal to or greater than 2) and a time varying period of 3 described in Embodiment 2.

An overview of an LDPC-CC of a coding rate of (n−1)/n and a time varying period of 3 capable of obtaining good characteristics is given below.

Consider above equations 4-1 to 4-3 as parity check polynomials of an LDPC-CC for which the coding rate is (n−1)/n and the time varying period is 3. In this case, $X_1(D)$, $X_2(D)$, . . . , $X_{n-1}(D)$ is a polynomial representation of data (information) $X_1$, $X_2$, . . . , $X_{n-1}$ and P(D) is a parity polynomial representation. Here, in equations 4-1 to 4-3, parity check polynomials are assumed such that there are three terms in $X_1(D)$, $X_2(D)$, . . . , $X_{n-1}(D)$ and P(D) respectively.

In equation 4-1, it is assumed that $a_{i,1}$, $a_{i,2}$, and $a_{i,3}$ (where i=1, 2, . . . , n−1) are integers (where $a_{i,1} \neq a_{i,2} \neq a_{i,3}$). Also, it is assumed that b1, b2 and b3 are integers (where b1≠b2≠b3). A parity check polynomial of equation 4-1 is called "check equation #1." A sub-matrix based on the parity check polynomial of equation 4-1 is designated first sub-matrix $H_1$.

Furthermore, in equation 4-2, it is assumed that $A_{i,1}$, $A_{i,2}$, and $A_{i,3}$ (where i=1, 2, . . . , n−1) are integers (where $A_{i,1} \neq A_{i,2} \neq A_{i,3}$). Also, it is assumed that B1, B2 and B3 are integers (where B1≠B2≠B3). A parity check polynomial of equation 4-2 is called "check equation #2." A sub-matrix based on the parity check polynomial of equation 4-2 is designated second sub-matrix $H_2$.

Furthermore, in equation 4-3, it is assumed that $\alpha_{i,1}$, $\alpha_{i,2}$, $\alpha_{i,3}$ (where i=1, 2, . . . , n−1) are integers (where $\alpha_{i,1} \neq \alpha_{i,2} \neq \alpha_{i,3}$). Also, it is assumed that β1, β2 and β3 are integers (where β1≠β2≠β3). A parity check polynomial of equation 4-3 is called "check equation #3." A sub-matrix based on the parity check polynomial of equation 4-3 is designated third sub-matrix $H_3$.

Next, an LDPC-CC of a time varying period of 3 generated from first sub-matrix $H_1$, second sub-matrix $H_2$ and third sub-matrix $H_3$ is considered.

At this time, if k is designated as a remainder after dividing the values of combinations of degrees of $X_1(D)$, $X_2(D)$, . . . , $X_{n-1}(D)$, and P(D), $(a_{1,1}, a_{1,2}, a_{1,3})$, $(a_{2,1}, a_{2,2}, a_{2,3})$, . . . , $(a_{n-1,1}, a_{n-1,2}, a_{n-1,3})$, (b1, b2, b3), $(A_{1,1}, A_{1,2}, A_{1,3})$, $(A_{2,1}, A_{2,2}, A_{2,3})$, . . . , $(A_{n-1,1}, A_{n-1,2}, A_{n-1,3})$, (B1, B2, B3), $(\alpha_{i,1}, \alpha_{1,2}, \alpha_{1,3})$, $(\alpha_{2,1}, \alpha_{2,2}, \alpha_{2,3})$, . . . , $(\alpha_{n-1,1}, \alpha_{n-1,2}, \alpha_{n-1,3})$, (β1, β2, β3), in equations 4-1 to 4-3 by 3, provision is made for one each of remainders 0, 1, and 2 to be included in three-coefficient sets represented as shown above (for example, $(a_{1,1}, a_{1,2}, a_{1,3})$), and to hold true with respect to all of the above three-coefficient sets.

That is to say, provision is made for $(a_{1,1}\%3, a_{1,2}\%3, a_{1,3}\%3)$, $(a_{2,1}\%3, a_{2,2}\%3, a_{2,3}\%3)$, . . . , $(a_{n-1,1}\%3, a_{n-1,2}\%3, a_{n-1,3}\%3)$, (b1%3, b2%3, b3%3), $(A_{1,1}\%3, A_{1,2}\%3, A_{1,3}\%3)$, $(A_{2,1}\%3, A_{2,2}\%3, A_{2,3}\%3)$, . . . , $(A_{n-1,1}\%3, A_{n-1,2}\%3, A_{n-1,3}\%3)$, (B1%3, B2%3, B3%3), $(\alpha_{1,1}\%3, \alpha_{1,2}\%3, \alpha_{1,3}\%3)$, $(\alpha_{2,1}\%3, \alpha_{2,2}\%3, \alpha_{2,3}\%3)$, . . . , $(\alpha_{n-1,1}\%3, \alpha_{n-1,2}\%3, \alpha_{n-1,3}\%3)$ and (β1%3, β2%3, β3%3) to be any of the following: (0, 1, 2), (0, 2, 1), (1, 0, 2), (1, 2, 0), (2, 0, 1), (2, 1, 0).

Generating an LDPC-CC in this way enables a regular LDPC-CC code to be generated. Furthermore, when BP decoding is performed, belief in "check equation #2" and belief in "check equation #3" are propagated accurately to "check equation #1," belief in "check equation #1" and belief in "check equation #3" are propagated accurately to "check equation #2," and belief in "check equation #1" and belief in "check equation #2" are propagated accurately to "check equation #3." Consequently, an LDPC-CC with better received quality can be obtained in the same way as in the case of a coding rate of 1/2.

The shortening method for realizing a coding rate smaller than a coding rate of (n−1)/n having high error correction capability using the above LDPC-CC of a coding rate of (n−1)/n and a time varying period of 3 is as shown below.

[Method #2-1]

The shortening method inserts known information (e.g., 0 (or 1 or a predetermined value)) in information X on a regular basis.

[Method #2-2]

As shown in FIG. 27, the shortening method assumes 3×n×k bits made up of information and parity part as one period and inserts known information at each period in accordance with a similar rule (insertion rule). "Inserting known information in accordance with a similar rule (insertion rule)" at each period is as described in above [method #1-2] using FIG. 25.

[Method #2-3]

The shortening method selects Z bits from 3×n×k bits of information $X_{0,3i}, X_{1,3i}, X_{2,3i}, \ldots, X_{n-1,3i}, \ldots, X_{0,3(i+k-1)+2}$, $X_{1,3(i+k-1)+2}, X_{2,3(i+k-1)+2}, \ldots, X_{n-1,3(i+k-1)+2}$ at a period of 3×n×k bits made up of information and parity part and inserts known information (e.g., 0 (or 1 or a predetermined value)) in the selected Z bits.

In this case, the shortening method calculates remainders after dividing $X_{0,j}$ (where j takes a value of any of 3i to 3(i+k−1)+2) into which known information is inserted by 3 for all j's. Then, provision is made such that the difference between the number of remainders which become 0 and the number of remainders which become 1 is 1 or less, the difference between the number of remainders which become 0 and the number of remainders which become 2 is 1 or less and the difference between the number of remainders which become 1 and the number of remainders which become 2 is 1 or less.

Similarly, the shortening method calculates remainders after dividing $X_{1,j}$ (where j takes a value of any of 3i to 3(i+k−1)+2) into which known information is inserted by 3 for all j's. Then, provision is made such that the difference between the number of remainders which become 0 and the number of remainders which become 1 is 1 or less, the difference between the number of remainders which become 0 and the number of remainders which become 2 is 1 or less and the difference between the number of remainders which become 1 and the number of remainders which become 2 is 1 or less.

Similarly, the shortening method calculates remainders after dividing $X_{h,j}$ (where j takes a value of any of 3i to 3(i+k−1)+2) into which known information is inserted by 3 for all j's. Then, provision is made such that the difference between the number of remainders which become 0 and the number of remainders which become 1 is 1 or less, the difference between the number of remainders which become 0 and the number of remainders which become 2 is 1 or less and the difference between the number of remainders which become 1 and the number of remainders which become 2 is 1 or less (h=1, 2, 3, . . . , n−1).

By providing a condition for positions at which known information is inserted in this way, it is possible to generate more "rows in which unknown values only correspond to parity part and with fewer information bits" in parity check matrix H in the same way as with [method #1-3] and thereby realize a coding rate smaller than a coding rate of (n−1)/n having high error correction capability using the aforementioned LDPC-CC of a coding rate of (n−1)/n and a time varying period of 3 having good characteristics.

A case has been described in [method #2-3] where the number of pieces of known information inserted is the same at all periods, but the number of pieces of known information inserted may vary from one period to another. For example, as shown in FIG. 28, $N_0$ pieces of information may be designated known information at a first period, $N_1$ pieces of information may be designated known information at the next period and Ni pieces of information may be designated known information at an i-th period. Thus, when the number of pieces of known information inserted differs from one period to another, the concept of "period" holds no valid meaning. According to the shortening method, when [method #2-3] is represented without using the concept of "period," it is represented as [method #2-4].

[Method #2-4]

This method selects Z bits from a bit sequence of information $X_{0,0}$, $X_{1,0}$, $X_{2,0}$, . . . , $X_{n-1,0}$, . . . , $X_{0,v}$, $X_{1,v}$, $X_{2,v}$, . . . , $X_{n-1,v}$ in a data sequence made up of information and parity part and inserts known information (e.g., 0 (or 1 or a predetermined value)) into the selected Z bits.

In this case, the shortening method calculates a remainder after dividing $X_{0,j}$ (where j takes a value of any of 0 to v) into which known information is inserted by 3 for all j's. Then, provision is made such that the difference between the number of remainders which become 0 and the number of remainders which become 1 is 1 or less, the difference between the number of remainders which become 0 and the number of remainders which become 2 is 1 or less and the difference between the number of remainders which become 1 and the number of remainders which become 2 is 1 or less.

Similarly, the shortening method calculates remainders after dividing $X_{1,j}$ (where j takes a value of any of 0 to v) into which known information is inserted by 3 for all j's. Then, provision is made such that the difference between the number of remainders which become 0 and the number of remainders which become 1 is 1 or less, the difference between the number of remainders which become 0 and the number of remainders which become 2 is 1 or less and the difference between the number of remainders which become 1 and the number of remainders which become 2 is 1 or less.

Similarly, the shortening method calculates remainders after dividing $X_{h,j}$ (where j takes a value of any of 0 to v) into which known information is inserted by 3 for all j's. Then, provision is made such that the difference between the number of remainders which become 0 and the number of remainders which become 1 is 1 or less, the difference between the number of remainders which become 0 and the number of remainders which become 2 is 1 or less and the difference between the number of remainders which become 1 and the number of remainders which become 2 is 1 or less (h=1, 2, 3, . . . , n−1).

By providing a condition for positions at which known information is inserted in this way, it is possible to generate more "rows in which unknown values correspond to parity part and with fewer information bits" in parity check matrix H even when the number of bits of known information inserted differs from one period to another (or, when there is no such concept as "period") in the same way as with [method #2-3] and thereby realize a coding rate smaller than a coding rate of (n−1)/n having high error correction capability using the aforementioned LDPC-CC of a coding rate of (n−1)/n and a time varying period of 3 having good characteristics.

The shortening method described so far is a shortening method which makes a coding rate variable in the physical layer. For example, a communication apparatus inserts information known to a communicating party, performs encoding at a coding rate of 1/2 on information including known information and generates parity bits. The communication apparatus then transmits not the known information but information other than the known information and the parity bits obtained, and thereby realizes a coding rate of 1/3.

An LDPC-CC of a time varying period of 3 has been described above as an example, but it is possible to realize an error correction method having high error correction capability also for the LDPC-CCs of a time varying period of 3g (g=1, 2, 3, 4, . . . ) having good characteristics described in Embodiment 2 (that is, LDPC-CCs whose time varying period is multiples of 3) in the same way as the LDPC-CCs of a time varying period of 3 by satisfying above [method #1-1] to [method #1-3] or [method #2-1] to [method #2-4].

Figure 29A:
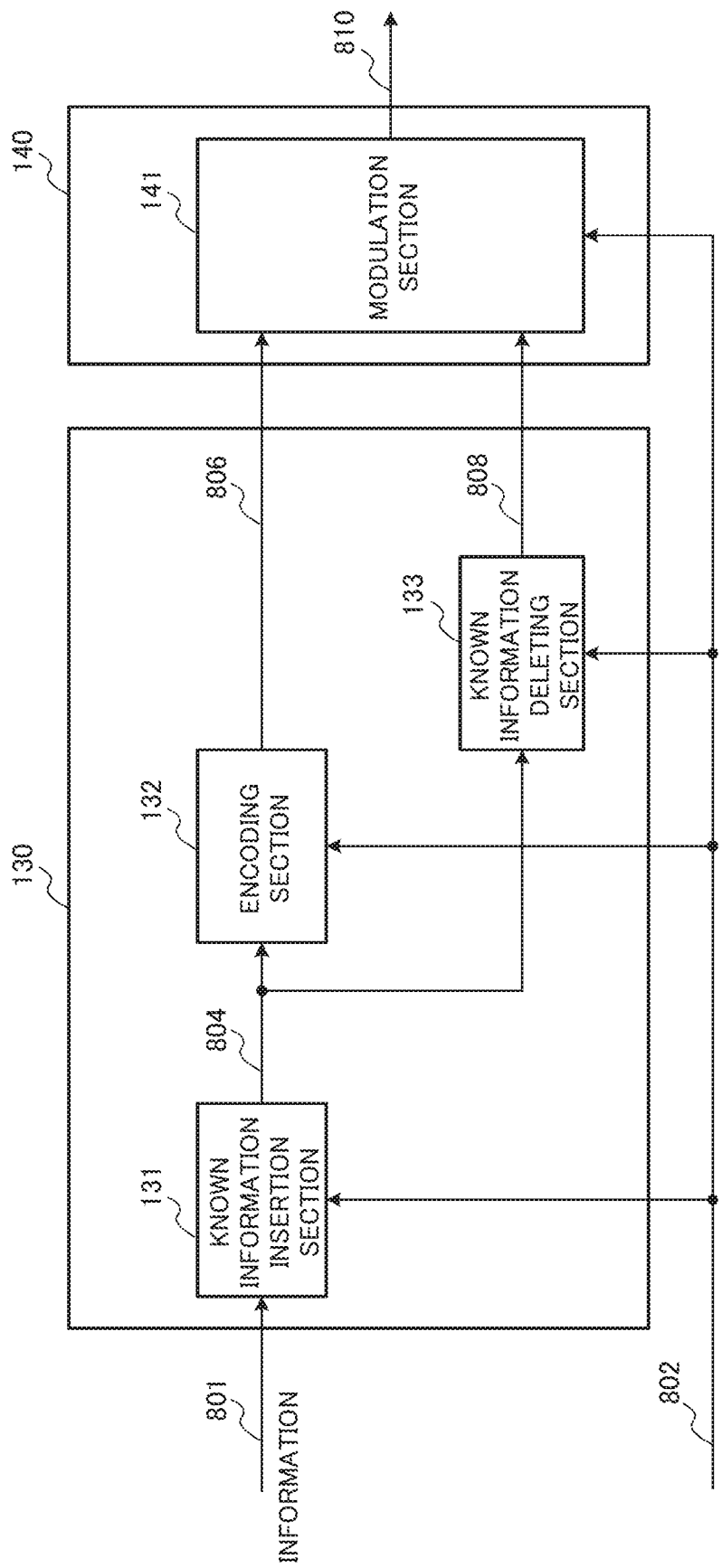
FIG. 29A is a block diagram illustrating an example of the configuration of a coding-related portion when the coding rate in a physical layer is made variable.

FIG. 29A is a block diagram illustrating an example of the configuration relating to encoding when a coding rate in a physical layer is made variable.

Known information insertion section 131 receives information 801 and control signal 802 as input and inserts known information according to information of a coding rate included in control signal 802. To be more specific, when the coding rate included in control signal 802 is smaller than a coding rate supported by encoder 132 and requires shortening, known information insertion section 131 inserts known information according to the above shortening method and outputs information 804 after inserting the known information. On the other hand, when the coding rate included in control signal 802 is equal to the coding rate supported by encoder 132 and requires no shortening, known information insertion section 131 does not insert known information and outputs information 801 as information 804 as is.

Encoder 132 receives information 804 and control signal 802 as input, performs encoding on information 804, generates parity part 806 and outputs parity part 806.

Known information deleting section 133 receives information 804 and control signal 802 as input, deletes, when known information is inserted by known information insertion section 131, the known information from information 804 based on information on a coding rate included in control signal 802 and outputs information 808 after the deletion. On the other hand, when known information is not inserted by known information insertion section 131, known information deleting section 133 outputs information 804 as information 808 as is.

Modulation section 141 receives parity part 806, information 808 and control signal 802 as input, modulates parity part 806 and information 808 based on information of a modulation scheme included in control signal 802, and generates and outputs baseband signal 810.

Figure 29B:
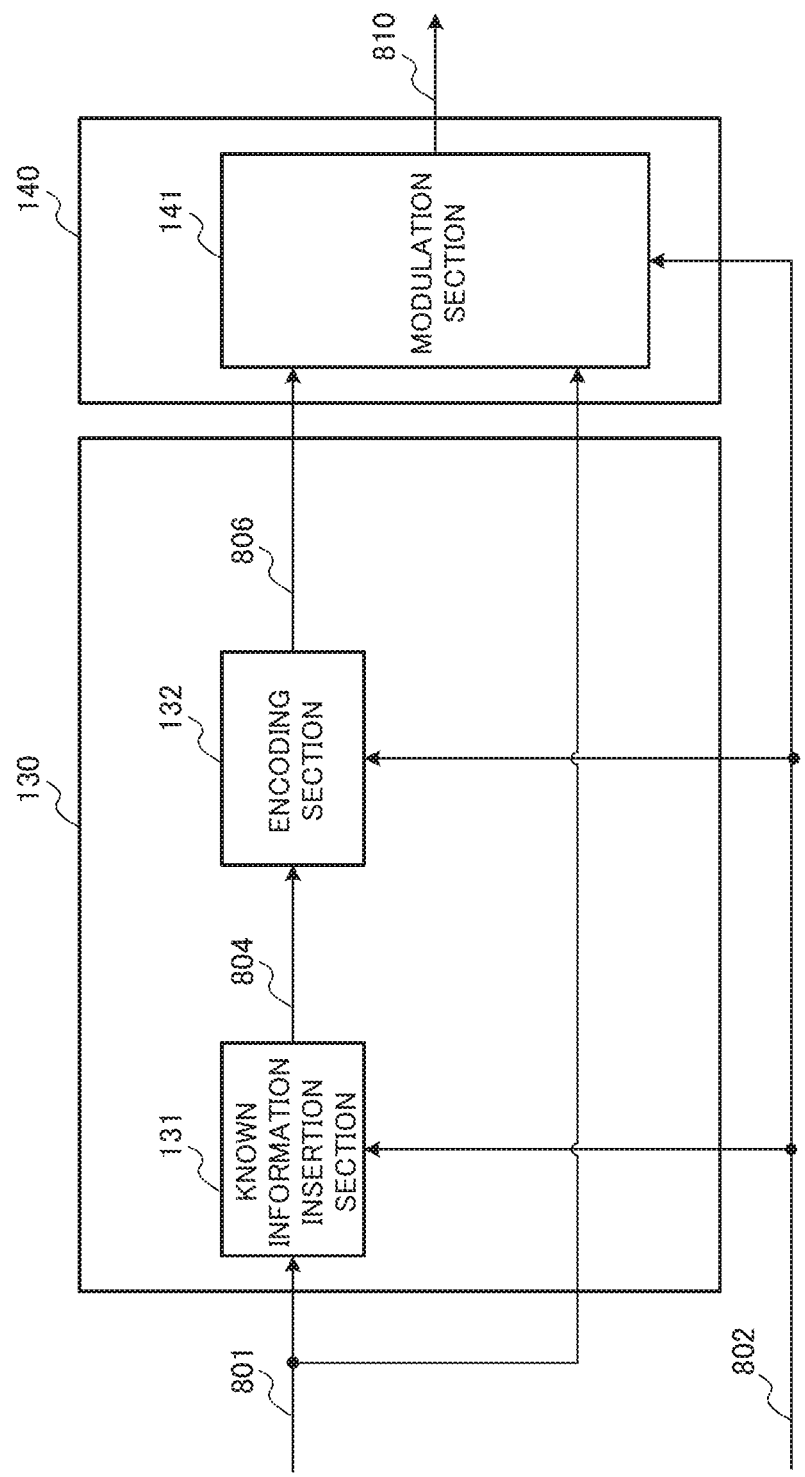
FIG. 29B is a block diagram illustrating another example of the configuration of the coding-related portion in a physical layer when the coding rate is made variable.

FIG. 29B is a block diagram illustrating an example of another configuration of the encoding-related section when the coding rate is made variable in the physical layer which is different from FIG. 29A. As shown in FIG. 29B, even if known information deleting section 133 in FIG. 29A is omitted, by adopting a configuration where information 801 inputted to known information insertion section 131 is inputted to modulation section 141, the coding rate can be made variable in the same way as in FIG. 29A.

Figure 30:
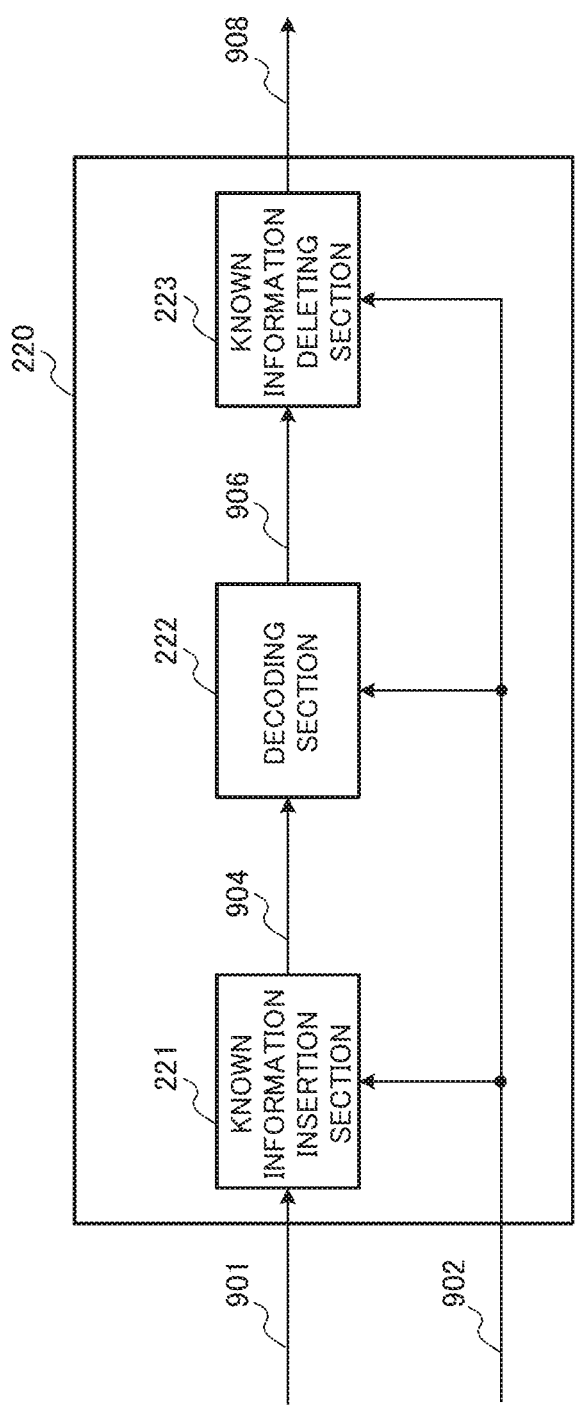
FIG. 30 is a block diagram illustrating an example of the configuration of an error correcting decoding section in the physical layer.

FIG. 30 is a block diagram illustrating an example of the configuration of error correcting decoding section 220 in a physical layer. Known information log likelihood ratio insertion section 221 receives log likelihood ratio signal 901 which is received data and control signal 902 as input, inserts, when a log likelihood ratio of known information needs to be inserted based on the information of the coding rate included in control signal 902, the log likelihood ratio of known information having high reliability into log likelihood ratio signal 901 and outputs log likelihood ratio signal 904 after the insertion of the log likelihood ratio of the known information. The information of the coding rate included in control signal 902 is transmitted from, for example, the communicating party.

Decoder 222 receives control signal 902 and log likelihood ratio signal 904 after the insertion of the log likelihood ratio of the known information as input, performs decoding based on the information of an encoding method such as a coding rate included in control signal 902, decodes data 906 and outputs decoded data 906.

Known information deleting section 223 receives control signal 902 and decoded data 906 as input, deletes, when known information is inserted based on information of an encoding method such as a coding rate included in control signal 902, the known information and outputs information 908 after the deletion of the known information.

As the shortening method in the physical layer, a shortening method for realizing a coding rate smaller than the coding rate of a code from the LDPC-CC of a time varying period of 3 described in Embodiment 2 has been described above. Using the shortening method of the present embodiment can improve transmission efficiency and erasure correction capability simultaneously and obtain good erasure correction capability even when the coding rate in the physical layer is changed.

In a convolutional code such as LDPC-CC, a termination sequence may be added at an end of a transmission information sequence to perform termination, and the termination sequence receives known information (e.g., all 0's) as input and is made up of only a parity sequence. Therefore, there can be some part of the termination sequence that will not follow the known information insertion rule (insertion rule) described in the disclosure of the present application. Furthermore, in parts other than termination, there may also be both a part that follows the insertion rule and a part into which known information is not inserted to improve the transmission rate.

Embodiment 4

The present embodiment will describe a method of changing a coding rate when the LDPC-CC of a time varying period of 3 described in Embodiment 2 is used for an erasure correction code.

An overview of an LDPC-CC of a coding rate of (n−1)/n and a time varying period of 3 that can obtain good characteristics is given below.

Consider equations 4-1 to 4-3 as parity check polynomials of an LDPC-CC for which the time varying period is 3. At this time, $X_1(D)$, $X_2(D)$, ..., $X_{n-1}(D)$ are polynomial representations of data (information) $X_1$, $X_2$, ..., $X_{n-1}$, and P(D) is a parity polynomial representation. Here, in equations 4-1 to 4-3, parity check polynomials are assumed such that there are three terms in $X_1(D)$, $X_2(D)$, ..., $X_{n-1}(D)$, and P(D) respectively.

In equation 4-1, it is assumed that $a_{i,1}$, $a_{i,2}$, and $a_{i,3}$ (where i=1, 2, ..., n−1) are integers (where $a_{i,1} \neq a_{i,2} \neq a_{i,3}$). Also, it is assumed that b, b2 and b3 are integers (where b1≠b2≠b3). A parity check polynomial of equation 4-1 is called "check equation #1." A sub-matrix based on the parity check polynomial of equation 4-1 is designated first sub-matrix $H_1$.

In equation 4-2, it is assumed that $A_{i,1}$, $A_{i,2}$, and $A_{i,3}$ (where i=1, 2, ..., n−1) are integers (where $A_{i,1} \neq A_{i,2} \neq A_{i,3}$). Also, it is assumed that B1, B2 and B3 are integers (where B1≠B2≠B3). A parity check polynomial of equation 4-2 is called "check equation #2." A sub-matrix based on the parity check polynomial of equation 4-2 is designated second sub-matrix $H_2$.

Furthermore, in equation 4-3, it is assumed that $\alpha_{i,1}$, $\alpha_{i,2}$, and $\alpha_{i,3}$ (where i=1, 2, ..., n−1) are integers (where $\alpha_{i,1} \neq \alpha_{i,2} \neq \alpha_{i,3}$). Also, it is assumed that β1, β2 and β3 are integers (where β1≠β2≠β3). A parity check polynomial of equation 4-3 is called "check equation #3." A sub-matrix based on the parity check polynomial of equation 4-3 is designated third sub-matrix $H_3$.

Next, an LDPC-CC of a time varying period of 3 generated from first sub-matrix $H_1$, second sub-matrix $H_2$ and third sub-matrix $H_3$ is considered.

At this time, if k is designated as a remainder after dividing the values of combinations of degrees of $X_1(D)$, $X_2(D)$, ..., $X_{n-1}(D)$, and P(D), $(a_{1,1}, a_{1,2}, a_{1,3})$, $(a_{2,1}, a_{2,2}, a_{2,3})$, ..., $(a_{n-1,1}, a_{n-1,2}, a_{n-1,3})$, (b1, b2, b3), $(A_{1,1}, A_{1,2}, A_{1,3})$, $(A_{2,1}, A_{2,2}, A_{2,3})$, ..., $(A_{n-1,1}, A_{n-1,2}, A_{n-1,3})$, (B1, B2, B3), $(\alpha_{1,1}, \alpha_{1,2}, \alpha_{1,3})$, $(\alpha_{2,1}, \alpha_{2,2}, \alpha_{2,3})$, ..., $(\alpha_{n-1,1}, \alpha_{n-1,2}, \alpha_{n-1,3})$, (β1, β2, β3), in equations 4-1 to 4-3 by 3, provision is made for one each of remainders 0, 1, and 2 to be included in three-coefficient sets represented as shown above (for example, $(a_{1,1}, a_{1,2}, a_{1,3})$), and to hold true with respect to all of the above three-coefficient sets.

That is to say, provision is made for $(a_{1,1}\%3, a_{1,2}\%3, a_{1,3}\%3)$, $(a_{2,1}\%3, a_{2,2}\%3, a_{2,3}\%3)$, ..., $(a_{n-1,1}\%3, a_{n-1,2}\%3, a_{n-1,3}\%3)$, (b1%3, b2%3, b3%3), $(A_{1,1}\%3, A_{1,2}\%3, A_{1,3}\%3)$, $(A_{2,1}\%3, A_{2,2}\%3, A_{2,3}\%3)$, ..., $(A_{n-1,1}\%3, A_{n-1,2}\%3, A_{n-1,3}\%3)$, (B1%3, B2%3, B3%3), $(\alpha_{1,1}\%3, \alpha_{1,2}\%3, \alpha_{1,3}\%3)$, $(\alpha_{2,1}\%3, \alpha_{2,2}\%3, \alpha_{2,3}\%3)$, ..., $(\alpha_{n-1,1}\%3, \alpha_{n-1,2}\%3, \alpha_{n-1,3}\%3)$ and (β1%3, β2%3, β3%3) to be any of the following: (0, 1, 2), (0, 2, 1), (1, 0, 2), (1, 2, 0), (2, 0, 1), (2, 1, 0).

The erasure correction method for realizing a coding rate smaller than a coding rate of (n−1)/n of high error correction capability using the above LDPC-CC of a coding rate of (n−1)/n and a time varying period of 3 is shown below.

[Method #3-1]

Figure 31:
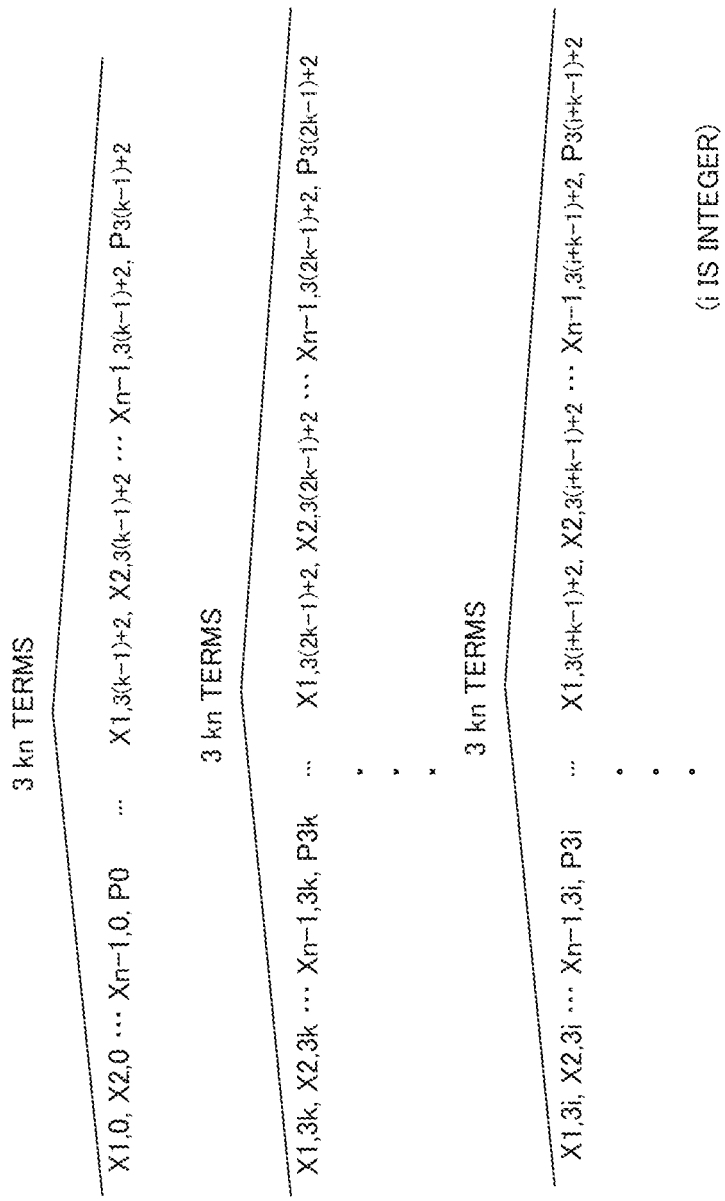
FIG. 31 is a diagram illustrating erasure correction method [method #3-1]

As shown in FIG. 31, assuming 3×n×k bits (k is a natural number) made up of information and parity part as a period, known information included in a known information packet is inserted at each period in accordance with a similar rule (insertion rule). "Inserting known information included in a known information packet in accordance with a similar rule (insertion rule) at each period" means equalizing positions at which known information is inserted at each period, for example, by inserting known information included in a known information packet (e.g., 0 (or 1 or a predetermined value)) in X0, X2, X4 in the first one period when 12 bits made up of information and parity part as shown in FIG. 25 are assumed to be a one period, inserting known information included in the known information packet (e.g., 0 (or 1 or a predetermined value)) in X6, X8, X10 at the next one period, . . . , inserting known information included in the known information packet in X6i, X6i+2, X6i+4 at an i-th one period, . . . .

[Method #3-2]

Z bits are selected from 3×n×k bits of information $X_{0,3i}$, $X_{1,3i}$, $X_{2,3i}$, . . . , $X_{n-1,3i}$, . . . , $X_{0,3(i+k-1)+2}$, $X_{1,3(i+k-1)+2}$, $X_{2,3(i+k-1)+2}$, . . . , $X_{n-1,3(i+k-1)+2}$ at a period of 3×n×k bits made up of information and parity part and data (e.g., 0 (or 1 or a predetermined value)) of the known information packet is inserted in the selected Z bits.

In this case, the erasure correction method calculates a remainder when dividing $X_{0,j}$ (where j takes a value of any one of 3i to 3(i+k−1)+2) into which known information included in the known information packet is inserted by 3 for all j's. Then, provision is made such that the difference between the number of remainders which become 0 and the number of remainders which become 1 is 1 or less, the difference between the number of remainders which become 0 and the number of remainders which become 2 is 1 or less and the difference between the number of remainders which become 1 and the number of remainders which become 2 is 1 or less.

Similarly, the erasure correction method calculates remainders after dividing $X_{1,j}$ (where j takes a value of any of 3i to 3(i+k−1)+2) into which data of the known information packet is inserted by 3 for all j's. Then, provision is made such that the difference between the number of remainders which become 0 and the number of remainders which become 1 is 1 or less, the difference between the number of remainders which become 0 and the number of remainders which become 2 is 1 or less and the difference between the number of remainders which become 1 and the number of remainders which become 2 is 1 or less.

Similarly, the erasure correction method calculates remainders after dividing $X_{h,j}$ (where j takes a value of any of 3i to 3(i+k−1)+2) into which data of the known information packet is inserted by 3 for all j's. Then, provision is made such that the difference between the number of remainders which become 0 and the number of remainders which become 1 is 1 or less, the difference between the number of remainders which become 0 and the number of remainders which become 2 is 1 or less and the difference between the number of remainders which become 1 and the number of remainders which become 2 is 1 or less (h=1, 2, 3, . . . , n−1).

By providing a condition for positions at which known information is inserted in this way, it is possible to generate more "rows whose unknown values correspond to parity part and with fewer information bits" in parity check matrix H and thereby realize a system having high erasure correction capability and capable of changing a coding rate of the erasure correction code with a small circuit scale using the aforementioned LDPC-CC of a coding rate of (n−1)/n and a time varying period of 3 having good characteristics.

An erasure correction method in a upper layer employing a variable coding rate of the erasure correction code has been described so far.

The configuration of the erasure correction encoding-related processing section and erasure correction decoding related processing section employing a variable coding rate of the erasure correction code in a upper layer has been described in Embodiment 1. As described in Embodiment 1, the coding rate of the erasure correction code can be changed by inserting a known information packet before erasure correction encoding-related processing section 120.

This makes it possible to make the coding rate variable according to, for example, a communication situation and thereby increase the coding rate when the communication situation is good and improve transmission efficiency. Furthermore, when the coding rate is reduced, the erasure correction capability can be improved by inserting known information included in a known information packet in accordance with the parity check matrix as with [method #3-2].

[method #3-2] has described a case where the number of pieces of data of a known information packet inserted remains the same for different periods, but the number of pieces of data of the known information packet inserted may differ from one period to another. For example, as shown in FIG. 32, No pieces of information may be designated data of the known information packet at a first period, Ni pieces of information may be designated data of the known information packet at the next period and Ni pieces of information may be designated data of the known information packet at an i-th period. Thus, when the number of pieces of data of the known information packet inserted differs from one period to another, the concept of "period" holds no valid meaning. According to the erasure correction method, when [method #3-2] is represented without using the concept of "period," it is represented as [method #3-3].

[Method #3-3]

Z bits are selected from a bit sequence of information $X_{0,0}$, $X_{1,0}$, $X_{2,0}$, . . . , $X_{n-1,0}$, . . . , $X_{0,v}$, $X_{1,v}$, $X_{2,v}$, . . . , $X_{n-1,v}$ in a data sequence made up of information and parity part and data of a known information packet (e.g., 0 (or 1 or a predetermined value)) is inserted.

In this case, the erasure correction method calculates a remainder after dividing $X_{0,j}$ (where j takes a value of any of 0 to v) into which data of the known information packet is inserted by 3 for all j's. Then, provision is made such that the difference between the number of remainders which become 0 and the number of remainders which become 1 is 1 or less, the difference between the number of remainders which become 0 and the number of remainders which become 2 is 1 or less and the difference between the number of remainders which become 1 and the number of remainders which become 2 is 1 or less.

Similarly, the erasure correction method calculates remainders after dividing $X_{1,j}$ (where j takes a value of any of 0 to v) into which data of the known information packet is inserted by 3 for all j's. Then, provision is made such that the difference between the number of remainders which become 0 and the number of remainders which become 1 is 1 or less, the difference between the number of remainders which become 0 and the number of remainders which become 2 is 1 or less and the difference between the number of remainders which become 1 and the number of remainders which become 2 is 1 or less.

Similarly, the erasure correction method calculates remainders after dividing $X_{h,j}$ (where j takes a value of any of 0 to v) into which data of the known information packet is inserted by 3 for all j's. Then, provision is made such that the difference between the number of remainders which become 0 and the number of remainders which become 1 is 1 or less, the difference between the number of remainders which become 0 and the number of remainders which become 2 is 1 or less and the difference between the number of remainders which become 1 and the number of remainders which become 2 is 1 or less (h=1, 2, 3, . . . , n−1).

A system has been described so far which makes variable a coding rate of the erasure correction code using a method of realizing a coding rate smaller than a coding rate of a code from the LDPC-CC of a time varying period of 3 described in Embodiment 2. Using the variable coding rate method according to the present embodiment can improve transmission efficiency and erasure correction capability simultaneously and obtain good erasure correction capability even when the coding rate is changed during erasure correction.

An LDPC-CC of a time varying period of 3 has been described so far as an example, but also for an LDPC-CC of a time varying period of 3g (g=1, 2, 3, 4, . . . ) having good characteristics described in Embodiment 2 (that is, LDPC-CC whose time varying period is a multiple of 3), the coding rate can be made variable while maintaining high error correction capability by satisfying above [method #3-1] to [method #3-3] in the same way as for an LDPC-CC of a time varying period of 3.

The present disclosure is not limited to the above-described embodiments, and can be implemented with various changes. For example, although cases have been mainly described above with embodiments where the present disclosure is implemented with an encoder and transmitting apparatus, the present disclosure is not limited to this, and is applicable to cases of implementation by means of a power line communication apparatus.

It is also possible to implement the encoding method and transmitting method as software. For example, provision may be made for a program that executes the above-described encoding method and communication method to be stored in ROM (Read Only Memory) beforehand, and for this program to be run by a CPU (Central Processing Unit).

Provision may also be made for a program that executes the above-described encoding method and transmitting method to be stored in a computer-readable storage medium, for the program stored in the storage medium to be recorded in RAM (Random Access Memory) of a computer, and for the computer to be operated in accordance with that program.

It goes without saying that the present disclosure is not limited to wireless communication, and is also useful in power line communication (PLC), visible light communication, and optical communication.

Embodiment 5

An LDPC-CC having high error correction capability has been described in Embodiment 2. The present embodiment will complementarily describe an LDPC-CC of a time varying period of 3 having high error correction capability. In the case of an LDPC-CC of a time varying period of 3, when a regular LDPC code is generated, a code of high error correction capability can be created.

Parity check polynomials of an LDPC-CC of a time varying period of 3 will be presented again. Suppose the relationship between parity check polynomials and a parity check matrix is the same as that described in Embodiment 2 and Embodiment 5.

When coding rate is 1/2:

[28]

$$(D^{a1}+D^{a2}+D^{a3})X(D)+(D^{b1}+D^{b2}+D^{b3})P(D)=0 \quad \text{(Equation 28-1)}$$

$$(D^{A1}+D^{A2}+D^{A3})X(D)+(D^{B1}+D^{B2}+D^{B3})P(D)=0 \quad \text{(Equation 28-2)}$$

$$(D^{\alpha1}+D^{\alpha2}+D^{\alpha3})X(D)+(D^{\beta1}+D^{\beta2}+D^{\beta3})P(D)=0 \quad \text{(Equation 28-3)}$$

When coding rate is (n−1)/n:

[29]

$$(D^{a1,1}+D^{a1,2}+D^{a1,3})X_1(D)+(D^{a2,1}+D^{a2,2}+D^{a2,3})X_2(D)+\ldots+(D^{an-1,1}+D^{an-1,2}+D^{an-1,3})X_{n-1}(D)+(D^{b1}+D^{b2}+D^{b3})P(D)=0 \quad \text{(Equation 29-1)}$$

$$(D^{A1,1}+D^{A1,2}+D^{A1,3})X_1(D)+(D^{A2,1}+D^{A2,2}+D^{A2,3})X_2(D)+\ldots+(D^{An-1,1}+D^{An-1,2}+D^{An-1,3})X_{n-1}(D)+(D^{B1}+D^{B2}+D^{B3})P(D)=0 \quad \text{(Equation 29-2)}$$

$$(D^{\alpha1,1}+D^{\alpha1,2}+D^{\alpha1,3})X_1(D)+(D^{\alpha2,1}+D^{\alpha2,2}+D^{\alpha2,3})X_2(D)+\ldots+(D^{\alpha n-1,1}+D^{\alpha n-1,2}+D^{\alpha n-1,3})X_{n-1}(D)+(D^{\beta1}+D^{\beta2}+D^{\beta3})P(D)=0 \quad \text{(Equation 29-3)}$$

Here, the parity check matrix becomes a full rank and it is assumed that the following condition holds true so that parity bits may be sequentially and easily calculated.

$b3=0$, that is, $D^{b3}=1$ $B3=0$, that is, $D^{B3}=1$ $\beta3=0$, that is, $D\beta^3=1$ Furthermore, the following conditions may be preferably given to make the relationship between information and parity part easy to understand.

$ai,3=0$, that is, $D^{ai,3}=1 (i=1,2,\ldots,n-1)$ $Ai,3=0$, that is, $D^{Ai,3}=1 (i=1,2,\ldots,n-1)$ $\alpha i,3=0$, that is, $D\alpha^{i,3}=1 (i=1,2,\ldots,n-1)$ where, $ai,3\%3=0$, $Ai, 3\%3=0$, $\alpha i,3\%3=0$ may also be possible.

To generate a regular LDPC code having high error correction capability by reducing the number of loops 6 (cycle length of 6) in a Tanner graph at this time, the following condition must be satisfied.

That is, when attention is focused on coefficients of information $Xk(k=1, 2, \ldots, n-1)$, any of #Xk1 to #Xk14 must be satisfied.

Xk1: $(ak,1\%3, ak,2\%3)=[0,1],(Ak,1\%3, Ak,2\%3)=[0,1], (\alpha k, 1\%3, \alpha k,2\%3)=[0,1]$

Xk2: $(ak,1\%3, ak,2\%3)=[0,1],(Ak,1\%3, Ak,2\%3)=[0,2], (\alpha k,1\%3, \alpha k,2\%3)=[1,2]$

Xk3: $(ak,1\%3, ak,2\%3)=[0,1],(Ak,1\%3, Ak,2\%3)=[1,2], (\alpha k, 1\%3, \alpha k,2\%3)=[1,1]$

Xk4: $(ak,1\%3, ak,2\%3)=[0,2],(Ak,1\%3, Ak,2\%3)=[1,2], (\alpha k, 1\%3, \alpha k,2\%3)=[0,1]$

Xk5: $(ak,1\%3, ak,2\%3)=[0,2],(Ak,1\%3, Ak,2\%3)=[0,2], (\alpha k,1\%3, \alpha k,2\%3)=[0,2]$

Xk6: $(ak,1\%3, ak,2\%3)=[0,2],(Ak,1\%3, Ak,2\%3)=[2,2], (\alpha k,1\%3, \alpha k,2\%3)=[1,2]$

Xk7: $(ak,1\%3, ak,2\%3)=[1,1],(Ak,1\%3, Ak,2\%3)=[0,1], (\alpha k, 1\%3, \alpha k,2\%3)=[1,2]$

Xk8: $(ak,1\%3, ak,2\%3)=[1,1],(Ak,1\%3, Ak,2\%3)=[1,1], (\alpha k,1\%3, \alpha k,2\%3)=[1,1]$

Xk9: $(ak,1\%3, ak,2\%3)=[1,2],(Ak,1\%3, Ak,2\%3)=[0,1], (\alpha k,1\%3, \alpha k,2\%3)=[0,2]$

Xk10: $(ak,1\%3, ak,2\%3)=[1,2],(Ak, 1\%3, Ak,2\%3)=[0,2],(\alpha k, 1\%3, \alpha k,2\%3)=[2,2]$

Xk11:(ak, 1%3, ak,2%3)=[1,2],(Ak, 1%3, Ak,2%3)=[1, 1],(αk, 1%3, ak,2%3)=[0,1]

Xk12:(ak,1%3, ak,2%3)=[1,2],(Ak, 1%3, Ak,2%3)=[1, 2],(αk, 1%3, αk,2%3)=[1,2]

Xk13:(ak, 1%3, ak,2%3)=[2,2],(Ak, 1%3, Ak,2%3)=[1, 2],(αk, 1%3, αk,2%3)=[0,2]

Xk14:(ak,1%3, ak,2%3)=[2,2],(Ak, 1%3, Ak,2%3)=[2, 2],(αk,1%3, αk,2%3)=[2,2]

When a=b in the above description, (x, y)=[a, b] represents x=y=a(=b) and when a≠b, (x, y)=[a, b] represents x=a, y=b or x=b, y=a (the same shall apply hereinafter).

Similarly, when attention is focused on coefficients of parity part, any of #P1 to #P14 must be satisfied. #P1: (b1%3,b2%3)=[0,1], (B1%3,B2%3)=[0,1], (β1%3,β2%3)=[0, 1]

P2: (b1%3,b2%3)=[0,1], (B1%3,B2%3)=[0,2], (β1%3, β2%3)=[1,2]

P3: (b1%3,b2%3)=[0,1], (B1%3,B2%3)=[1,2], (β1%3, β2%3)=[1,1]

P4: (b1%3,b2%3)=[0,2], (B1%3,B2%3)=[1,2], (β1%3, β2%3)=[0,1]

P5: (b1%3,b2%3)=[0,2], (B1%3,B2%3)=[0,2], (β1%3, β2%3)=[0,2]

P6: (b1%3,b2%3)=[0,2], (B1%3,B2%3)=[2,2], (β1%3, β2%3)=[1,2]

P7: (b11 %3,b2%3)=[1,1], (B11 %3,B2%3)=[0,1], (β1%3,β2%3)=[1,2]

P8: (b1%3,b2%3)=[1,1], (B1%3,B2%3)=[1,1], (β1%3, β2%3)=[1,1]

P9: (b1%3,b2%3)=[1,2], (B1%3,B2%3)=[0,1], (β1%3, β2%3)=[0,2]

P10: (b1%3,b2%3)=[1,2], (B1%3,B2%3)=[0,2], (β1%3, β2%3)=[2,2]

P11: (b1%3,b2%3)=[1,2], (B1%3,B2%3)=[1,1], (β1%3, β2%3)=[0,1]

P12: (b1%3,b2%3)=[1,2], (B1%3,B2%3)=[1,2], (β1%3, β2%3)=[1,2]

P13: (b1%3,b2%3)=[2,2], (B1%3,B2%3)=[1,2], (β1%3, β2%3)=[0,2]

P14: (b1%3,b2%3)=[2,2], (B1%3,B2%3)=[2,2], (β1%3, β2%3)=[2,2]

The LDPC-CC having good characteristics described in Embodiment 2 is an LDPC-CC that satisfies the conditions of #Xk12 and #P12 of the above conditions.

The following is an example of parity check polynomials of an LDPC-CC of a time varying period of 3 that satisfies #Xk12 of above #Xk1 to #Xk14 and that satisfies the condition of #P12 of #P1 to #P14.

Coding Rate R=1/2:

[30]

$$A_{X1,1}(D)X_1(D)+B_1(D)P(D)=(D^{286}+D^{164}+1)X_1(D)+(D^{92}+D^7+1)P(D)=0 \quad \text{(Equation 30-1)}$$

$$A_{X1,2}(D)X_1(D)+B_2(D)P(D)=(D^{370}+D^{317}+1)X_1(D)+(D^{95}+D^{22}+1)P(D)=0 \quad \text{(Equation 30-2)}$$

$$A_{X1,3}(D)X_1(D)+B_3(D)P(D)=(D^{346}+D^{86}+1)X_1(D)+(D^{88}+D^{26}+1)P(D)=0 \quad \text{(Equation 30-3)}$$

Coding Rate R=2/3:

[31]

$$A_{X1,1}(D)X_1(D)+A_{X2,1}(D)X_2(D)+B_1(D)P(D)=(D^{286}+D^{164}+1)X_1(D)+(D^{385}+D^{242}+1)X_2(D)+(D^{92}+D^7+1)P(D)=0 \quad \text{(Equation 31-1)}$$

$$A_{X1,2}(D)X_1(D)+A_{X2,2}(D)X_2(D)+B_2(D)P(D)=(D^{370}+D^{317}+1)X_1(D)+(D^{125}+D^{103}+1)X_2(D)+(D^{95}+D^{22}+1)P(D)=0 \quad \text{(Equation 31-2)}$$

$$A_{X1,3}(D)X_1(D)+A_{X2,3}(D)X_2(D)+B_3(D)P(D)=(D^{346}+D^{86}+1)X_1(D)+(D^{319}+D^{290}+1)X_2(D)+(D^{88}+D^{26}+1)P(D)=0 \quad \text{(Equation 31-3)}$$

Coding Rate R=3/4:

[32]

$$A_{X1,1}(D)X_1(D)+A_{X2,1}(D)X_2(D)+A_{X3,1}(D)X_3(D)+B_1(D)P(D)=(D^{286}+D^{164}+1)X_1(D)+(D^{385}+D^{242}+1)X_2(D)+(D^{343}+D^{284}+1)X_3(D)+(D^{92}+D^7+1)P(D)=0 \quad \text{(Equation 32-1)}$$

$$A_{X1,2}(D)X_1(D)+A_{X2,2}(D)X_2(D)+A_{X3,2}(D)X_3(D)+B_2(D)P(D)=(D^{370}+D^{317}+1)X_1(D)+(D^{125}+D^{103}+1)X_2(D)+(D^{259}+D^{14}+1)X_3(D)+(D^{95}+D^{22}+1)P(D)=0 \quad \text{(Equation 32-2)}$$

$$A_{X1,3}(D)X_1(D)+A_{X2,3}(D)X_2(D)+A_{X3,3}(D)X_3(D)+B_3(D)P(D)=(D^{346}+D^{86}+1)X_1(D)+(D^{319}+D^{290}+1)X_2(D)+(D^{145}+D^{11}+1)X_3(D)+(D^{88}+D^{26}+1)P(D)=0 \quad \text{(Equation 32-3)}$$

Coding Rate R=4/5:

[33]

$$A_{X1,1}(D)X_1(D)+A_{X2,1}(D)X_2(D)+A_{X3,1}(D)X_3(D)+A_{X4,1}(D)X_4(D)+B_1(D)P(D)=(D^{286}+D^{164}+1)X_1(D)+(D^{385}+D^{242}+1)X_2(D)+(D^{343}+D^{284}+1)X_3(D)+(D^{283}+D^{68}+1)X_4(D)+(D^{92}+D^7+1)P(D)=0 \quad \text{(Equation 33-1)}$$

$$A_{X1,2}(D)X_1(D)+A_{X2,2}(D)X_2(D)+A_{X3,2}(D)X_3(D)+A_{X4,2}(D)X_4(D)+B_2(D)P(D)=(D^{370}+D^{317}+1)X_1(D)+(D^{125}+D^{103}+1)X_2(D)+(D^{259}+D^{14}+1)X_3(D)+(D^{256}+D^{188}+1)X_4(D)+(D^{95}+D^{22}+1)P(D)=0 \quad \text{(Equation 33-2)}$$

$$A_{X1,3}(D)X_1(D)+A_{X2,3}(D)X_2(D)+A_{X3,3}(D)X_3(D)+A_{X4,3}(D)X_4(D)+B_3(D)P(D)=(D^{346}+D^{86}+1)X_1(D)+(D^{319}+D^{290}+1)X_2(D)+(D^{145}+D^{11}+1)X_3(D)+(D^{287}+D^{73}+1)X_4(D)+(D^{88}+D^{26}+1)P(D)=0 \quad \text{(Equation 33-3)}$$

The above LDPC-CC parity check polynomials have a characteristic of enabling the shared use of encoder circuits and the shared use of decoders.

Another example of LDPC-C parity check polynomials of a time varying period of 3 is shown below.

Coding Rate R=1/2:

[34]

$$A_{X1,1}(D)X_1(D)+B_1(D)P(D)=(D^{214}+D^{185}+1)X_1(D)+(D^{215}+D^{145}+1)P(D)=0 \quad \text{(Equation 34-1)}$$

$$A_{X1,2}(D)X_1(D)+B_2(D)P(D)=(D^{160}+D^{62}+1)X_1(D)+(D^{206}+D^{127}+1)P(D)=0 \quad \text{(Equation 34-2)}$$

$$A_{X1,3}(D)X_1(D)+B_3(D)P(D)=(D^{196}+D^{143}+1)X_1(D)+(D^{211}+D^{119}+1)P(D)=0 \quad \text{(Equation 34-3)}$$

Coding Rate R=2/3:

[35]

$$A_{X1,1}(D)X_1(D)+A_{X2,1}(D)X_2(D)+B_1(D)P(D)=(D^{214}+D^{185}+1)X_1(D)+(D^{194}+D^{67}+1)X_2(D)+(D^{215}+D^{145}+1)P(D)=0 \quad \text{(Equation 35-1)}$$

$$A_{X1,2}(D)X_1(D)+A_{X2,2}(D)X_2(D)+B_2(D)P(D)=(D^{160}+D^{62}+1)X_1(D)+(D^{226}+D^{209}+1)X_2(D)+(D^{206}+D^{127}+1)P(D)=0 \quad \text{(Equation 35-2)}$$

$$A_{X1,3}(D)X_1(D)+A_{X2,3}(D)X_2(D)+B_3(D)P(D)=(D^{196}+D^{143}+1)X_1(D)+(D^{115}+D^{104}+1)X_2(D)+(D^{211}+D^{119}+1)P(D)=0 \quad \text{(Equation 35-3)}$$

Coding Rate R=3/4:

[36]

$$A_{X1,1}(D)X_1(D)+A_{X2,1}(D)X_2(D)+A_{X3,1}(D)X_3(D)+B_1(D)$$
$$P(D)=(D^{214}+D^{185}+1)X_1(D)+(D^{194}+D^{67}+1)X_2(D)+(D^{196}+D^{68}+1)X_3(D)+(D^{215}+D^{145}+1)P(D)=0 \quad \text{(Equation 36-1)}$$

$$A_{X1,2}(D)X_1(D)+A_{X2,2}(D)X_2(D)+A_{X3,2}(D)X_3(D)+B_2(D)$$
$$P(D)=(D^{160}+D^{62}+1)X_1(D)+(D^{226}+D^{209}+1)X_2(D)+(D^{98}+D^{37}+1)X_3(D)+(D^{206}+D^{127}+1)P(D)=0 \quad \text{(Equation 36-2)}$$

$$A_{X1,3}(D)X_1(D)+A_{X2,3}(D)X_2(D)+A_{X3,3}(D)X_3(D)+B_3(D)$$
$$P(D)=(D^{196}+D^{143}+1)X_1(D)+(D^{115}+D^{104}+1)X_2(D)+(D^{176}+D^{136}+1)X_3(D)+(D^{211}+D^{119}+1)P(D)=0 \quad \text{(Equation 36-3)}$$

Coding Rate R=4/5:

[37]

$$A_{X1,1}(D)X_1(D)+A_{X2,1}(D)X_2(D)+A_{X3,1}(D)X_3(D)+A_{X4,1}(D)X_4(D)+B_1(D)P(D)=(D^{214}+D^{185}+1)X_1(D)+(D^{194}+D^{67}+1)X_2(D)+(D^{196}+D^{68}+1)X_3(D)+(D^{217}+D^{122}+1)X_4(D)+(D^{215}+D^{145}+1)P(D)=0 \quad \text{(Equation 37-1)}$$

$$A_{X1,2}(D)X_1(D)+A_{X2,2}(D)X_2(D)+A_{X3,2}(D)X_3(D)+A_{X4,2}(D)X_4(D)+B_2(D)P(D)=(D^{160}+D^{62}+1)X_1(D)+(D^{226}+D^{209}+1)X_2(D)+(D^{98}+D^{37}+1)X_3(D)+(D^{71}+D^{34}+1)X_4(D)+(D^{206}+D^{127}+1)P(D)=0 \quad \text{(Equation 37-2)}$$

$$A_{X1,3}(D)X_1(D)+A_{X2,3}(D)X_2(D)+A_{X3,3}(D)X_3(D)+A_{X4,3}(D)X_4(D)+B_3(D)P(D)=(D^{196}+D^{143}+1)X_1(D)+(D^{115}+D^{104}+1)X_2(D)+(D^{176}+D^{136}+1)X_3(D)+(D^{212}+D^{187}+1)X_4(D)+(D^{211}+D^{119}+1)P(D)=0 \quad \text{(Equation 37-3)}$$

The above example is an example of LDPC-CC parity check polynomials of a time varying period of 3 that satisfy #Xk12 of above #Xk1 to #Xk14 and satisfies the condition of #P12 of #P1 to #P14, but satisfying conditions other than #Xk12 or #P12 can also create an LDPC-CC of a time varying period of 3 having good error correction capability. Details thereof will be described in Embodiment 6.

Use of an LDPC-CC relating to the present disclosure requires termination or tail-biting to secure reliability in decoding of information bits. A case where termination is performed (referred to as "information-zero-termination" or simply referred to as "zero-termination") and the tail-biting method will be described in detail below. All the embodiments of the present disclosure can be implemented when either termination or tail-biting is performed.

Figure 33:
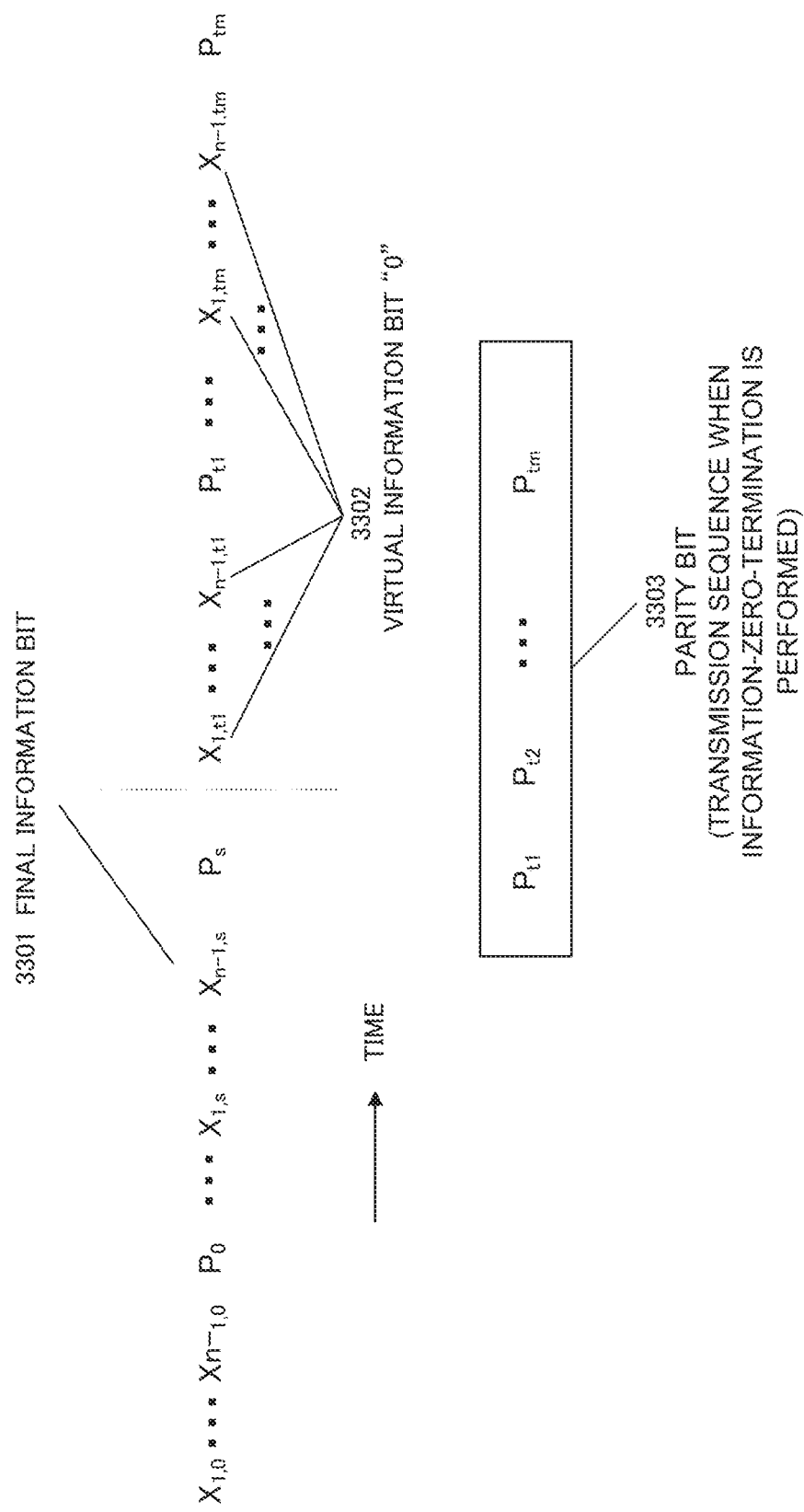
FIG. 33 is a diagram illustrating an example of a relationship between an information size and the number of terminations.

FIG. 33 is a diagram illustrating "Information-zero-termination" in an LDPC-CC of a coding rate of (n−1)/n. Suppose information bits $X_1, X_2, \ldots, X_{n-1}$, and parity bit P at point in time i (i=0, 1, 2, 3, . . . , s) are $X_{1,i}$, $X_{2,i}, \ldots, X_{n-1,i}$, and parity bit $P_i$ respectively. As shown in FIG. 33, suppose $X_{n-1,s}$ is the final bit of information to be transmitted.

When the encoder performs encoding only up to point in time s and the transmitting apparatus on the encoding side performs transmission to the receiving apparatus on the decoding side only up to $P_s$, the receiving quality of information bits on the decoder significantly deteriorates. To solve this problem, encoding is performed assuming information bits from final information bit $X_{n-1,s}$ onward (referred to as "virtual information bit") to be 0's and parity bits (3303) are generated.

To be more specific, as shown in FIG. 33, the encoder performs encoding assuming $X_{1,k}, X_{2,k}, \ldots, X_{n-1,k}$ (k=t1, t2, . . . , tm) to be 0's and obtains $P_{t1}, P_{t2}, \ldots, P_{tm}$. The transmitting apparatus on the encoding side transmits $X_{1,s}, X_{2,s}, \ldots, X_{n-1,s}, P_s$ at point in time s and then transmits $P_{t1}, P_{t2}, \ldots, P_{tm}$. The decoder performs decoding taking advantage of knowing that virtual information bits from point in time s onward are 0's.

Next, the tail-biting method will be described. A general equation of a parity check matrix when performing tail-biting of a time-varying LDPC-CC is represented as shown below.

[38]

$$H^T = \begin{bmatrix} H_0^T(0) & H_1^T(1) & \cdots & H_{Ms}^T(M_s) & 0 & \cdots & & 0 \\ 0 & H_0^T(1) & \cdots & H_{Ms-1}^T(M_s) & H_{Ms}^T(M_s+1) & 0 & \cdots & 0 \\ & & \ddots & & & \ddots & & \ddots \\ H_{Ms}^T(N) & 0 & \cdots & & & H_{Ms-2}^T(N-2) & H_{Ms-1}^T(N-1) \\ H_{Ms-1}^T(N) & H_{Ms}^T(N+1) & 0 & & & H_{Ms-3}^T(N-2) & H_{Ms-2}^T(N-1) \\ \vdots & & & \cdots & & \vdots & \vdots \\ H_1^T(N) & H_2^T(N+1) & \cdots & 0 & & 0 & H_0^T(N-1) \end{bmatrix}$$

(Equation 38)

In the above equation, H represents a parity check matrix and $H^T$ represents a syndrome former. Furthermore, $H^T_i(t)$ (i=0, 1, . . . , $M_s$) is a sub-matrix of c×(c−b) and $M_s$ represents a memory size. Encoding is performed and a parity part is found based on the above parity check matrix. Thus, in general, when tail-biting is performed, a fixed block size (coding unit) is determined.

Embodiment 6

The present embodiment will describe important items about the design of the good LDPC-CC of a time varying period of 3 described in Embodiment 3.

As for a convolutional code, studies have been so far carried out on Viterbi decoding and sequential decoding of a code based on a minimum free distance (see Non-Patent Literature 10 to Non-Patent Literature 13). In particular, when attention is focused on a time-varying convolutional code (see Non-Patent Literature 14 and Non-Patent Literature 15), these documents show that there are codes excelling time-invariant convolutional codes in minimum free distances among periodic time-varying convolutional codes (see Non-Patent Literature 15).

On the other hand, an LDPC (Low-Density Parity-Check) code (see Non-Patent Literature 4 and Non-Patent Literature 19) is attracting attention in recent years from the standpoint that it provides characteristics close to a Shannon limit and that it can realize decoding using a simple belief propagation algorithm such as BP (Belief Propagation) decoding (see Non-Patent Literature 16 and Non-Patent Literature 17). Many studies carried out so far are concerned with LDPC block codes (LDPC-BC) and studies on random LDPC codes (see Non-Patent Literature 2), algebraically configured array LDPC codes (see Non-Patent Literature 18), QC (Quasi-Cyclic)-LDPC codes (see Non-Patent Literature 19 to Non-Patent Literature 21) or the like are in progress.

On the other hand, Non-Patent Literature 3 proposes a concept of LDPC convolutional codes (LDPC-CC). An LDPC-CC encoder can be constituted using simple shift registers, a parity check matrix is defined on the basis of sub-matrices and BP decoding is performed using the parity check matrices. The concept of time variation is also introduced to LDPC-CCs in much the same way as convolutional codes (see Non-Patent Literature 3). Moreover, many literatures disclose methods of creating convolutional codes and LDPC-CCs from block codes (see Non-Patent Literature 22 to Non-Patent Literature 25).

Non-Patent Literature 26 and Non-Patent Literature 27 are discussing a design method for an LDPC-CC (TV3-LDPC-CC) of a time varying period of 3.

Thus, a design method for a TV3-LDPC-CC will be discussed below. NPL 26 and Non-Patent Literature 27 evaluate the number of short cycle lengths (CL: cycle of length) in a Tanner graph and have confirmed that there are only a small number of CL4's (CL of 4). Therefore, aiming at a reduction in the number of CL6's (CL of 6), one condition for CL6 to occur in a TV3-LDPC-CC will be described below. Then, a method of generating a TV3-LDPC-CC which becomes a regular LDPC code without satisfying the generating condition will be described.

<About LDPC-CC> (See Non-Patent Literature 20)

An LDPC-CC is a code defined by a low-density parity check matrix in the same way as an LDPC-BC and can be defined by a time-varying parity check matrix of infinite length, but can actually be thought of with a periodically time-varying parity check matrix. Assuming a parity check matrix as H, an LDPC-CC will be described using syndrome former $H^T$.

$H^T$ of the LDPC-CC of a coding rate of R=b/c (b<c) can be represented as equation 39.

[39]

$$H^T = \begin{bmatrix} \ddots & \vdots & \vdots & & \ddots & & & \\ H_0^T(t-M_s) & H_1^T(t-M_s+1) & \cdots & H_{M_s}^T(t) & & & & \\ & H_0^T(t-M_s+1) & \cdots & H_{M_s-1}^T(t) & H_{M_s}^T(t+1) & & & \\ & & \ddots & \vdots & \vdots & \ddots & & \\ & & & H_0^T(t) & H_1^T(t+1) & \cdots & H_{M_s}^T(t+M_s) & \\ & & & & \ddots & \vdots & \vdots & \ddots \end{bmatrix}$$ (Equation 39)

In equation 39, $H^T_i(t)$ (i=0,1, ... ,$m_s$) is a sub-matrix of a c×(c−b) period. When the period is assumed as $T_s$, $H^T_i(t)=H^T_i(t+T_s)$ holds true for $\forall$I and $\forall$t. Furthermore, $M_s$ represents a memory size.

The LDPC-CC defined by equation 39 is a time-varying convolutional code and this code is called "time-varying LDPC-CC" (see Non-Patent Literature 3). Decoding is generally performed through BP decoding using parity check matrix H. When an encoded sequence vector is assumed to be u, the following relational equation holds true.

[40]

$$Hu=0 \quad \text{(Equation 40)}$$

By performing BP decoding, an information sequence is obtained from the relational equation of equation 40.

<About LDPC-CC Based on Parity Check Polynomial>

Consider a systematic convolutional code of a coding rate of R=1/2 and generator matrix G=[1 $G_1(D)/G_0(D)$]. In this case, $G_1$ represents a feedforward polynomial and $G_0$ represents a feedback polynomial. Assuming a polynomial representation of an information sequence is X(D) and a polynomial representation of a parity sequence is P(D), the parity check polynomial can be represented as follows.

[41]

$$G_1(D)X(D)+G_0(D)P(D)=0 \quad \text{(Equation 41)}$$

Here, consider a parity check polynomial of equation 42 that satisfies equation 41.

[42]

$$(D^{a1}+D^{a2}+\ldots+D^{ar}+1)X(D)+(D^{b1}+D^{b2}+\ldots+D^{bs}+1)P(D)=0 \quad \text{(Equation 42)}$$

In equation 42, $a_p$ and $b_q$ are integers equal to or greater than 1 (p=1, 2 ..., r; q=1, 2 ..., s) and a $D^0$ term is present in X(D) and P(D). The code defined by the parity check matrix based on the parity check polynomial of equation 42 becomes a time-invariant LDPC-CC.

M different parity check polynomials based on equation 42 are provided (where m is an integer equal to or greater than 2). The parity check polynomial is represented as shown below.

[43]

$$A_i(D)X(D)+B_i(D)P(D)=0 \quad \text{(Equation 43)}$$

In this case, i=0, 1, ... , m−1. Data and parity part at point in time j are represented as $X_j$ and $P_j$, and assume $u_j=(X_j, P_j)$. Then, a parity check polynomial of equation 44 also holds true.

[44]

$$A_k(D)X(D)+B_k(D)P(D)=0 (k=j \bmod m) \quad \text{(Equation 44)}$$

In this case, parity part $P_j$ at point in time j can be obtained from equation 44. A code defined by the parity check matrix generated based on the parity check polynomial of equation 44 becomes a time-varying LDPC-CC. In this case, since the $D^0$ term is present in P(D) and $b_j$ is an integer equal to or greater than 1, the time-invariant LDPC-CC defined by the parity check polynomial of equation 42 and the time-varying LDPC-CC defined by the parity check polynomial of equation 44 have a characteristic of enabling a parity part to be easily found sequentially by means of a register and exclusive OR.

The decoding section creates parity check matrix H for a time-invariant LDPC-CC in accordance with equation 42 and for a time-varying LDPC-CC in accordance with equation 44, performs BP decoding from the relational equation of equation 40 using a representation encoded sequence $u=(u_0, u_1, \ldots, u_j, \ldots)^T$, and obtains a data sequence.

Next, consider a time-invariant LDPC-CC and time-varying LDPC-CC of a coding rate of (n−1)/n. Suppose information sequence $X_1, X_2, \ldots, X_{n-1}$ and parity part P at point in time j are represented by $X_{2,j}, \ldots, X_{n-1,j}$ and $P_j$ respectively, and consider $u_j=(X_{1,j}, X_{2,j}, \ldots, X_{n-1,j}, P_j)$. Assuming a polynomial representation of information sequence $X_1, X_2, \ldots, X_{n-1}$ as $X_1(D), X_2(D), \ldots, X_{n-1}(D)$, the parity check polynomial is represented as shown below.

[45]

$$(D^{a1,1}+D^{a1,2}+\ldots+D^{a1,r1}+1)X_1(D)+(D^{a2,1}+D^{a2,2}+\ldots+D^{a2,r2}+1)X_2(D)+\ldots+(D^{an-1,1}+D^{an-1,2}+\ldots+D^{an-1,rn-1}+1)X_{n-1}(D)+(D^{b1}+D^{b2}+\ldots+D^{bs}+1)P(D)=0 \quad \text{(Equation 45)}$$

In equation 45, $a_{p,i}$ is an integer equal to or greater than 1 ($p=1, 2, \ldots, n-1$; $i=1, 2, \ldots, r_p$), satisfies $a_{p,y} \neq a_{p,z}$ and satisfies ($^\forall(y,z)|y,z=1, 2, \ldots, r_p, y \neq z$) and $b_y \neq b_z$ ($^\forall(y,z)|y, z=1, 2, \ldots, \varepsilon, y \neq z$). M different parity check polynomials based on equation 45 are provided (where m is an integer equal to or greater than 2). The parity check polynomial is represented as shown below.

[46]

$$A_{X1,i}(D)X_1(D)+A_{X2,i}(D)X_2(D)+\ldots+A_{Xn-1,i}(D)X_{n-1}(D)+B_i(D)P(D)=0 \quad \text{(Equation 46)}$$

In this case, $i=0, 1, \ldots, m-1$. Then, suppose equation 47 holds true for $X_{1,j}, X_{2,j}, \ldots, X_{n-1,j}$ and $P_j$ which are information sequence $X_1, X_2, \ldots, X_{n-1}$ and parity part P at point in time j.

[47]

$$A_{X1,k}(D)X_1(D)+A_{X2,k}(D)X_2(D)+\ldots+A_{Xn-1,k}(D)X_{n-1}(D)+B_k(D)P(D)=0 \quad (k=j \bmod m) \quad \text{(Equation 47)}$$

In this case, the codes based on equation 45 and equation 47 are the time-invariant LDPC-CC and time-varying LDPC-CC of a coding rate of (n−1)/n respectively.

Non-Patent Literature 27 describes that when constraint lengths are approximately equal, a TV3-LDPC-CC can obtain better error correction capability than an LDPC-CC of a time varying period of 2. Thus, by focusing attention on the TV3-LDPC-CC, the design method of the regular TV3-LDPC-CC will be described in detail.

A parity check polynomial that satisfies #q-th 0 of the TV3-LDPC-CC of a coding rate of (n−1)/n is provided as shown below (q=0, 1, 2).

[48]

$$(D^{a\#q,1,1}+D^{a\#q,1,2}+\ldots+D^{a\#q,1,r1})X_1(D)+(D^{a\#q,2,1}+D^{a\#q,2,2}+\ldots+D^{a\#q,2,r2})X_2(D)+\ldots+(D^{a\#q,n-1,1}+D^{a\#q,n-1,2}+\ldots+D^{a\#q,n-1,rn-1})X_{n-1}(D)+(D^{b\#q,1}+D^{b\#q,2}+\ldots+D^{b\#q,s})P(D)=0 \quad \text{(Equation 48)}$$

In equation 48, $a_{\#q,p,i}$ is an integer equal to or greater than 1 ($p=1, 2, \ldots, n-1$; $i=1, 2, \ldots, r_p$), satisfies $a_{\#q,p,y} \neq a_{\#q,p,z}$ and satisfies ($^\forall(y,z)|y,z=1, 2, \ldots, r_p, y \neq z$) and $b_{\#q,y} \neq b_{\#q,z}$ ($^\forall(y,z)|y,z=1, 2, \ldots, \varepsilon, y \neq z$).

In this case, there are features as shown below.

Feature 1:

There are relationships as shown below between the $D^{a\#\alpha_{p,i}}X_p(D)$ term of parity check polynomial #α, $D^{a\#\beta_{p,j}}X_p(D)$ term of parity check polynomial #β (α,β=0, 1, 2(α≠β); p=1, 2, ..., n−1; i,j=1, 2, ..., $r_p$), and between the $D^{b\#\alpha_i}P(D)$ term of parity check polynomial #α and $D^{b\#\beta_j}P(D)$ term of parity check polynomial #β (α,β=0, 1, 2(α≠β); i,j=1, 2, ..., $r_p$).

Figure 34:
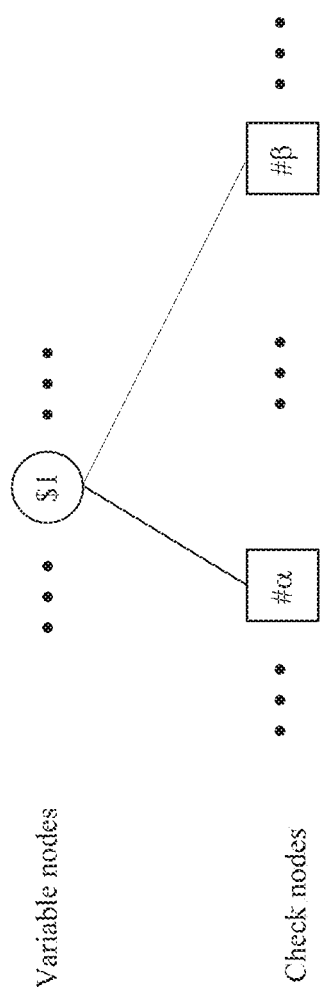
FIG. 34 is a diagram illustrating a Tanner graph.

<1> When β=α:

When $\{(a\#\alpha_{p,i} \bmod 3, a\#\beta_{p,j} \bmod 3)=(0,0)\cup(1,1)\cup(2,2)\} \cap \{i \neq j\}$ holds true, variable node $1 is present which forms edges of both a check node corresponding to parity check polynomial #α and a check node corresponding to parity check polynomial #β as shown in FIG. 34. Here, since β≠α, a condition of i≠j needs to be added. When $\{(b\#\alpha_i \bmod 3, b\#\beta_j \bmod 3)=(0,0)\cup(1,1)\cup(2,2)\} \cap \{i \neq j\}$ holds true, variable node $1 is present which forms edges of both a check node corresponding to parity check polynomial #α and a check node corresponding to parity check polynomial #β as shown in FIG. 34.

<2> when β=(α+1) Mod 3:

When $(a_{\#\alpha,p,i} \bmod 3, a_{\#\beta,p,j} \bmod 3)=(0,1)\cup(1,2)\cup(2,0)$ holds true, variable node $1 is present which forms edges of both a check node corresponding to parity check polynomial #α and a check node corresponding to parity check polynomial #β as shown in FIG. 34. When $(b_{\#\alpha,i} \bmod 3, b_{\#\beta,j} \bmod 3)=(0,1)\cup(1,2)\cup(2,0)$ holds true, variable node $1 is present which forms edges of both a check node corresponding to parity check polynomial #a and a check node corresponding to parity check polynomial #β as shown in FIG. 34.

<3> When β=(α+2) mod 3:

When $(a_{\#\alpha,p,i} \bmod 3, a_{\#\beta,p,j} \bmod 3)=(0,2)\cup(1,0)\cup(2,1)$ holds true, variable node $1 is present which forms edges of both a check node corresponding to parity check polynomial #α and a check node corresponding to parity check polynomial #β as shown in FIG. 34. When $(b_{\#\alpha,i} \bmod 3, b_{\#\beta,j} \bmod 3)=(0,2)\cup(1,0)\cup(2,1)$ holds true, variable node $1 is present which forms edges of both a check node corresponding to parity check polynomial #a and a check node corresponding to parity check polynomial #β as shown in FIG. 34.

The following theorem relating to cycle length 6 (CL6: cycle length of 6) of a TV3-LDPC-CC holds true.

Theorem 1:

The following two conditions are provided for parity check polynomials that satisfy 0's of a TV3-LDPC-CC.

P and q that satisfy C#1.1:$(a_{\#q,p,i} \bmod 3, a_{\#q,p,j} \bmod 3, a_{\#q,p,k} \bmod 3)=(0, 0, 0)\cup(1, 1, 1)\cup(2, 2, 2)$ are present, where i≠j, i≠k and j≠k are assumed.

P and q that satisfy C#1.2:$(b_{\#q,i} \bmod 3, b_{\#q,j} \bmod 3, b_{\#q,k} \bmod 3)=(0, 0, 0)\cup(1, 1, 1)\cup(2, 2, 2)$, where i j, i k and j k are assumed.

When C#1.1 or C#1.2 is satisfied, at least one CL6 is present.

Proof:

If it is possible to prove that at least one CL6 is present when p=1, q=0, and $(a_{\#0,1,i} \bmod 3, a_{\#0,1,j} \bmod 3, a_{\#0,1,k} \bmod 3)=(0, 0, 0)\cup(1, 1, 1)\cup(2, 2, 2)$, it is possible to prove that at least one CL6 is present also for $X_2(D), \ldots, X_{n-1}(D), P(D)$ by substituting $X_2(D), \ldots, X_{n-1}(D), P(D)$ for $X_1(D)$, if C#1.1 and C#1.2 hold true when q=0.

Furthermore, when p=1 if the above description can be proved, it is possible to prove that at least one CL6 is present also when p=2, 3 if C#1.1 and C#1.2 hold true in the same way of thinking. Therefore, when p=1, q=0, if $(a_{\#0,1,i} \bmod 3, a_{\#0,1,j} \bmod 3, a_{\#0,1,k} \bmod 3)=(0, 0, 0)\cup(1, 1, 1)\cup(2, 2, 2)$ holds true, it is possible to prove that at least one CL6 is present.

In $X_1(D)$ when q=0 is assumed for a parity check polynomial that satisfies 0 of the TV3-LDPC-CC in equation 48, if two or fewer terms are present, C#1.1 is never satisfied.

In $X_1(D)$ when q=0 is assumed for a parity check polynomial that satisfies 0 of the TV3-LDPC-CC in equation 48, if three terms are present and $(a_{\#q,p,i} \bmod 3, a_{\#q,p,j} \bmod$ 3,$a_{\#q,p,k}$ mod 3)=(0, 0, 0)∪(1, 1, 1)∪(2, 2, 2) is satisfied, the parity check polynomial that satisfies 0 of q=0 can be represented by equation 49.

[49]

$$(D^{a\#0,1,1}+D^{a\#0,1,2}+D^{a\#0,1,3})X_1(D)+(D^{a\#0,2,1}+\\D^{a\#0,2,2}+\ldots+D^{a\#0,0,\gamma2})X_2(D)+\ldots+(D^{a\#0,n-1,1}+\\D^{a\#0,n-1,2}+\ldots+D^{a\#0,n-1,n-1})X_{n-1}(D)+(D^{b\#0,1}+\\D^{b\#0,2}+\ldots+D^{b\#0,s})P(D)=(D^{a\#0,1,3^{13\gamma+3\delta}}+\\D^{a\#0,1,3^{+3\delta}}+D^{a\#0,1,3})X_1(D)+(D^{a\#0,2,1}+\\D^{a\#0,2,2}+\ldots+D^{a\#0,2,\gamma2})X_2(D)+\ldots+(D^{a\#0,n-1,1}+\\D^{a\#0,n-1,2}+\ldots+D^{a\#0,n-1,n-1})X_{n-1}(D)+(D^{b\#0,1}+\\D^{b\#0,2}+\ldots+D^{b\#0,s})P(D)=0 \quad \text{(Equation 49)}$$

Here, even when $a_{\#0,1,1}>a_{\#0,1,2}>a_{\#0,1,3}$ is assumed, generality is not lost, and γ and δ become natural numbers. In this case, when the term relating to $X_1(D)$ when q=0 in equation 49, that is, $(D^{a\#0,1,3+3\gamma+3\delta}+D^{a\#0,1,3+3\delta}+D^{a\#0,1,3})X_1(D)$ is focused upon, a sub-matrix generated by extracting only a part relating to $X_1(D)$ in parity check matrix H is represented as shown in FIG. 35.

Figure 35:
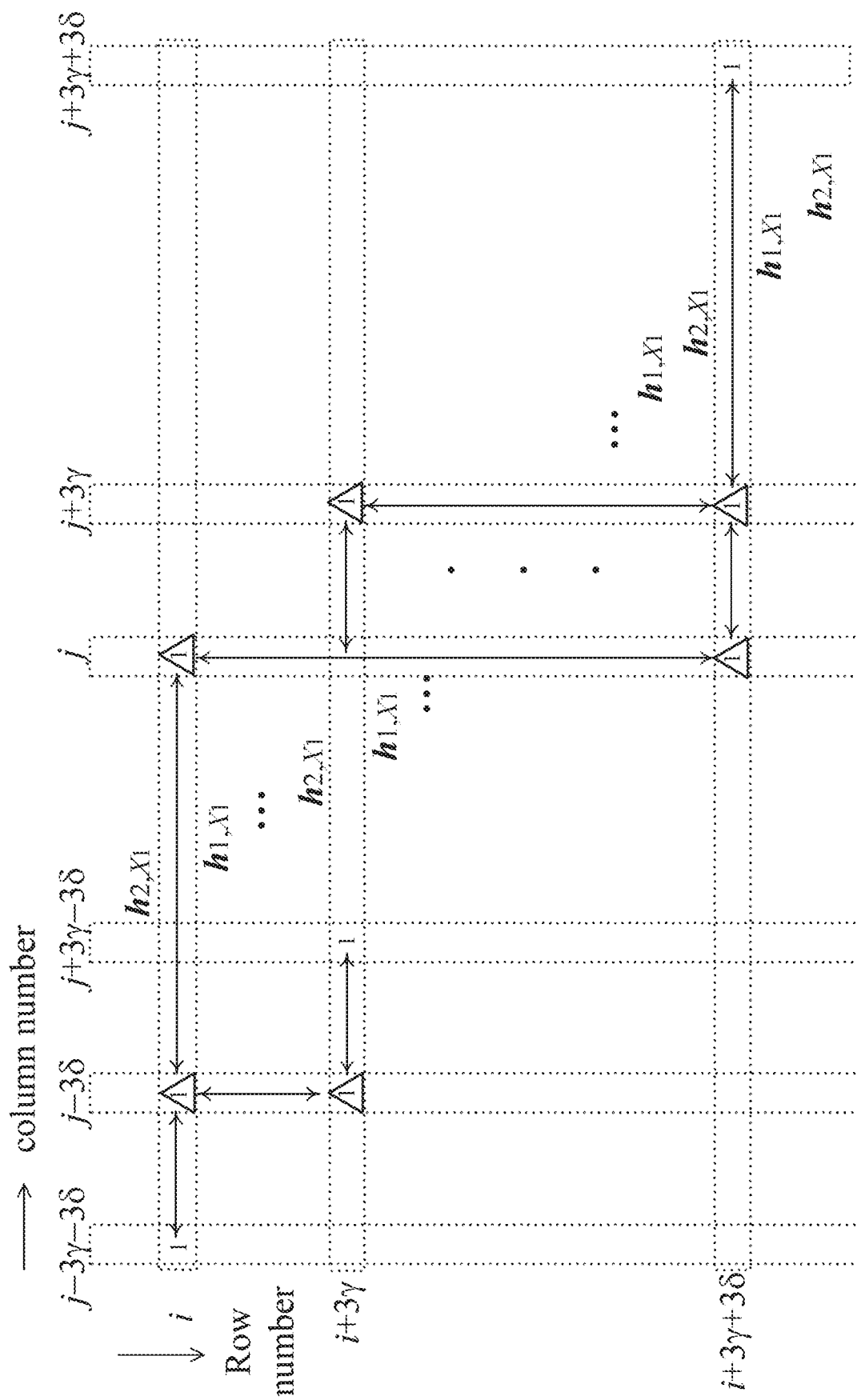
FIG. 35 is a diagram illustrating a sub-matrix generated by extracting only an $X_1(D)$-related portion from parity check matrix H.

In FIG. 35, $h_{1,x1}$ and $h_{2,x1}$ are vectors generated by extracting only portions relating to $X_1(D)$ of the parity check polynomial that satisfies 0 of equation 48 when q=1,2 respectively. In this case, the relationship as shown in FIG. 35 holds true because <1> of feature 1 holds true. Therefore, as shown in FIG. 35, CL6 formed of "1" indicated by Δ necessarily occurs only in a sub-matrix generated by extracting only the portion relating to $X_1(D)$ of the parity check matrix in equation 49 regardless of the values of γ and δ.

When four or more $X_1(D)$-related terms are present, three terms are selected from among four or more terms and when $(a_{\#0,1,i}$ mod 3,$a_{\#0,1,j}$ mod 3,$a_{\#0,1,k}$ mod 3)=(0, 0, 0)∪(1, 1, 1)∪(2, 2, 2) holds true for the selected three terms, loop 6 is formed as shown in FIG. 35.

As described above, when q=0, if $(a_{\#0,1,i}$ mod 3,$a_{\#0,1,j}$ mod 3,$a_{\#0,1,k}$ mod 3)=(0, 0, 0)∪(1, 1, 1)∪(2, 2, 2) holds true for $X_1(D)$, loop 6 is present. Furthermore, also for $X_2(D),\ldots,X_{n-1}(D),P(D)$, by substituting $X_1(D)$ for this, at least one CL6 occurs when C#1.1 or C#1.2 holds true.

Furthermore, in the same way of thinking, also for when q=2.3, at least one CL6 is present when C#1.1 or C#1.2 is satisfied. Therefore, in the parity check polynomial that satisfies 0 of equation 48, when C#1.1 or C#1.2 holds true, at least one loop 6 is generated.
(end of proof)

EXAMPLE

Figure 36:
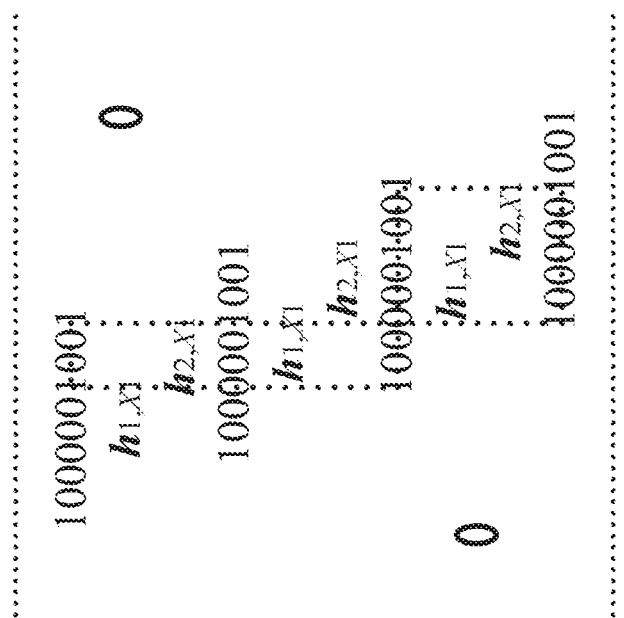
FIG. 36 is a diagram illustrating a vector generated by extracting only an $X_1(D)$-related portion from parity check matrix H.

Consider a case where $(D^9+D^3+1)X_1(D)$ is present in the parity check polynomial that satisfies 0 of equation 48 when q=0. The vector generated by extracting the $X_1(D)$-related portion in parity check matrix H is represented as shown in FIG. 36 and CL6 is present. However, [1000001001] in FIG. 36 is a vector generated by extracting only the $X_1(D)$-related portion in the parity check polynomial that satisfies 0 of equation 48 when q=0.

The parity check polynomial that satisfies #q-th 0 of the TV3-LDPC-CC of a coding rate of (n−1)/n which will be described hereinafter is provided below based on equation 42 (q=0, 1, 2).

[50]

$$(D^{a\#q,1,1}+D^{a\#q,1,2}+D^{a\#q,1,3})X_1(D)+(D^{a\#q,2,1}+D^{a\#q,2,2}+\\D^{a\#q,2,3})X_2(D)+\ldots+(D^{a\#q,n-1,1}+D^{a\#q,n-1,2}+\\D^{a\#q,n-1,3})X_{n-1}(D)+(D^{b\#q,1}+D^{b\#q,2}+D^{b\#q,3})P(D)=\\(D^{a\#q,1,1}+D^{a\#q,1,2}+1)X_1(D)+(D^{a\#q,2,1}+D^{a\#q,2,2}+1)X_2\\(D)+\ldots+(D^{a\#q,n-1,1}+D^{a\#q,n-1,2}+1)X_{n-1}(D)+\\(D^{b\#q,1}+D^{b\#q,2}+1)P(D)=0 \quad \text{(Equation 50)}$$

Here, in equation 50, it is assumed that there are three terms in $X_1(D), X_2(D), \ldots, X_{n-1}(D)$, and P(D) respectively.

Since $a_{\#q,p,3}$ mod 3=0,$b_{\#q,3}$ mod 3=0 in equation 50, $(a_{\#q,p,1}$ mod 3, $a_{\#q,p,2}$ mod 3)=(0, 0), $(b_{\#q,1}$ mod 3, $b_{\#q,2}$ mod 3)=(0, 0) should not be satisfied to suppress the occurrence of CL6 in accordance with theorem 1. Therefore, Table 1 can be created as a condition of $(a_{\#q,p,1}$ mod 3, $a_{\#q,p,2}$ mod 3), $(b_{\#q,1}$ mod 3, $b_{\#q,2}$ mod 3) so that the LDPC code becomes a regular LDPC code except the condition of $(a_{\#q,p,1}$ mod 3, $a_{\#q,p,2}$ mod 3)=(0, 0), $(b_{\#q,1}$ mod 3,$b_{\#q,2}$ mod 3)=(0, 0) and in accordance with feature 1.

TABLE 1

|   | ($a_{\#0,p,1}$ mod 3, $a_{\#0,p,2}$ mod 3) ($b_{\#0,1}$ mod 3, $b_{\#0,2}$ mod 3) values | ($a_{\#1,p,1}$ mod 3, $a_{\#1,p,2}$ mod 3) ($b_{\#1,1}$ mod 3, $b_{\#1,2}$ mod 3) values | ($a_{\#2,p,1}$ mod 3, $a_{\#2,p,2}$ mod 3) ($b_{\#2,1}$ mod 3, $b_{\#2,2}$ mod 3) values |
|---|---|---|---|
| C#1 | [0, 1] | [0, 1] | [0, 1] |
| C#2 | [0, 1] | [0, 2] | [1, 2] |
| C#3 | [0, 1] | [1, 2] | [1, 1] |
| C#4 | [0, 2] | [0, 2] | [0, 2] |
| C#5 | [0, 2] | [1, 2] | [0, 1] |
| C#6 | [0, 2] | [2, 2] | [1, 2] |
| C#7 | [1, 1] | [0, 1] | [1, 2] |
| C#8 | [1, 1] | [1, 1] | [1, 1] |
| C#9 | [1, 2] | [0, 1] | [0, 2] |
| C#10 | [1, 2] | [0, 2] | [2, 2] |
| C#11 | [1, 2] | [1, 1] | [0, 1] |
| C#12 | [1, 2] | [1, 2] | [1, 2] |
| C#13 | [2, 2] | [1, 2] | [0, 2] |
| C#14 | [2, 2] | [2, 2] | [2, 2] |

In Table 1, when $(a_{\#q,p,1}$ mod 3, $a_{\#q,p,2}$ mod 3) and $(b_{\#q,1}$ mod 3, $b_{\#q,2}$ mod 3) satisfy any of C#1 to C#14, a regular LDPC code can be created. For example, the $X_p(D)$-related term in equation 50 is $(D^{a\#0,p,1}+D^{a\#0,p,2}+1)X_q(D)$ when q=0, $(D^{a\#1,p,1}+D^{a\#1,p,2}+1)Xq(D)$ when q=1 and $(D^{a\#2,p,1}+D^{a\#2,p,2}+1)X_q(D)$ when q=2, and in this case, $(a_{\#0,p,1}$ mod 3, $a_{\#0,p,2}$ mod 3), $(a_{\#1,p,1}$ mod 3, $a_{\#1,p,2}$ mod 3), $(a_{\#2,p,1}$ mod 3, $a_{\#2,p,2}$ mod 3) satisfies any of C#1 to C#14.

However, (A,B)=[a,b] becomes (A,B)=(a,b)∪(b,a). Similarly, the P(D)-related term in equation 50 is $(D^{b\#0,1}+D^{b\#0,2}+1)P(D)$ when q=0, $(D^{b\#1,1}+D^{b\#1,2}+1)P(D)$ when q=1 and $(D^{b\#2,1}+D^{b\#2,2}+1)P(D)$ when q=2, and in this case, $(b_{\#0,1}$ mod 3, $b_{\#0,2}$ mod 3), $(b_{\#1,1}$ mod 3, $b_{\#1,2}$ mod 3),$(b_{\#2,1}$ mod 3, $b_{\#2,2}$ mod 3) satisfies any of C#1 to C#14.

Example of Code Search:
Table 2 shows an example of TV3-LDPC-CCs of coding rates of R=1/2 and 5/6 searched by generating parity check polynomials that satisfy 0 of equation 46 by generating random numbers without constraints.

TABLE 2

| Code Index | $K_{max}$ | R | Coefficient of equation 46 |
|---|---|---|---|
| #1 | 600 | 1/2 | $(A_{X1,0}(D), B_0(D)) = (D^{549} + D^{509} + 1, D^{248} + D^{33} + 1)$ |
|    |     |     | $(A_{X1,1}(D), B_1(D)) = (D^{398} + D^{215} + 1, D^{458} + D^{376} + 1)$ |
|    |     |     | $(A_{X1,2}(D), B_2(D)) = (D^{412} + D^{287} + 1, D^{388} + D^{331} + 1)$ |

TABLE 2-continued

| Code Index | $K_{max}$ | R | Coefficient of equation 46 |
|---|---|---|---|
| #2 | 600 | 5/6 | $(A_{X1,0}(D), A_{X2,0}(D), A_{X3,0}(D), A_{X4,0}(D), A_{X5,0}(D), B_0(D)) =$ $(D^{448} + D^{131} + 1, D^{416} + D^{242} + 1, D^{110} + D^{39} + 1,$ $D^{351} + D^{235} + 1, D^{292} + D^{155} + 1, D^{587} + D^{496} + 1)$ $(A_{X1,1}(D), A_{X2,1}(D), A_{X3,1}(D), A_{X4,1}(D), A_{X5,1}(D), B_1(D)) =$ $(D^{226} + D^{16} + 1, D^{473} + D^{264} + 1, D^{413} + D^{260} + 1,$ $D^{442} + D^{102} + 1, D^{535} + D^{150} + 1, D^{49} + D^6 + 1)$ $(A_{X1,2}(D), A_{X2,2}(D), A_{X3,2}(D), A_{X4,2}(D), A_{X5,2}(D), B_2(D)) =$ $(D^{564} + D^{129} + 1, D^{416} + D^{141} + 1, D^{522} + D^{485} + 1,$ $D^{166} + D^{56} + 1, D^{353} + D^{123} + 1, D^{372} + D^{134} + 1)$ |

Table 3 shows an example of TV3-LDPC-CCs of coding rates of R=1/2 and 5/6 searched by generating parity check polynomials that satisfy 0 of equation 46 by generating random numbers by providing constraints. To be more specific, code indices #3 and #5 in Table 3 show an example of TV3-LDPC-CCs of coding rates of R=1/2 and 5/6 searched in $X_1(D), \ldots, X_{n-1}(D)$, and $P(D)$ of equation 46 when constraints are provided so as to satisfy any of C#1 to C#12 in Table 1. Furthermore, code indices #4 and #6 in Table 3 show an example of TV3-LDPC-CCs of coding rates of R=1/2 and 5/6 searched in $X_1(D), \ldots, X_{n-1}(D)$, and $P(D)$ of equation 46 when constraints are provided so as to satisfy any of C#1 to C#12 in Table 1.

TABLE 4

| Code Index | Number of $CLl_c = 4$ | Number of CL $l_c = 6$ |
|---|---|---|
| #1 | [0, 0, 0] | [0, 0, 0] |
| #2 | [0, 0, 0] | [4, 4, 6] |
| #3 | [0, 0, 0] | [0, 0, 0] |
| #4 | [0, 0, 0] | [0, 0, 0] |
| #5 | [0, 0, 0] | [4, 4, 6] |
| #6 | [0, 0, 0] | [3, 3, 1] |

It is clear from Table 4 that the condition in Table 1 is important in reducing the number of short cycles and creating a regular LDPC code. In addition to Table 2 and Table 3, TV3-LDPC-CCs were created and error correction capability was evaluated. In the light of the results, condi-

TABLE 3

| Code Index | $K_{max}$ | R | Coefficient of equation 46 |
|---|---|---|---|
| #3 | 600 | 1/2 | $(A_{X1,0}(D), B_0(D)) = (D^{545} + D^{448} + 1, D^{509} + D^{506} + 1)$ $(A_{X1,1}(D), B_1(D)) = (D^{518} + D^{454} + 1, D^{578} + D^{74} + 1)$ $(A_{X1,2}(D), B_2(D)) = (D^{458} + D^{385} + 1, D^{317} + D^{86} + 1)$ |
| #4 | 600 | 1/2 | $(A_{X1,0}(D), B_0(D)) = (D^{451} + D^{275} + 1, D^{520} + D^{347} + 1)$ $(A_{X1,1}(D), B_1(D)) = (D^{581} + D^{337} + 1, D^{452} + D^{28} + 1)$ $(A_{X1,2}(D), B_2(D)) = (D^{484} + D^{239} + 1, D^{580} + D^{533} + 1)$ |
| #5 | 600 | 5/6 | $(A_{X1,0}(D), A_{X2,0}(D), A_{X3,0}(D), A_{X4,0}(D), A_{X5,0}(D), B_0(D)) =$ $(D^{452} + D^{450} + 1, D^{473} + D^{435} + 1, D^{332} + D^{152} + 1,$ $D^{568} + D^{174} + 1, D^{496} + D^{248} + 1, D^{156} + D^{106} + 1)$ $(A_{X1,1}(D), A_{X2,1}(D), A_{X3,1}(D), A_{X4,1}(D), A_{X5,1}(D), B_1(D)) =$ $(D^{560} + D^{14} + 1, D^{460} + D^{356} + 1, D^{472} + D^{374} + 1,$ $D^{434} + D^{304} + 1, D^{351} + D^{179} + 1, D^{397} + D^{273} + 1$ $(A_{X1,2}(D), A_{X2,2}(D), A_{X3,2}(D), A_{X4,2}(D), A_{X5,2}(D), B_2(D)) =$ $(D^{440} + D^{214} + 1, D^{256} + D^{114} + 1, D^{582} + D^{26} + 1,$ $D^{580} + D^{211} + 1, D^{377} + D^{149} + 1, D^{139} + D^{81} + 1)$ |
| #6 | 600 | 5/6 | $(A_{X1,0}(D), A_{X2,0}(D), A_{X3,0}(D), A_{X4,0}(D), A_{X5,0}(D), B_0(D)) =$ $(D^{583} + D^{218} + 1, D^{431} + D^{256} + 1, D^{587} + D^{13} + 1,$ $D^{244} + D^{62} + 1, D^{568} + D^{347} + 1, D^{284} + D^{103} + 1)$ $(A_{X1,1}(D), A_{X2,1}(D), A_{X3,1}(D), A_{X4,1}(D), A_{X5,1}(D), B_1(D)) =$ $(D^{481} + D^{83} + 1, D^{547} + D^{413} + 1, D^{452} + D^{190} + 1,$ $D^{593} + D^{565} + 1, D^{473} + D^{283} + 1, D^{568} + D^{143} + 1)$ $(A_{X1,2}(D), A_{X2,2}(D), A_{X3,2}(D), A_{X4,2}(D), A_{X5,2}(D), B_2(D)) =$ $(D^{427} + D^{290} + 1, D^{452} + D^{445} + 1, D^{508} + D^{308} + 1,$ $D^{298} + D^{191} + 1, D^{281} + D^{49} + 1, D^{532} + D^{329} + 1)$ |

Table 4 shows the result of evaluating the numbers of CL4's and CL6's for each parity check polynomial that satisfies 0 of the TV3-LDPC-CC in Table 2 and Table 3. Since none of TV3-LDPC-CCs of code index #1 to code index #6 satisfies theorem 1, the number of CL6's is small and there is no significant difference in the number of CL6's when compared at the same coding rate. Furthermore, there is no CL4 in TV3-LDPC-CCs of code index #1 to code index #6.

tions under which high error correction capability is obtained and conditions under which high error correction capability is not obtained will be described below.

Condition under which high error correction capability is not obtained:

<1> When the parity check polynomial that satisfies #q-th 0 of a TV3-LDPC-CC of a coding rate of (n−1)/n can be represented as shown in equation 50 (q=0, 1, 2), a singular (irregular) LDPC code is formed.

Condition under which high error correction capability is obtained:

<2> When the parity check polynomial that satisfies #q-th 0 of a TV3-LDPC-CC of a coding rate of (n−1)/n can be represented as shown in equation 50 (q=0,1,2), $X_1(D), \ldots, X_{n-1}(D)$, and P(D) in equation 50 satisfies C#12 in Table 1.

<3> When the parity check polynomial that satisfies #q-th 0 of a TV3-LDPC-CC of a coding rate of (n−1)/n can be represented as shown in equation 50 (q=0, 1, 2), if $X_a(D)$ in $X_1(D), \ldots, X_{n-1}(D)$, and P(D) of equation 50 satisfies C#i in Table 1, some of $X_1(D), \ldots, X_{n-1}(D)$, and P(D) satisfy C#j(j≠i) in Table 1.

TV3-LDPC-CCs of code index #3 and code index #5 in Table 3 satisfy the above condition in <3>.

A case has been described in the present embodiment where the number of terms $X_1(D), X_2(D), \ldots, X_{n-1}(D)$, and P(D) in a TV3-LDPC-CC defined by the parity check polynomial of equation 50, that is, each parity check polynomial that satisfies 0 is three. The number of terms is not limited to this, and high error correction capability may be likely to be obtained even when the number of terms of any of $X_1(D), X_2(D), \ldots, X_{n-1}(D)$, and P(D) of equation 50 is 1 or 2. For example, the following method is available as a method of setting the number of terms of $X_1(D)$ to 1 or 2. When the time varying period is 3, a parity check polynomial satisfying three 0's is present, and the number of terms of $X_1(D)$ is assumed to be 1 or 2 for all parity check polynomials that satisfy three 0's. Alternatively, instead of setting the number of terms of $X_1(D)$ to 1 or 2 in all parity check polynomials that satisfy three 0's, the number of terms of $X_1(D)$ may be set to 1 or 2 in parity check polynomials that satisfy any (two or fewer) 0's of the parity check polynomials that satisfy three 0's. The same applies to $X_2(D), \ldots, X_{n-1}(D)$ as well. However, the condition in Table 1 is not satisfied for the deleted terms (deleted terms of any of $X_1(D), X_2(D), \ldots, X_{n-1}(D)$, and P(D)).

Furthermore, high error correction capability may be obtained also when the number of terms of any of $X_1(D), X_2(D), \ldots, X_{n-1}(D)$, and P(D) is 4 or more. For example, the following method is available as a method of setting the number of terms of $X_1(D)$ to 4 or greater. When the time varying period is 3, there is a parity check polynomial satisfying three 0's, but the number of terms of $X_1(D)$ is set to 4 or greater for all parity check polynomials satisfying three 0's. Alternatively, instead of setting the number of terms of $X_1(D)$ to 4 or greater in all parity check polynomials that satisfy three 0's, the number of terms of $X_1(D)$ may be set to 4 or greater in parity check polynomials satisfying any (two or fewer) 0's among the parity check polynomials satisfying three 0's. The same applies to $X_2(D), \ldots, X_{n-1}(D)$ as well. In this case, the condition of Table 1 is satisfied for none of increased terms (increased terms of any of $X_1(D), X_2(D), \ldots, X_{n-1}(D)$, and P(D)).

Embodiment 7

The present embodiment will be describe a time-varying LDPC-CC of a coding rate of R=(n−1)/n based on a parity check polynomial again. Bits of information bits of $X_1, X_2, \ldots, X_{n-1}$, and parity bit P at point in time j are represented by $X_{1,j}, X_{2,j}, \ldots, X_{n-1,j}$ and $P_j$ respectively. Vector $u_j$ at point in time j is represented by $u_j = (X_{1,j}, X_{2,j}, \ldots, X_{n-1,j}, P_j)$. Furthermore, the encoded sequence is represented by $u = (u_0, u_1, \ldots, u_j, \ldots)^T$. When D is assumed to be a delay operator, the polynomials of information bits $X_1, X_2, \ldots, X_{n-1}$ are represented by $X_1(D), X_2(D), \ldots, X_{n-1}(D)$ and the polynomial of parity bit P is represented by P(D). In this case, consider a parity check polynomial satisfying 0 represented by equation 51.

[51]

$$(D^{a1,1}+D^{a1,2}+\ldots+D^{a1,r1}+1)X_1(D)+(D^{a2,1}+D^{a2,2}+\ldots+D^{a2,r2}+1)X_2(D)+\ldots+(D^{an-1,1}+D^{an-1,2}+\ldots+D^{an-1,rn-1}+1)X_{n-1}(D)+(D^{b1}+D^{b2}+\ldots+D^{b\epsilon}+1)P(D)=0 \quad \text{(Equation 51)}$$

In equation 51, assume that $a_{p,q}$ (p=1, 2, ..., n−1; q=1, 2, ..., $r_p$) and $b_s$ (s=1, 2, ..., ε) are natural numbers). Furthermore, $a_{p,y} \neq a_{p,z}$ is satisfied for y,z=1, 2, ..., $r_p$, y≠z of $\forall(y,z)$. Furthermore, $b_y \neq b_z$ is satisfied for y,z=1, 2, ..., ε, $\forall(y,z)$ of y≠z. Here, $\forall$ is a universal quantifier.

To create an LDPC-CC of a coding rate of R=(n−1)/n and a time varying period of m, a parity check polynomial based on equation 51 is prepared. In this case, an i-th (i=0, 1, ..., m−1) parity check polynomial is represented by equation 52.

[52]

$$A_{X1,i}(D)X_1(D)+A_{X2,i}(D)X_2(D)+\ldots+A_{Xn-1,i}(D)X_{n-1}(D)+B_i(D)P(D)=0 \quad \text{(Equation 52)}$$

In equation 52, maximum degrees of D of $A_{X\delta,i}(D)$ (δ=1, 2, ..., n−1) and $B_i(D)$ are represented by $\Gamma_{X\delta,i}$ and $\Gamma_{P,i}$ respectively. Assume that a maximum value of $\Gamma_{X\delta,i}$ and $\Gamma_{P,i}$ is $\Gamma_i$. Assume that a maximum value of $\Gamma_i$ (i=0, 1, ..., m−1) is $\Gamma$. When encoded sequence u is taken into account, vector $h_i$ corresponding to the i-th parity check polynomial is represented by equation 53 using $\Gamma$.

[53]

$$h_i = [h_{i,\Gamma}, h_{i,\Gamma-1}, \ldots, h_{i,1}, h_{i,0}] \quad \text{(Equation 53)}$$

In equation 53, $h_{i,v}$ (v=0, 1, ..., $\Gamma$) is a vector of 1×n and is represented by equation 54.

[54]

$$h_{i,v} = [\alpha_{i,v,X1}, \alpha_{i,v,X2}, \ldots, \alpha_{i,v,Xn-1}, \beta_{i,v}] \quad \text{(Equation 54)}$$

This is because the parity check polynomial of equation 52 has $\alpha_{i,v,Xw} D^v X_w(D)$ and $\beta_{i,v} D^v P(D)$ (where w=1, 2, ..., n−1, and, $\alpha_{i,v,Xw}, \beta_{i,v} \in [0, 1]$). In this case, the parity check polynomial satisfying 0 of equation 52 has $D^0 X_1(D)$, $D^0 X_2(D), \ldots, D^0 X_{n-1}(D)$ and $D^0 P(D)$, and thereby satisfies equation 55.

[55]

$$h_{i,0} = [\underbrace{1 \cdots 1}_{n}] \quad \text{(Equation 55)}$$

In equation 55), $\Lambda(k) = \Lambda(k+m)$ is satisfied for $\forall k$, where $\Lambda(k)$ corresponds to $h_i$ of a k-th row of the parity check matrix.

Using equation 53, equation 54 and equation 55, the parity check matrix of an LDPC-CC based on the parity check polynomial of a coding rate of R=(n−1)/n and a time varying period of m is represented by equation 56.

$$H = \begin{bmatrix} \ddots & & & & & & & & \ddots & & & & & & & \\ & h_{0,\Gamma} & h_{0,\Gamma-1} & \cdots & \cdots & \cdots & \cdots & \cdots & h_{0,0} & & & & & & & \\ & & h_{1,\Gamma} & \cdots & \cdots & \cdots & \cdots & \cdots & h_{1,1} & h_{1,0} & & & & & & \\ & & & \ddots & & & & & & & \ddots & & & & & \\ & & & & h_{m-1,\Gamma} & h_{m-1,\Gamma-1} & \cdots & \cdots & \cdots & \cdots & \cdots & h_{m-1,0} & & & & \\ & & & & & h_{0,\Gamma} & \cdots & \cdots & \cdots & \cdots & \cdots & h_{0,1} & h_{0,0} & & & \\ & & & & & & \ddots & & & & & & & \ddots & & \\ & & & & & & & h_{m-1,\Gamma} & \cdots & \cdots & \cdots & \cdots & \cdots & \cdots & h_{m-1,0} & \\ & & & & & & & & & & & & & & & \ddots \end{bmatrix}$$ (Equation 56)

The disclosure of Japanese Patent Application No. 2008-334028, filed on Dec. 26, 2008, including the specification, drawings and abstract is incorporated herein by reference in its entirety.

INDUSTRIAL APPLICABILITY

The present disclosure is suitable for use as an encoding method, encoder and decoder or the like for performing erasure correction using low density parity check codes (LDPC codes).

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

REFERENCE SIGNS LIST

100, 200 Communication apparatus
20 Communication channel
110 Packet generation and known packet insertion section
120 Erasure correction encoding-related processing section
121 Erasure correction encoding section
122,234 known information packet deleting section
1211 Rearranging section
1212 Encoding section (parity packet generation section)
130 Error correcting encoding section
131 Known information insertion section
132 Encoder
133 Known information deleting section
140, 250 Transmitting apparatus
141 Modulation section
142 Control information generation section
143 Transmitting section
150, 210 Receiving apparatus
220 Error correcting decoding section
221 Known information log likelihood ratio insertion section
222 Decoder
223 known information deleting section
230 Erasure correction decoding related processing section
231 Error detection section
232 Known information packet insertion section
233 Erasure correction decoding section
234 Known information packet deleting section
240 Packet decoding section
500 LDPC-CC encoding section
510 Data computing section
520 Parity computing section
530 Weight control section
540 Mod 2 adder

The invention claimed is:

1. A transmission apparatus comprising:
a signal processing circuit configured to:
  obtain information data bits to be transmitted;
  add known information data bits to the information data bits to generate first data blocks;
  perform error-correction coding on the first data blocks to generate first coded data blocks including parity data blocks such that the first coded data blocks satisfy a first code rate;
  remove the known information data bits from the first coded data blocks to generate second coded data blocks, the second coded data blocks satisfying a second code rate different from the first code rate; and
  modulate the second coded data blocks using a modulation scheme to generate a modulated signal; and
a transmitter configured to transmit the modulated signal, wherein
a number of the known information data bits depends on a number of the information data bits such that the first code rate is fixed regardless of the number of the information data bits.

2. The transmission apparatus according to claim 1, wherein the known information data bits are zeroed bits.

3. A transmission method comprising:
obtaining information data bits to be transmitted;
adding, by a signal processing circuit, known information data bits to the information data bits to generate first data blocks;
error-correction coding, by the signal processing circuit, the first data blocks to generate first coded data blocks including parity data blocks such that the first coded data blocks satisfy a first code rate;
removing, by the signal processing circuit, the known information data bits from the first coded data blocks to generate second coded data blocks, the second coded data blocks satisfying a second code rate different from the first code rate;

modulating, by the signal processing circuit, the second coded data blocks using a modulation scheme to generate a modulated signal, and;

transmitting, from an antenna, the modulated signal, wherein a number of the known information data bits depends on a number of the information data bits such that the first code rate is fixed regardless of the number of the information data bits.

4. The transmission method according to claim 3, wherein the known information data bits are zeroed bits.

5. A reception method comprising:

receiving a modulated signal from a transmission apparatus;

demodulating the modulated signal to generate second coded data blocks; and error-correction decoding the second coded data blocks, wherein the modulated signal has been generated by the transmission apparatus performing an encoding process, the encoding process including:

adding known information data bits to information data bits to generate first data blocks;

error-correction coding the first data blocks to generate first coded data blocks including parity data blocks such that the first coded data blocks satisfy a first code rate;

removing the known data bits from the first coded data blocks to generate the second coded data blocks, the second coded data blocks satisfying a second code rate different from the first code rate; and modulating the second coded data blocks using a modulation scheme to generate the modulated signal, wherein a number of the at least one known information data bits depends on a number of the information data bits such that the first code rate is fixed regardless of the number of the information data bits.

6. The reception method according to claim 5, wherein the known information data bits are zeroed bit.

* * * * *